US012690197B2

(12) United States Patent
Müller

(10) Patent No.: US 12,690,197 B2
(45) Date of Patent: Jul. 21, 2026

(54) MEMORY CELL, MEMORY DEVICE, AND METHODS THEREOF

(71) Applicant: Ferroelectric Memory GmbH, Dresden (DE)

(72) Inventor: Stefan Ferdinand Müller, Radebeul (DE)

(73) Assignee: Ferroelectric Memory GmbH, Dresden (DE)

( * ) Notice: Subject to any disclaimer, the term of this patent is extended or adjusted under 35 U.S.C. 154(b) by 787 days.

(21) Appl. No.: 17/546,255

(22) Filed: Dec. 9, 2021

(65) Prior Publication Data

US 2023/0189531 A1 Jun. 15, 2023

(51) Int. Cl.
*H10B 53/30* (2023.01)
(52) U.S. Cl.
CPC .................................... *H10B 53/30* (2023.02)
(58) Field of Classification Search
None
See application file for complete search history.

(56) References Cited

U.S. PATENT DOCUMENTS

2002/0024073 A1* 2/2002 Shimada .............. H10D 30/701
257/295
2014/0002956 A1* 1/2014 Tan ........................ H01G 11/46
427/80

2015/0380641 A1* 12/2015 Ino ......................... C01G 25/02
257/295
2017/0256552 A1* 9/2017 Schröder ................ H10D 1/684
2019/0279913 A1* 9/2019 Gluschenkov ....... H10D 64/691
2021/0217454 A1* 7/2021 Ocker ................. G11C 11/2273

OTHER PUBLICATIONS

T.P. Ma et al., "Why a Non-Volatile Ferroelectric Memory Field-Efffect Transistor Still Elusive?", Jul. 2002, 3 pages.
Stefan Ferdinand Müller, Dresden University of Technology "Development of Hf02-Based for Future CMOS Technology Nodes", Aug. 27, 2014, 142 pages.

* cited by examiner

*Primary Examiner* — Xiaoming Liu
(74) *Attorney, Agent, or Firm* — Natalie Albrecht

(57) ABSTRACT

Various aspects relate to a memory cell, the memory cell including: a field-effect transistor structure; and a capacitive memory structure; wherein the field-effect transistor structure and the capacitive memory structure are configured to form a capacitive voltage divider; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region consists of a first material, wherein the second region consists of a second material, and wherein the first material is different from the second material.

11 Claims, 25 Drawing Sheets

FIG. 1D
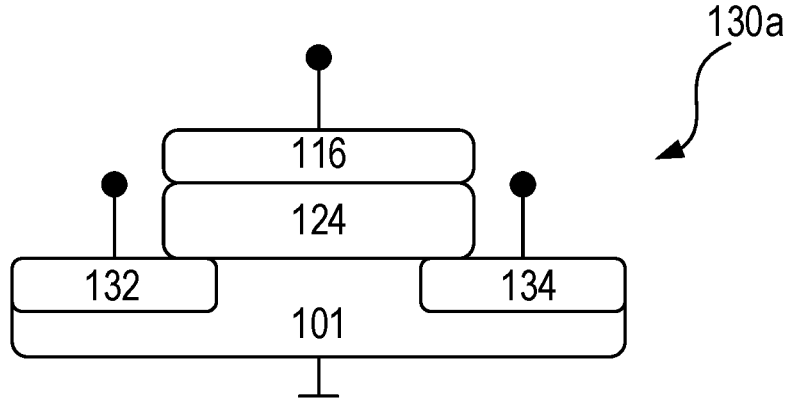
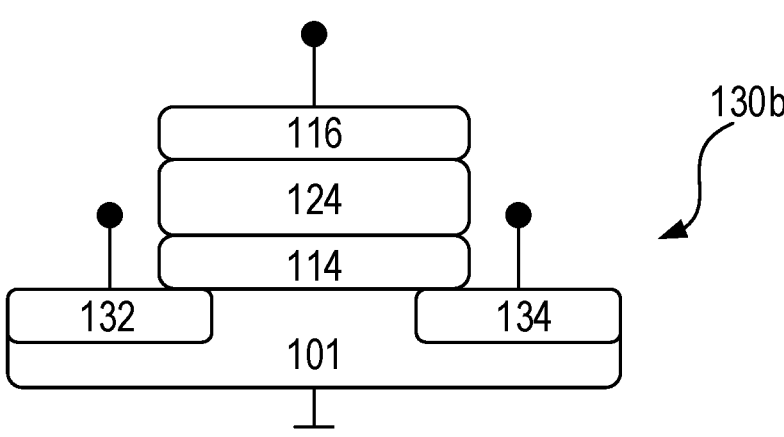
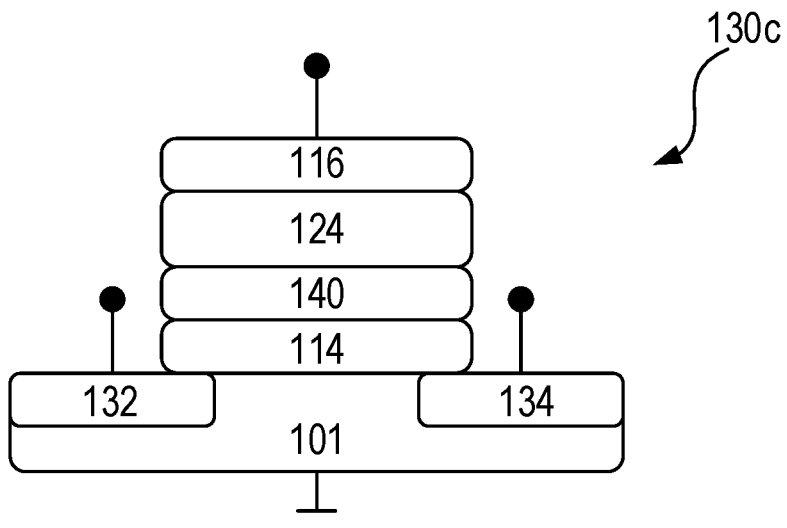

FIG. 3B $V_{dep}$

Figure 7:
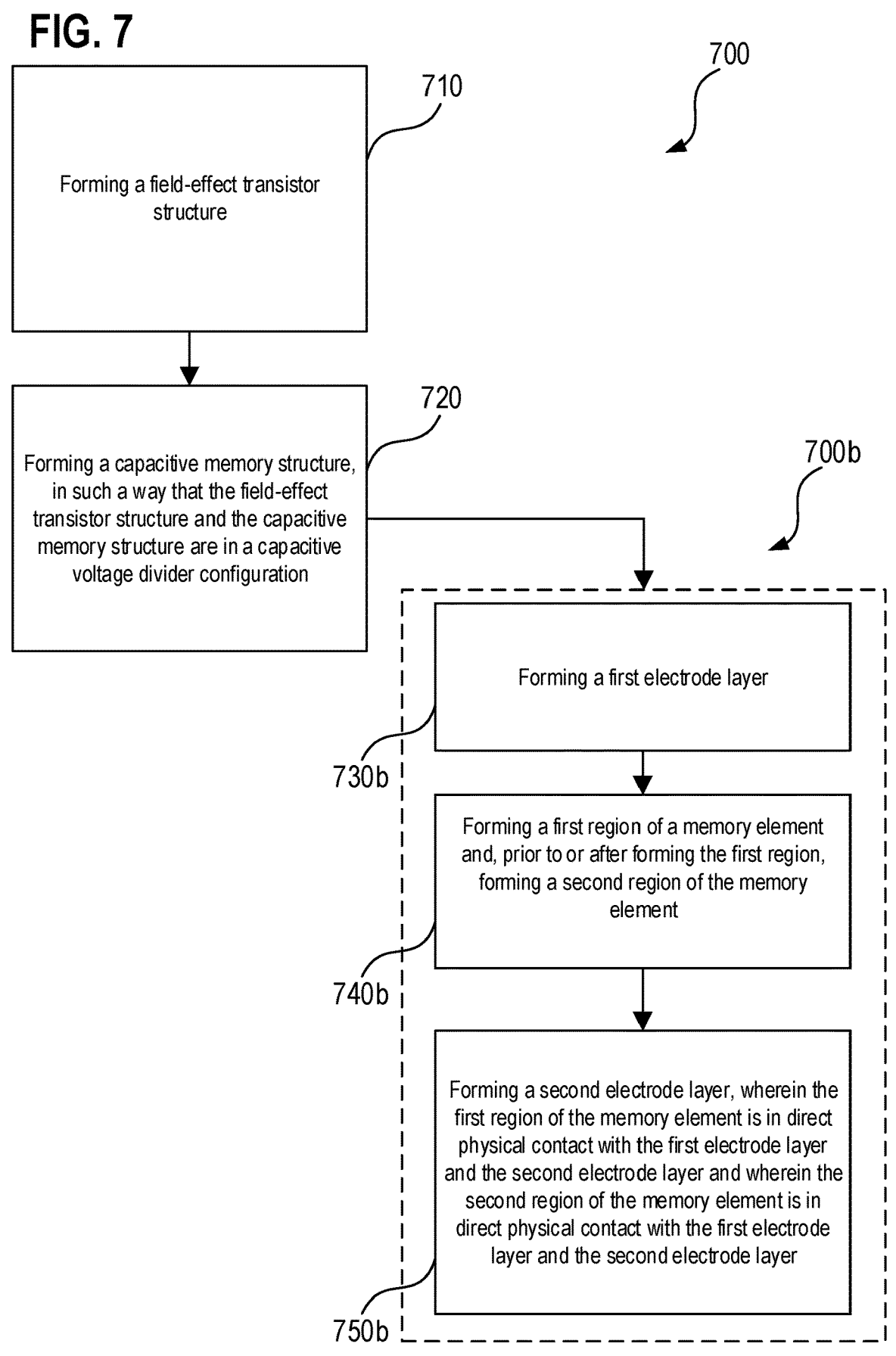

Forming a field-effect transistor structure

720

700b

Forming a capacitive memory structure, in such a way that the field-effect transistor structure and the capacitive memory structure are in a capacitive voltage divider configuration 730b Forming a first electrode layer 740b Forming a first region of a memory element and, prior to or after forming the first region, forming a second region of the memory element 750b Forming a second electrode layer, wherein the first region of the memory element is in direct physical contact with the first electrode layer and the second electrode layer and wherein the second region of the memory element is in direct physical contact with the first electrode layer and the second electrode layer

FIG. 8A
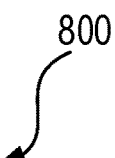
800
| 804 |
|---|
| 802 |
| 832 | 830 | 832 |
|---|---|---|
FIG. 8B
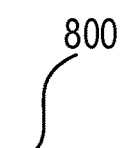
800
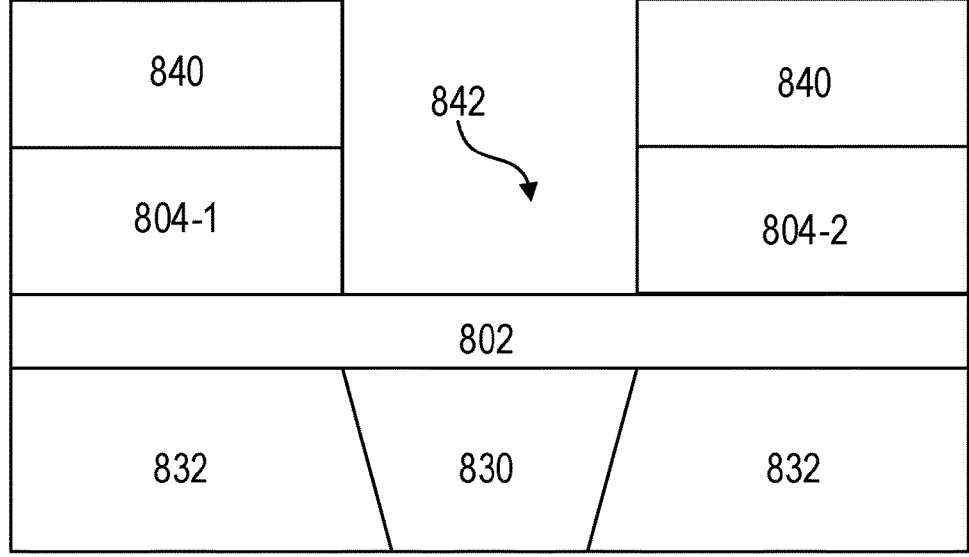

FIG. 9A
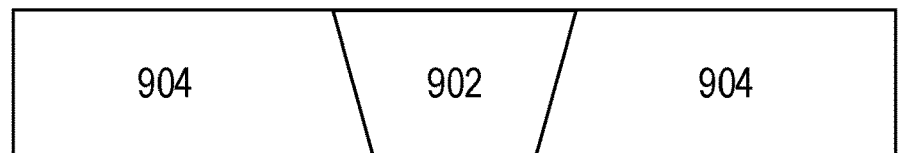
FIG. 9B
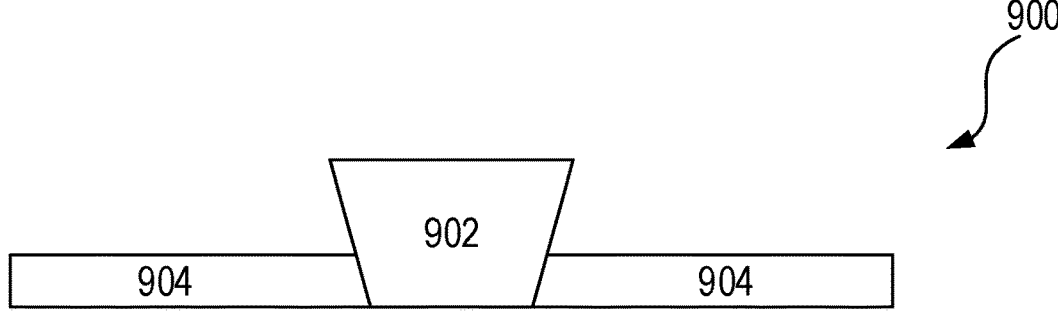
FIG. 9C
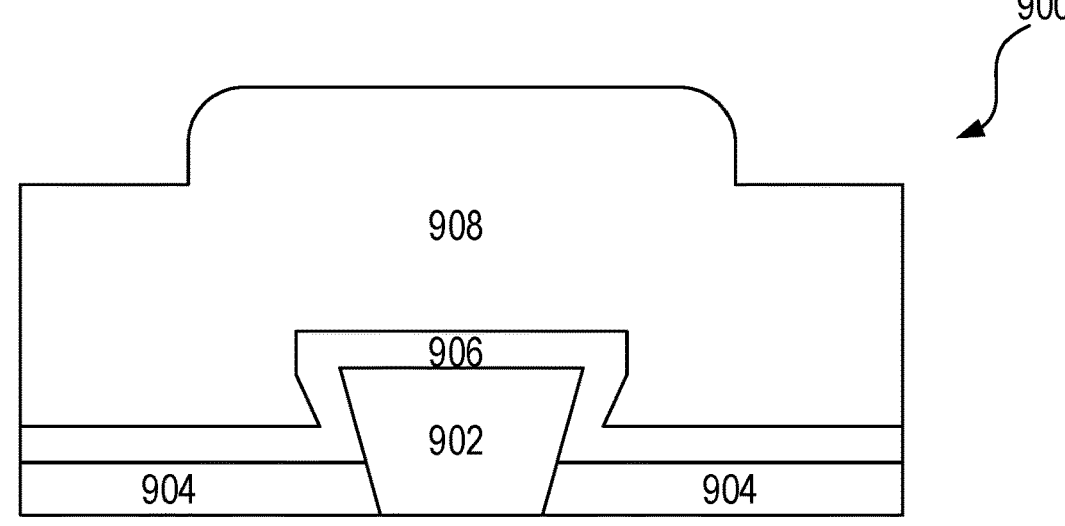

900

900

1000

1000

1100

1110

1108

1106

1104    1102    1104

1110

1108

1106

1104    1102    1104

1100

1100

MEMORY CELL, MEMORY DEVICE, AND METHODS THEREOF

TECHNICAL FIELD

Various aspects relate to a memory cell, a memory device, and methods thereof, e.g., a method of forming a memory cell or a method of forming a memory device.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 1A to FIG. 1D show various aspects of a memory structure in a schematic representation;

FIG. 3A and FIG. 3B show various aspects of a memory cell and electrical properties of a memory cell in a schematic representation;

FIG. 7 shows a schematic flow diagram of a method of forming a memory cell, according to various aspects;

FIG. 8A to FIG. 8F show various aspects of a method of forming a capacitive memory structure in a schematic representation;

FIG. 9A to FIG. 9E show various aspects of a method of forming a capacitive memory structure in a schematic representation;

DESCRIPTION

Figure 1A:
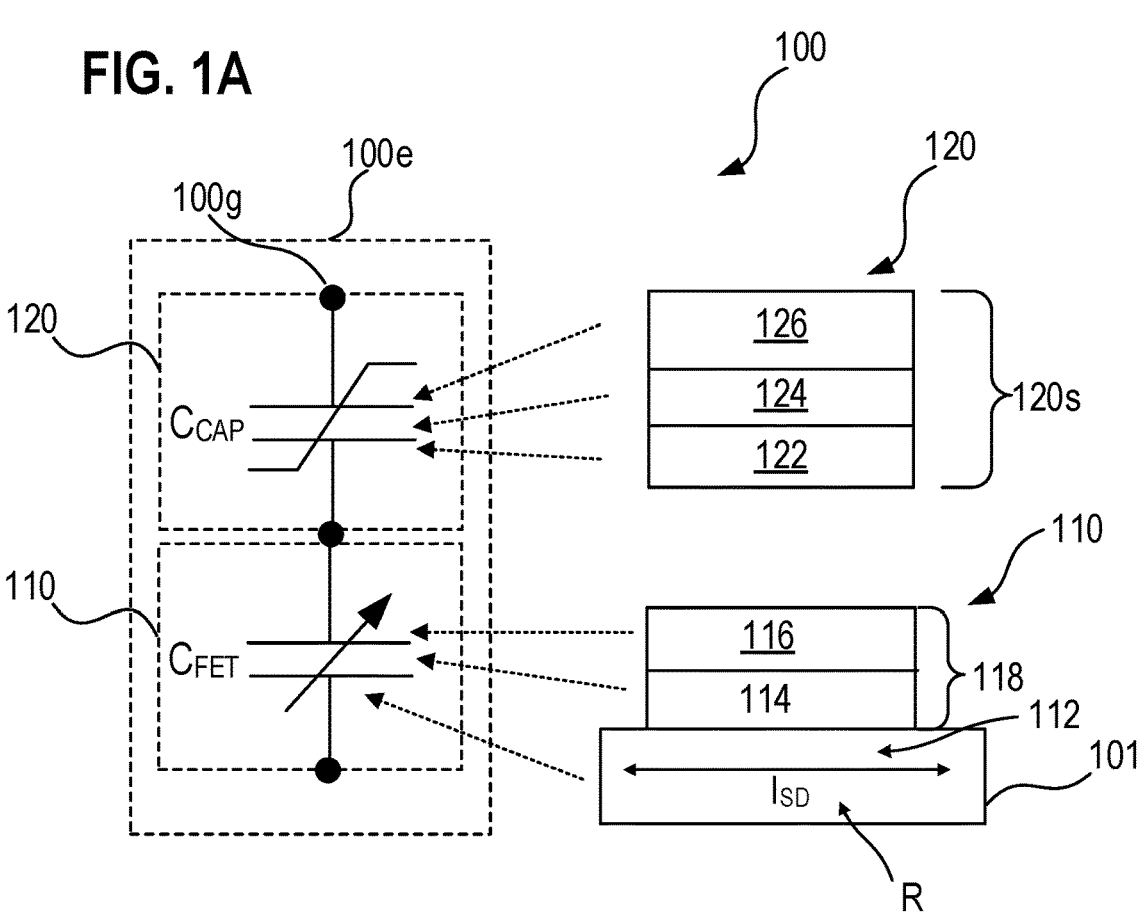

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory device). However, it may be understood that aspects described in connection with methods may similarly apply to the devices, and vice versa.

In memory technologies based on the polarization properties of a memory element (e.g., on the remanent polarization of a ferroelectric layer), data retention may be negatively impacted by the so-called depolarization field. The depolarization field generally describes the electric field that is created across the memory element (e.g., across the ferroelectric) at zero externally applied voltages (illustratively, with all terminals of the memory cell grounded). The depolarization field is oriented against the polarization of the memory element, e.g., due to imperfect screening of the spontaneous (e.g., remanent) polarization of the material of the memory element (e.g., of the ferroelectric material). Illustratively, the depolarization field acts to reverse the polarization of the memory element, and thus acts to reverse the memory state the memory cell is residing in. The depolarization field may thus lead to a reduction or even an inversion of the polarization of the memory element, and consequently to errors during readout of the memory state, e.g., to an incomplete readout or even to a readout of an incorrect memory state. The depolarization field may originate from the fact that in a memory cell with a field-effect transistor structure (e.g., in a ferroelectric field-effect transistor based memory cell), the bottom electrode may be represented by a series connection of a buffer layer and a semiconductor or only of a semiconductor (see FIG. 1D). The manifestation of a depolarization field in a memory cell with a spontaneously-polarizable memory element and its relevance for the data retention capabilities of the memory cell will be described in further detail in relation to FIG. 2A to FIG. 2E.

Various aspects of the present disclosure are related to a configuration of a memory cell adapted to reduce the depolarization field across the (e.g., spontaneously-polarizable) memory element of the memory cell. A memory cell as described herein may include a memory element structured in such a way that a switching charge of the polarization is reduced, and thus a depolarization field across a spontaneously-polarizable region of the memory element is reduced (with respect to a non-structured memory element). The structuring of the memory element may thus provide reducing or eliminating the risk of a reduction (or inversion) of a polarization of the memory element over time, thus improving the data retention capabilities of the memory cell. The structured memory element described herein may thus ensure a reliable readout of the memory state, with a reduction of read failures occurring due to a degradation over time of the polarization state of the memory element.

Various aspects of the present disclosure are related to a memory element structured to have regions (e.g., extending continuously from a bottom electrode layer to a top electrode layer) with different material properties. The plurality of regions having different material properties with respect to one another may be structured to provide a relatively large effective capacitance of the memory element, thus enabling a controllable switching behavior of the memory cell, while ensuring that a relatively small depolarization field falls across the spontaneously-polarizable region(s) of the memory element.

In various aspects, the memory element may be structured to have one or more spontaneously-polarizable regions and one or more non-spontaneously-polarizable regions (or one or more regions less spontaneously-polarizable than the one or more spontaneously-polarizable regions). This configuration may provide an overall capacitance of the memory element similar to a configuration in which the memory element consists only of a spontaneously-polarizable region, and at the same time may reduce the spontaneously-polarizable fraction of the capacitance of the memory element, thus reducing the negative effect(s) of a depolarization field on the retention of the polarization state.

The structuring of a memory element as described herein may provide tailoring the depolarization field across the spontaneously-polarizable region(s) of the memory element without causing an increase of the overall dimensions of a memory cell, as it would instead be the case with the placement of individual (separate) dielectric capacitors in parallel with the spontaneously-polarizable region(s) of the memory element. The structuring described herein may thus allow improving the reliability of a readout of the memory cell while maintaining a relatively small footprint of the memory cell (e.g., defined by consumed area on a substrate, e.g., on a wafer, during integration of the memory cell), e.g., a footprint less than $0.05 \ \mu m^2$, for example less than $0.01 \ \mu m^2$.

According to various aspects, the structuring of the memory element described herein may provide reducing the charge originating from switching the polarization state of the memory element (e.g., from a negative polarization to a positive polarization, or vice versa). The reduction in the charge leads to a reduction in the depolarization field, as discussed in further detail below in relation to FIG. 4A, and thus to a more stable retention of the polarization state over time.

According to various aspects, a memory cell may include a field-effect transistor structure; and a capacitive memory structure; wherein the field-effect transistor structure and the capacitive memory structure are configured to form a capacitive voltage divider; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region consists of a first material, wherein the second region consists of a second material, and wherein the first material is different from the second material.

According to various aspects, a memory cell may include: a field-effect transistor structure; and a capacitive memory structure; wherein the field-effect transistor structure and the capacitive memory structure are configured to form a capacitive voltage divider; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region is spontaneously-polarizable, and wherein the second region is not spontaneously-polarizable or is less spontaneously-polarizable than the first region.

According to various aspects, a memory cell may include: a field-effect transistor structure; and a capacitive memory structure; wherein the field-effect transistor structure and the capacitive memory structure are configured to form a capacitive voltage divider; and wherein the capacitive memory structure is configured as a parallel connection of one or more spontaneously-polarizable capacitors and one or more dielectric capacitors.

According to various aspects, a method of forming a memory cell may include: forming a field-effect transistor structure and a capacitive memory structure in a capacitive voltage divider configuration; wherein forming the capacitive memory structure includes: forming a first electrode layer; forming a first region of a memory element and, subsequently, forming a second region of the memory element; and forming a second electrode layer, wherein the first region of the memory element is in direct physical contact with the first electrode layer and the second electrode layer, and wherein the second region of the memory element is in direct physical contact with the first electrode layer and the second electrode layer.

According to various aspects, a method of forming a memory cell may include: forming a field-effect transistor structure and a capacitive memory structure in a capacitive voltage divider configuration; wherein forming the capacitive memory structure includes: forming a first electrode layer, structuring a memory element to have at least a first region consisting of a first material and a second region consisting of a second material different from the first material, and forming a second electrode layer, wherein the first region of the memory element is in direct physical contact with the first electrode layer and the second electrode layer, and wherein the second region of the memory element is in direct physical contact with the first electrode layer and the second electrode layer.

The term "region" may be used herein to describe a continuous region of a structure or an element (e.g., of a memory element). A region may include a part of a structure or an element with material properties that remain substantially unchanged over the extension of the region (e.g., over a width, a length, and/or a height of the region, e.g., over a volume of the region). Illustratively a region may be a part with continuous material properties. A material property of a "region" may have an average value in the region (e.g., a volume percentage over a total volume of the region, or a mass percentage over a total mass of the region, as examples), and the material property may vary over the extension of the region by less than 50% of the average value, for example by less than 20% of the average value, for example by less than 10% of the average value.

The expression "a material of . . . ", e.g., a region or a layer, may be used herein to describe a main component of that region or layer, e.g., a main material (for example, a main chemical element or a main compound) present in that region or layer. The expression "a material of . . . ", e.g., a region or a layer may describe, in some aspects, the material of that region or layer having a weight percentage greater than 80% over the total weight of the materials that the region or layer include(s), for example having a weight percentage greater than 90% over the total weight of the materials that the region or layer include(s). The expression "a material of . . . ", e.g., a region or a layer may describe, in some aspects, the material of that region or layer having a volume percentage greater than 80% over the total volume of the materials that the region or layer include(s), for example having a volume percentage greater than 90% over the total volume of the materials that the region or layer include(s). As an example, a material of a layer including aluminum may describe that such layer is formed mostly by aluminum, and that other chemical elements or compounds (e.g., impurities) may be present in a smaller proportion, e.g., having less weight percentage or less volume percentage compared to aluminum. As another example, a material of a layer including titanium nitride may describe that such layer is formed mostly by titanium nitride, and that other elements or compounds (e.g., impurities) may be present in a smaller proportion, e.g., having less weight percentage or less volume percentage compared to titanium nitride.

Figure 1B:
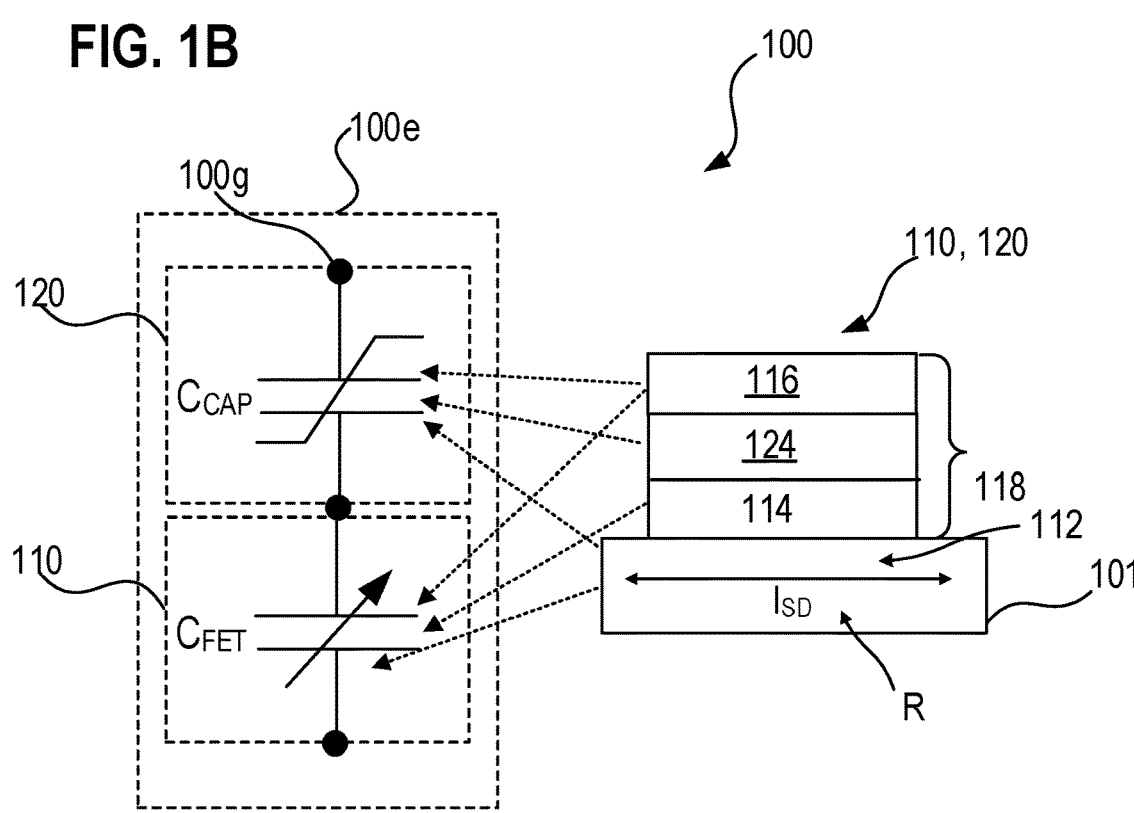

FIG. 1A and FIG. 1B show respectively various aspects of a memory structure 100 in a schematic representation. The memory structure 100 may be a field-effect transistor (FET) based capacitive memory structure, according to various aspects. The memory structure 100 may include a field-effect transistor structure 110 and a capacitive memory structure 120. In some aspects, the capacitive memory structure 120 may be coupled to the field-effect transistor structure 110, see FIG. 1A, or the capacitive memory structure 120 may be, in other aspects, integrated into the field-effect transistor structure 110, see FIG. 1B (and also FIG. 1C and FIG. 1D). Basically, the memory structure 100 may include a field-effect transistor structure and a memory element (e.g., a spontaneously-polarizable memory element, such as a spontaneously-polarizable memory layer).

As illustrated in FIG. 1A, the capacitive memory structure 120 may include at least two electrode layers 122, 126 and a memory element 124 coupled to the at least two electrode layers 122, 126. The memory element 124 may include or may be a functional layer disposed between two electrode layers 122, 126. A functional layer may also be referred to herein as memory layer. The memory element 124 may include (e.g., may consist of) any type of suitable memory material, as for example a spontaneously-polarizable material (e.g., a remanent-polarizable material, such as a ferro-electric material). In some aspects, the memory element 124 may be in direct physical contact with the at least two electrode layers, e.g., with the first electrode layer 122 and with the second electrode layer 126. Illustratively, a first (shared) interface region may be present between the memory element 124 and the first electrode layer 122, and a second (shared) interface region may be present between the memory element 124 and the second electrode layer 126.

According to various aspects, the memory element 124 may be a capacitive memory element including, for example, an electrically non-conductive material such as a spontaneously-polarizable material. The capacitive memory structure 120 in a capacitive configuration may have a (first) capacitance, $C_{CAP}$, associated therewith (see equivalent circuit 100e with respect to the capacitive properties). The first capacitance $C_{CAP}$, may also be indicated herein as $C_{FE}$. The two electrode layers 122, 126 and the memory element 124 may form a memory layer stack 120s. In some aspects, the memory layer stack 120s may be a planar layer stack; however, other shapes may be suitable as well, e.g., curved shapes, angled shapes, coaxially aligned shapes, as examples. Illustratively, the capacitive memory structure 120 may include planar electrode layers 122, 126, or, in other aspects, the capacitive memory structure 120 may be configured as 3D capacitor including, for example, angled or curved electrode layers 122, 126.

The field-effect transistor structure 110 may include a gate structure 118, wherein the gate structure 118 may include a gate isolation 114 and a gate electrode 116 (e.g., a gate electrode layer). The gate structure 118 is illustrated exemplarily as a planar gate stack; however, it is understood that the planar configuration shown in FIG. 1A to FIG. 1D is an example, and other field-effect transistor designs may include a gate structure 118 with a non-planar shape, for example a trench gate transistor design, a vertical field-effect transistor design, or other designs, such as a fin-FET design.

The gate structure 118 may define a channel region 112, e.g., provided in a substrate 101. The substrate 101 may be a semiconductor substrate or a semiconductor portion (e.g., in a semiconductor layer, in a semiconductor die, etc.). The gate structure 118 may allow for a control of an electrical behavior (e.g., a resistance R) of the channel region 112, e.g., a current flow in the channel region 112 may be controlled (e.g., allowed, increased, prevented, decreased, etc.). In some aspects, the gate structure 118 may, for example, allow to control (e.g., allow or prevent) a source/drain current, $I_{SD}$, from a first source/drain region of the field-effect transistor structure 110 to a second source/drain region of the field-effect transistor structure 110 (the source/drains are provided in or adjacent to the channel 112 but are not shown in FIG. 1A and FIG. 1B, see FIG. 1C and FIG. 1D). The channel region 112 and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided at the gate electrode 116 to control the current flow, $I_{SD}$, in the channel region 112, with the current flow, $I_{SD}$, in the channel region 112 being caused by voltages supplied via the source/drain regions.

According to various aspects, the substrate 101 (illustratively, the semiconductor portion where the channel region 112 may be formed), may be made of or may include silicon. However, other semiconductor materials of various types may be used in a similar way, e.g., germanium, silicon-germanium, Group III to V (e.g., SiC), or other types, including for example carbon nanotubes, organic materials (e.g., organic polymers), etc. In various aspects, the semiconductor portion may be a wafer made of silicon (e.g., p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

The gate electrode 116 may include an electrically conductive material, for example, a metal material, a metal alloy, a degenerate semiconductor (in other words a semiconductor material having such a high level of doping that the material acts like a metal and not anymore as a semiconductor), and/or the like. As an example, the gate electrode 116 may include or may be made of aluminum. As another example, the gate electrode 116 may include or may be made of polysilicon or amorphous silicon. According to various aspects, the gate electrode 116 may include one or more electrically conductive portions, layers, etc. The gate electrode 116 may include, for example, one or more metal layers (also referred to as a metal gate), one or more polysilicon layers (also referred to as poly-Si-gate), and/or one or more amorphous silicon layers, etc. A metal gate may include, for example, at least one work-function adaption metal layer disposed over the gate isolation 114 and an additional metal layer disposed over the work-function adaption metal layer. As examples, a metal gate may include or may be made of titanium nitride or tantalum nitride. A poly-Si-gate may be, for example, p-type doped or n-type doped.

The gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers. Some designs of the gate isolation 114 may include at least two layers including different materials, e.g., a first gate isolation layer and a second gate isolation layer (e.g., a first dielectric layer including a first dielectric material, for example a low-k material, and a second dielectric layer including a second dielectric material distinct from the first dielectric material, for example a high-k material).

As illustrated by the circuit equivalent 100e in FIGS. 1A and 1B, a (second) capacitance, $C_{FET}$, may be associated with the field-effect transistor structure 110. Illustratively, the channel region 112, the gate isolation 114, and the gate electrode 116 may have a capacitance, $C_{FET}$, associated therewith, originating from the more or less conductive regions (the channel region 112 and the gate electrode 116) separated from one another by the gate isolation 114. The second capacitance, $C_{FET}$, may also be indicated herein as $C_{IS}$, or $C_S$, depending on the presence or absence of an isolation layer over the (semiconductor) substrate 101 (see FIG. 1D).

The channel region 112 may be considered as a first capacitor electrode, the gate electrode 116 as a second capacitor electrode, and the gate isolation 114 as a dielectric medium between the two capacitor electrodes. The capacitance, $C_{FET}$, of the field-effect transistor structure 110 may define one or more operating properties of the field-effect transistor structure 110. The configuration of the field-effect transistor structure 110 (e.g., of the gate isolation 114) may be adapted according to a desired behavior or application of the field-effect transistor structure 110 during operation (e.g., according to a desired capacitance).

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

In some aspects, the gate electrode 116 of the field-effect transistor structure 110 and the electrode layer 122 of the capacitive memory structure 120 that is connected to the field-effect transistor structure 110 may be spatially separated from one another and electrically connected via a conductive connection (also referred to herein as contact structure), e.g., one or more metal lines. In other aspects, the gate electrode 116 of the field-effect transistor structure 110 and one of the at least two electrode layers 122, 126 of the capacitive memory structure 120 may be in direct physical contact with one another or implemented as a single (shared) electrode.

Figure 1C:
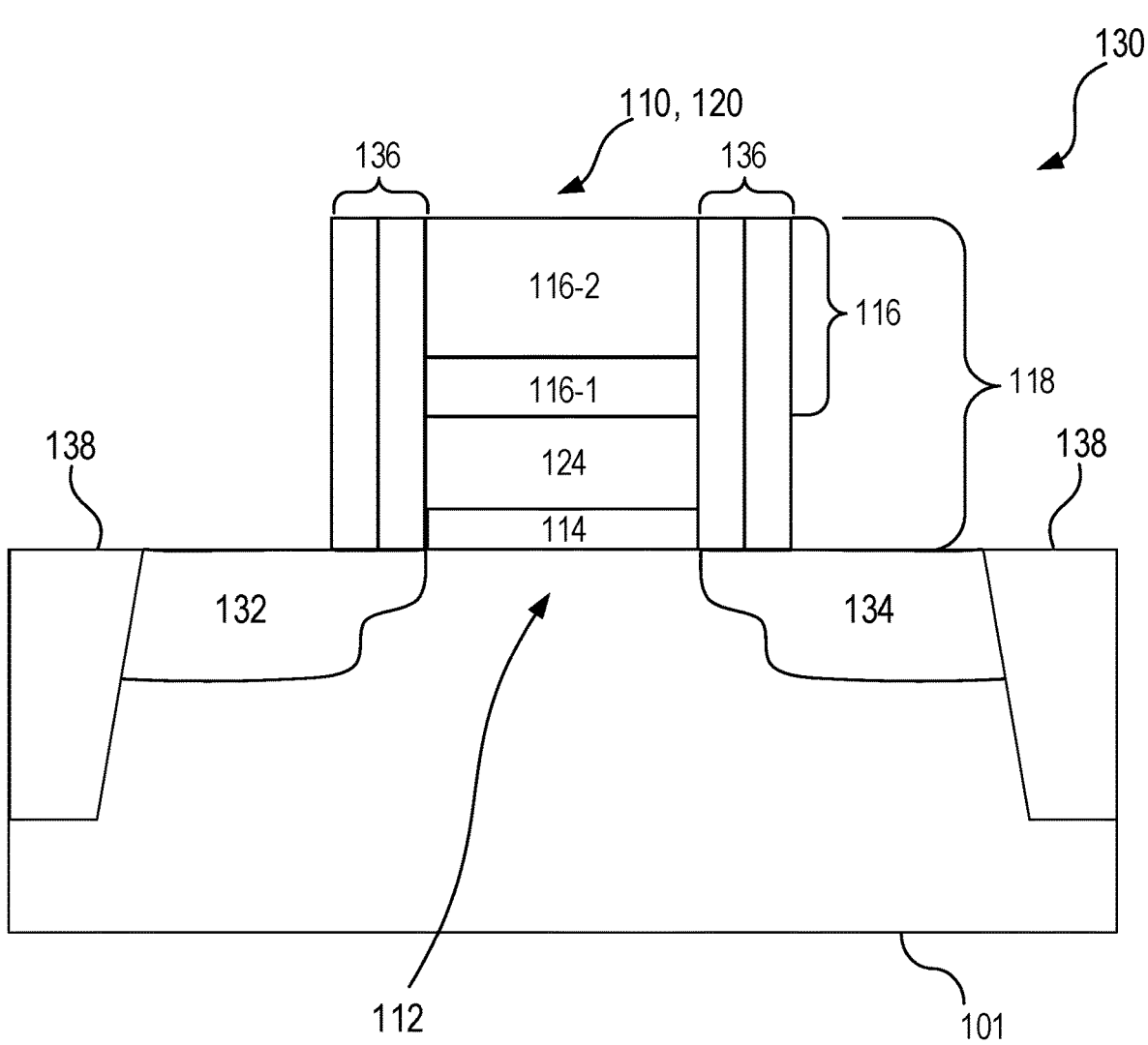

In other aspects, the capacitive memory structure 120 may be integrated in the field-effect transistor structure 110, as illustrated in FIG. 1B (see also FIG. 1C and FIG. 1D). In this case, the memory element 124 may be integrated in the gate structure 118 of the field-effect transistor structure 110 and a capacitive memory structure 120 is formed by the memory element 124 disposed between the channel region 112 and the gate electrode 116 in a similar way (cf. equivalent circuits 100e in FIG. 1A and FIG. 1B) as described with reference to FIG. 1A.

The field-effect transistor structure 110 and the capacitive memory structure 120 form together a field-effect transistor based (e.g., capacitive) memory structure, as exemplarily shown in FIGS. 1A and 1B. A gate 100g of the field-effect transistor based (e.g., capacitive) memory structure may be provided by the gate electrode 116 (see FIG. 1B) or, in other configurations, by an electrode layer 126 of the capacitive memory structure 120 (see FIG. 1A). In the configuration in FIG. 1B, the field-effect transistor structure 110 may illustratively include a channel 112, and a gate stack 118 disposed adjacent to the channel 112, wherein the gate stack 118 includes a memory element 124 as gate isolation disposed between the channel 112 and the gate electrode 116.

According to various aspects, the memory structure 100 may provide or may be part of a memory cell (see for example memory cell 130 in FIG. 1C). A memory cell may be provided, for example, by coupling a gate of a field-effect transistor structure with a capacitive memory structure, or by integrating a memory structure in the gate structure of a field-effect transistor structure (as shown, in FIGS. 1A and 1B for the field-effect transistor structure 110 and the capacitive memory structure 120). A memory cell may illustratively include a field-effect transistor structure and a capacitive memory structure coupled to or integrated in the field-effect transistor structure (optionally with one or more additional elements). In such a configuration the functional layer (e.g., a capacitive memory element) may be in a capacitive environment, e.g., disposed between two electrode layers or disposed between a channel of a field-effect transistor and an electrode layer (e.g., a gate electrode of the field-effect transistor). In such a memory cell, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A memory cell that includes a field-effect transistor structure and a capacitive memory structure may be referred to as field-effect transistor based memory cell or field-effect transistor based capacitive memory cell. It is noted that even though various aspects of a memory cell are described herein with reference to a field-effect transistor based capacitive memory structure (such as a ferroelectric field-effect transistor based memory cell, FeFET), which provides a compact and reliable configuration for a memory cell, other memory structures may be suitable as well.

The field-effect transistor structure 110 and the capacitive memory structure 120 may be coupled (e.g., electrically connected) to one another such that a capacitive voltage divider is provided. The capacitive voltage divider formed by the field-effect transistor structure 110 and the capacitive memory structure 120 may allow adapting the capacitances $C_{FET}$, $C_{CAP}$ of the respective capacitors to allow an efficient programming of the memory cell. The overall gate voltage required for switching the memory cell from one memory state into another memory state (e.g., from high threshold voltage state to low threshold voltage state, or vice versa, as described below), may become smaller in case the voltage distribution across the field-effect transistor structure 110 and the capacitive memory structure 120 is adapted such that more of the applied gate voltage drops across the memory layer of the capacitive memory structure 120 (e.g., across the memory element 124) than across the gate isolation of the field-effect transistor structure 110. The overall write voltage (illustratively, applied via nodes to which the field-effect transistor structure 110 and the capacitive memory structure 120 are connected) may thus be reduced by adapting the capacitive voltage divider. The voltage distribution may be determined by voltage divider calculations for a series connection of the capacitors.

In the case that the capacitance, $C_{FET}$, of the field-effect transistor structure 110 is adapted (e.g., by providing a suitable gate isolation) a predefined fraction of the voltage applied to the series connection may drop across the capacitive memory structure 120. Accordingly, the electric field generated across the gate isolation of the field-effect transistor structure 110 underneath the capacitive memory structure 120 could be reduced, if desired. This may lead to a reduced interfacial field stress, which may lead to a reduced wear out of the interface due to, for example, charge injection. Therefore, the reduced electric field generated across the gate isolation may lead to improved endurance characteristics of the memory cell, that is, to an increased amount of possible state reversals until the memory cell may lose or change its memory properties.

According to various aspects, a threshold voltage of a field-effect transistor structure (and in a corresponding manner the threshold voltage of a field-effect transistor based memory cell) may be defined as a constant current threshold voltage (referred to as $V_{th}(ci)$). In this case, the constant current threshold voltage, $V_{th}(ci)$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 μA. In some aspects, the constant current threshold voltage, $V_{th}(ci)$, may be determined based on the following equation:

$$V_{th}(ci)=V_{GS} \text{ (at } I_D=I_{D0} \cdot W/L).$$

A threshold voltage of a field-effect transistor structure (e.g., of the field-effect transistor structure 110) may be defined by the properties of the field-effect transistor structure (e.g., the materials, the doping, etc.), and it may thus be a (e.g., intrinsic) property of the field-effect transistor structure.

According to various aspects, a memory cell may have at least two distinct memory states associated therewith, for example with two distinct electrical conductivities or two distinct amounts of stored charge that may be determined to determine in which of the at least two distinct states the memory cell is residing in. A memory cell including a field-effect transistor structure may include a first memory state, for example associated with a low threshold voltage state (referred to as LVT associated with the LVT memory state), and a second memory state, for example associated with a high threshold voltage state (referred to as HVT state associated with the HVT memory state). The high threshold voltage state may be, in some aspects, associated with a lower current flow during readout than the low threshold voltage state. The low threshold voltage state may be an electrically conducting state (e.g., associated with a logic memory state "1", also referred to as a memory state or programmed state) and the high threshold voltage state may be an electrically non-conducting state or at least less conducting than the low threshold voltage state (e.g., associated with a logic memory state "0", also referred to as a memory state or erased state). Illustratively, the first memory state may be associated with a first threshold voltage of the FET based memory cell, and the second memory state may be associated with a second threshold voltage of the FET based memory cell.

According to various aspects, the residual polarization of the memory element (e.g., the polarization of a spontaneously-polarizable layer) may define the memory state a memory cell is residing in. According to various aspects, a memory cell may reside in a first memory state in the case that the memory element is in a first polarization state, and the memory cell may reside in a second memory state in the case that the memory element is in a second polarization state (e.g., opposite to the first polarization state). As an example, the polarization state of the memory element may determine the amount of charge stored in the capacitive memory structure. The amount of charge stored in the capacitive memory structure may be used to define a memory state of the memory cell. The threshold voltage of a field-effect transistor structure may be a function of the polarization state of the memory element, e.g., may be a function of the amount and/or polarity of charge stored in the capacitive memory structure. A first threshold voltage, e.g., a low threshold voltage $V_{L-th}$, may be associated with the first polarization state (e.g., with the first amount and/or polarity of stored charge, for example a positive polarization state), and a second threshold voltage, e.g., a high threshold voltage $V_{H-th}$, may be associated with the second polarization state (e.g., with the second amount and/or polarity of stored charge, for example a negative polarization state). A current flow from nodes to which the field-effect transistor structure and the capacitive memory structure are coupled may be used to determine the memory state in which the memory cell is residing in.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

It is understood that the definition of LVT state and HVT state and/or the definition of a logic "0" and a logic "1" and/or the definition of "programmed state" and "erased state" may be selected arbitrarily.

According to various aspects, a memory element of a memory cell (e.g., the memory element of a capacitive memory structure coupled to or integrated in a field-effect transistor structure, for example the memory element 124) may include a polarizable material, e.g., a spontaneously-polarizable material. In various aspects, a memory element of a memory cell may include at least a region of polarizable material, e.g., one or more regions of polarizable material. A spontaneously-polarizable memory element (e.g., a spontaneously-polarizable layer) may show a hysteresis in the (voltage dependent) polarization. The spontaneously-polarizable memory element (e.g., the spontaneously-polarizable region(s)) may show non-remanent spontaneous polarization (e.g., may show anti-ferroelectric properties), e.g., the spontaneously-polarizable memory element may have no or no substantial remanent polarization remaining in the case that no voltage drops across (in other words, over) the spontaneously-polarizable memory element. In other aspects, the spontaneously-polarizable memory element (e.g., the spontaneously-polarizable region(s)) may show remanent spontaneous polarization (e.g., may show ferroelectric properties), e.g., the spontaneously-polarizable memory element may have a remanent polarization or a substantial remanent polarization remaining in the case that no voltage drops across the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a remanent polarization as low as $0 \ \mu C/cm^2$ to $2 \ \mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than $2 \ \mu C/cm^2$ may be regarded as substantial remanent polarization. Such a substantial remanent polarization may allow for storing information as a function of a polarization state of a spontaneously-polarizable region or a spontaneously-polarizable material.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable layer.

According to various aspects, a capacitive memory structure (e.g., the capacitive memory structure 120) may be or may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP) and one or more additional elements. According to various aspects, a capacitive memory structure may include a capacitive memory element, e.g., a ferroelectric layer, e.g., an anti-ferroelectric layer. Illustratively, a memory element of a memory structure (e.g., the memory element 124 of the memory structure 100) may include any type of spontaneously-polarizable material, e.g., a ferroelectric material, an anti-ferroelectric material, an anti-ferroelectric-like material, etc. An information may be stored via at least two remanent polarization states of the capacitive memory structure. The programming of the capacitive memory structure (illustratively the storage of information therein) may be carried out by providing an electric field between the electrode layers to thereby set or change the remanent polarization state of the capacitive memory structure (illustratively, of the memory element). Illustratively, a spontaneous-polarizable material (e.g., a ferroelectric material, e.g., an anti-ferroelectric material) may be used to store data in non-volatile manner in integrated circuits.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. According to various aspects, a non-volatile field-effect transistor-based memory structure or memory cell may store data for a period of time from hours (e.g., more than 5 hours) to several tens of years (e.g., 10 years, 20 years, etc.), whereas a volatile field-effect transistor-based memory structure or memory cell may store data for a period of time from nanoseconds to hours (e.g., less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

It may be understood that, even though various aspects refer to a memory function implemented via a spontaneously-polarizable material, which provides a reliable and reproducible behavior, other types of material whose state may be altered by an electric field provided across a capacitive memory structure may be used.

FIG. 1C illustrates schematically an integration scheme of a memory cell 130. The memory cell 130 may be an exemplary realization of a memory cell including a memory structure 100, e.g., of a memory cell including a capacitive memory structure 120 coupled with or integrated in a field-effect transistor structure 110. In the configuration in FIG. 1C, the capacitive memory structure 120 may be integrated in the field-effect transistor structure 110 (as discussed for FIG. 1B). It is however understood that the aspects described in relation to the configuration of the memory cell 130 illustrated in FIG. 1C may apply in a corresponding manner to the case in which the memory cell 130 includes a capacitive memory structure 120 coupled with the field-effect transistor structure 110 (as discussed for FIG. 1A). It is also understood that the integration scheme illustrated in FIG. 1C is an example, and other integration schemes (e.g., with additional, less, or alternative components, e.g., with alternative configurations) may be provided.

As discussed in relation to FIG. 1A and FIG. 1B, the gate structure 118 of the memory cell 130 may define a channel region 112 disposed between at least a first source/drain region 132 and a second source/drain region 134 of the field-effect transistor structure 110. The source/drain regions 132, 134 may be formed, e.g., via doping one or more semiconductor materials. As an example, the source/drain regions 132, 134 may include or may be made of doped silicon.

The gate structure 118 may be configured to allow for a selective switching of the field-effect transistor into at least two different states (e.g., on and off). The gate-isolation 114 of the gate structure 118 may include (e.g., may consist of) one or more electrically insulating layers e.g., including or consisting of an oxide or a nitride, such as silicon dioxide, silicon oxynitride, or silicon nitride, as examples. The gate structure 118 may further include, e.g., as part of the gate isolation, one or more memory elements 124 to implement a memory function, e.g., to modify one or more electrical properties (e.g., the electrical resistance, e.g., the charge carrier density, e.g., the source/drain current through the channel) of the channel 112 as a function of at least two memory states of the one or more memory elements (e.g., at least two polarization states of the memory elements). As schematically illustrated in FIG. 1C, the gate structure 118 may include one or more spontaneously-polarizable layers 124 forming a memory element of the memory cell 100.

The gate electrode 116 of the gate structure 118 may include one or more electrically conductive layers. As an example, the gate electrode may include a metal gate 116-1 (e.g., including or made of titanium nitride or tantalum nitride, as examples) and may include a polysilicon or amorphous silicon gate 116-2.

The memory cell 130 may further include optional elements to facilitate its integration in a memory device, e.g., its integration in an arrangement including a plurality of memory cells.

As an example, the memory cell 130 may include one or more separation structures 136 (one or more spacers), disposed around the gate structure 118. The one or more separation structures 136 may illustratively be disposed to surround the gate electrode 116 and the gate isolation 114. In various aspects, the one or more separation structures 136 may be referred to as one or more spacer structures, or one or more spacers. The one or more separation structures 136 may be configured to provide protection and isolation (e.g., electrical isolation) to the gate electrode 116 and the gate isolation 114. Illustratively, the one or more separation structures 136 may protect the gate electrode 116 and the gate isolation 114 from external influences, e.g., from the influence of neighboring memory cells, and/or may reduce or prevent a leakage current from the memory element 124. The one or more separation structures 136 may include (e.g., may consist of) an electrically insulating material, e.g., an oxide or a nitride, such as silicon dioxide or silicon nitride.

As another example, the memory cell 130 may include one or more substrate separation structures 138, e.g., one or more shallow trench isolation structures 138. The one or more substrate separation structures 138 may be configured to provide electrical isolation of the memory cell 130 at substrate level (e.g., at wafer level), e.g., may be configured to reduce or prevent electric current leakage in the (semi-conductor) substrate 101. Illustratively, the one or more substrate separation structures 138 may be configured to electrically isolate the memory cell 130 from other memory cells disposed in or over the substrate 101. The one or more substrate separation structures 138 may include or may be made of an electrically insulating material, e.g., an oxide, such as silicon dioxide.

FIG. 1D illustrates possible configurations of a memory cell 130a, 130b, 130c in a schematic view according to various aspects. The configurations shown in FIG. 1D may be possible configurations of the memory cell 130, e.g., may be possible configurations of a memory cell including a capacitive memory structure coupled to or integrated in a field-effect transistor structure.

In the first configuration in FIG. 1D, the memory cell 130a may include a spontaneously-polarizable memory element 124 disposed between the channel region and the gate electrode 116. Illustratively, the spontaneously-polarizable memory element 124 may be or may act as the only gate isolation of the field-effect transistor structure of the memory cell 130a. In the case that the spontaneously-polarizable memory element 124 includes (e.g., consists of) a ferroelectric material, the configuration of the memory cell 130a may be referred to as Metal-Ferroelectric-Semiconductor (MFS) FeFET. In this configuration there may be no insulating interface between the (e.g., semiconductor) substrate 101 and the memory element 124. The capacitance associated with the capacitor provided by the field-effect transistor structure may be referred to as $C_s$ (considering a semiconductor substrate).

In the second configuration in FIG. 1D, the gate stack of the memory cell 130b may include a spontaneously-polarizable memory element 124 and one or more electrically insulating layers 114 disposed between the channel region and the gate electrode 116. In the case that the spontaneously-polarizable memory element 124 includes (e.g., consists of) a ferroelectric material, the configuration of the memory cell 130b may be referred to as Metal-Ferroelectric- Insulator-Semiconductor (MFIS) FeFET. In this configuration there may be an insulating interface between the (e.g., semiconductor) substrate 101 and the memory element 124. The capacitance associated with the capacitor provided by the field-effect transistor structure may be referred to as $C_{IS}$ (e.g., considering a semiconductor substrate).

In the third configuration in FIG. 1D, the gate stack of the memory cell 130c may include a spontaneously-polarizable memory element 124 and one or more electrically insulating layers 114 disposed between the channel region and the gate electrode 116. Furthermore, the gate stack may include a floating gate 140, e.g., disposed between the memory element 124 and the one or more electrically insulating layers 114. The floating gate 140 may be or may include an electrically conductive layer, such as a metal layer. In the case that the spontaneously-polarizable memory element 124 includes (e.g., consists of) a ferroelectric material, the configuration of the memory cell 130c may be referred to as Metal-Ferroelectric-Metal-Insulator-Semiconductor (MFMIS) FeFET. Illustratively, with respect to the second configuration 130b, a floating gate is inserted in the layer stack. The capacitance associated with the capacitor provided by the field-effect transistor structure may be referred to as $C_{IS}$ (e.g., considering a semiconductor substrate).

In the following, electrical properties of a memory cell are described in relation to FIG. 2A to FIG. 2E. The electrical properties in FIG. 2A to FIG. 2E are discussed in relation to a memory cell including one or more spontaneously-polarizable layers as memory element, e.g., one or more ferroelectric layers. In particular, the electrical properties in FIG. 2A to FIG. 2E are discussed in relation to a memory cell having a MFIS-type configuration (e.g., as the memory cell 130b in FIG. 1D). It is however understood that the electrical properties described in relation to a memory cell having a MFIS-type configuration may correspondingly apply also to a memory cell with a different configuration (e.g., a MFS configuration, a MFMIS configuration, or another configuration, e.g., with spontaneously-polarizable layers that are not ferroelectric).

Figure 2A:
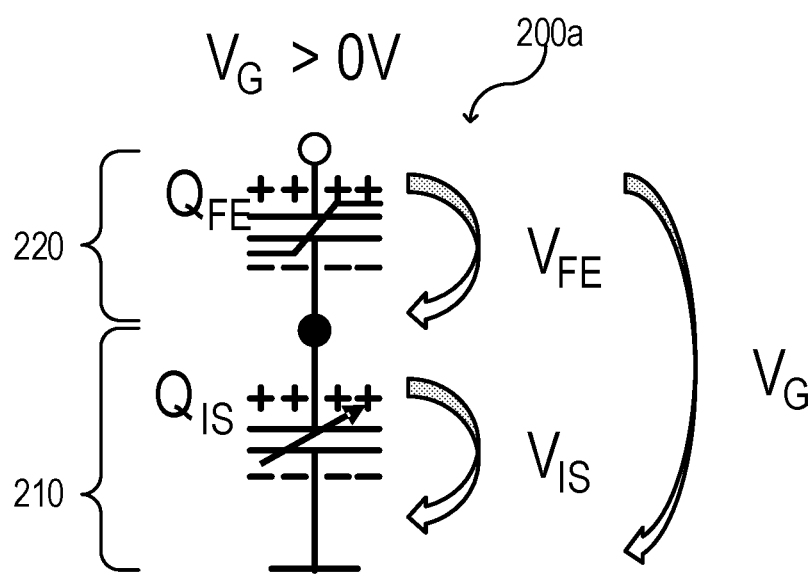
FIG. 2A to FIG. 2E show various aspects of electrical properties of a memory cell in a schematic representation.

FIG. 2A illustrates an equivalent circuit 200a associated with a FeFET stack of a FeFET based memory cell, e.g., as discussed in relation to FIG. 1A and FIG. 1B for the memory structure 100. The FeFET stack of a FeFET based memory cell may be described as a series connection of two capacitors. A first capacitor structure 220 is associated with the gate-electrode and with the spontaneously-polarizable layer of the gate-isolation. A second capacitor structure 210 is associated with the one or more electrically insulating layers of the gate-isolation and with the channel and/or the semiconductor bulk region.

The first capacitor structure 220 may have a first capacitance, $C_{FE}$, a first charge, $Q_{FE}$, and a first voltage, $V_{FE}$, associated therewith. The second capacitor structure 210 may have a second capacitance, $C_{IS}$, a second charge, $Q_{IS}$, and a second voltage, $V_{IS}$, associated therewith. The voltage drop of the series connection of the two capacitor structures 210, 220 may be referred to as gate voltage, $V_G$. In this example, the gate voltage, $V_G$, is a positive voltage (greater than 0 V); however, the gate voltage may be a negative voltage (less than 0 V) as well. The gate voltage, $V_G$, may be applied at the gate electrode and the channel and/or the semiconductor bulk region may be at a reference potential, e.g., at ground potential (also referred to as 0 V, or as VSS, as examples).

In some aspects, the first capacitance, $C_{FE}$, that is, for example, associated with a capacitive memory structure may not be constant, e.g., may be a function of the voltage that is applied and/or a function of a polarization of the material included in the capacitive memory structure. However, a so-called "dielectric" capacitance may be associated with the capacitive memory structure that is substantially constant and defines a minimal capacitance of the capacitive memory structure. The capacitance of a capacitive memory structure may be greater than the minimal capacitance in the case that the polarization of a spontaneously-polarizable layer that is included in the capacitive memory structure is polarized and/or switched by an external electrical field. In some aspects, the second capacitance, $C_{IS}$, that is, for example, associated with a portion of a field-effect transistor structure may not be constant, e.g., may be a function of the voltage that is applied. However, a so-called "dielectric" capacitance may be associated with the part of the field-effect transistor structure that is substantially constant and defines a maximal capacitance of the part of the field-effect transistor structure. The dielectric capacitance of a part of the field-effect transistor structure may be dominant in the case that the channel of the field-effect transistor structure is conductive, e.g., for strong accumulation and for strong inversion, and, otherwise, the capacitance of the field-effect transistor structure may be lower than the maximal capacitance.

According to general physical law, both charge neutrality (see Equation 1) and Kirchhoff law (see Equation 2) may be seen as fulfilled during all instances of an operation of the memory cell.

$$Q_{FE} = Q_{IS} \tag{1}$$

$$V_G = V_{FE} + V_{IS} \tag{2}$$

Figure 2B:
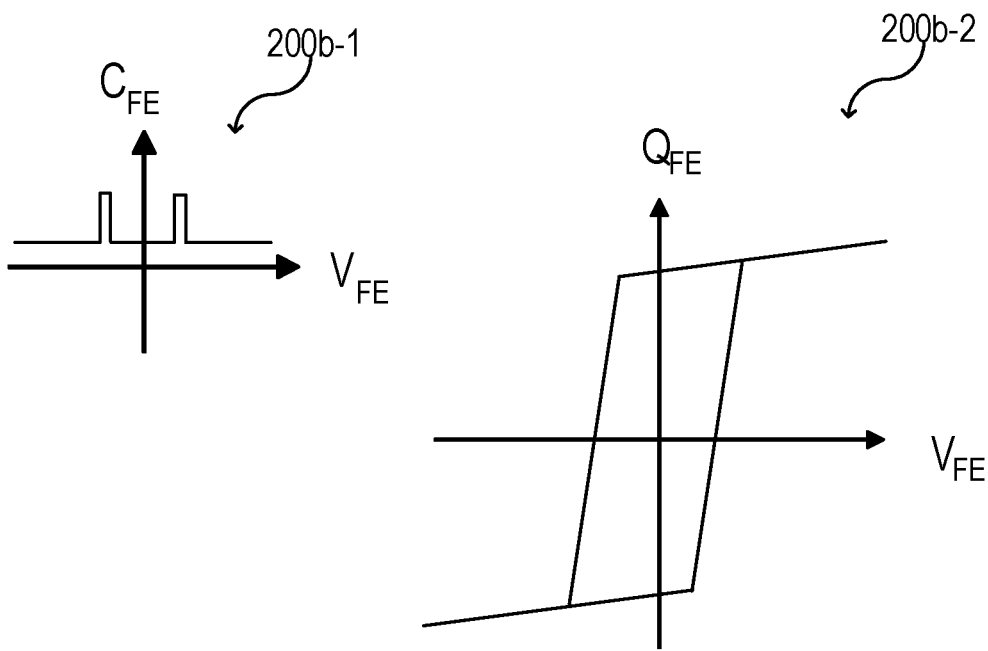

FIG. 2B shows a first diagram 200b-1 that illustrates a capacitance/voltage (CN) characteristic of the first capacitor structure 220 and a second diagram 200b-2 that illustrates a charge/voltage (Q/V) characteristic of the first capacitor structure 220, according to various aspects. The capacitance/voltage characteristic of the first capacitor structure 220 shows the first capacitance, $C_{FE}$, as a function of the first voltage, $V_{FE}$, that are associated with the first capacitor structure 220. The charge/voltage characteristic of the first capacitor structure 220 shows the first charge, $Q_{FE}$, as a function of the first voltage, $V_{FE}$, that are associated with the first capacitor structure 220.

Figure 2C:
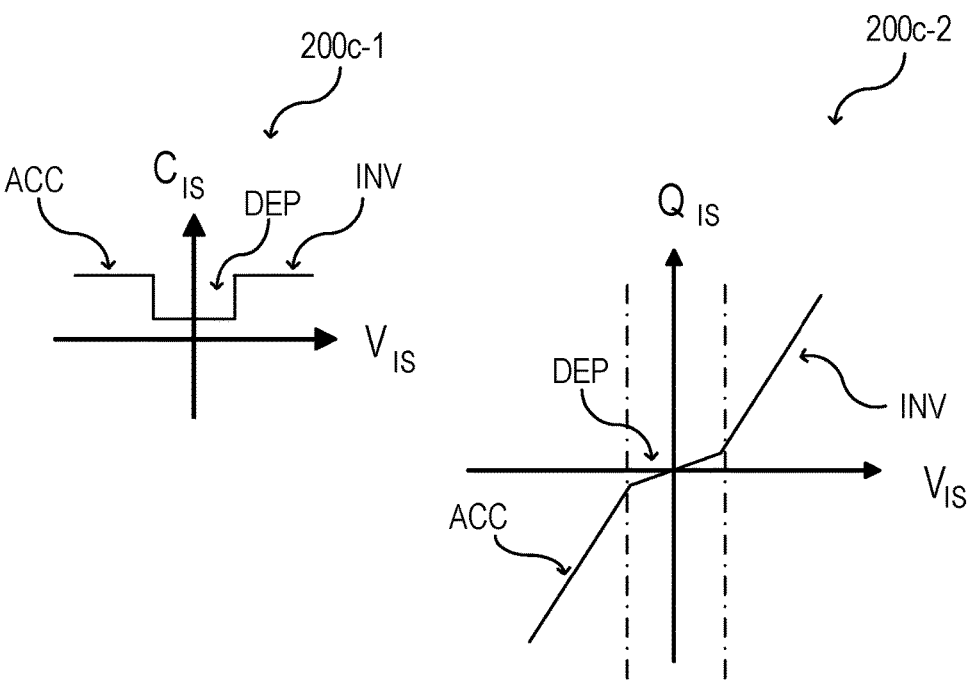

FIG. 2C shows a first diagram 200c-1 that illustrates a capacitance/voltage characteristic of the second capacitor structure 210 and a second diagram 200c-2 that illustrates a charge/voltage characteristic of the second capacitor structure 210, according to various aspects. The capacitance/voltage characteristic of the second capacitor structure 210 shows the second capacitance, $C_{IS}$, as a function of the second voltage, $V_{IS}$, that are associated with the second capacitor structure 210. The charge/voltage characteristic of the second capacitor structure 210 shows the second charge, $Q_{IS}$, as a function of the second voltage, $V_{IS}$, that are associated with the second capacitor structure 210. Both diagrams 200c-1, 200c-2 illustrate the respective dependencies for three cases, namely, accumulation (ACC), depletion (DEP), and inversion (INV).

Figure 2D:
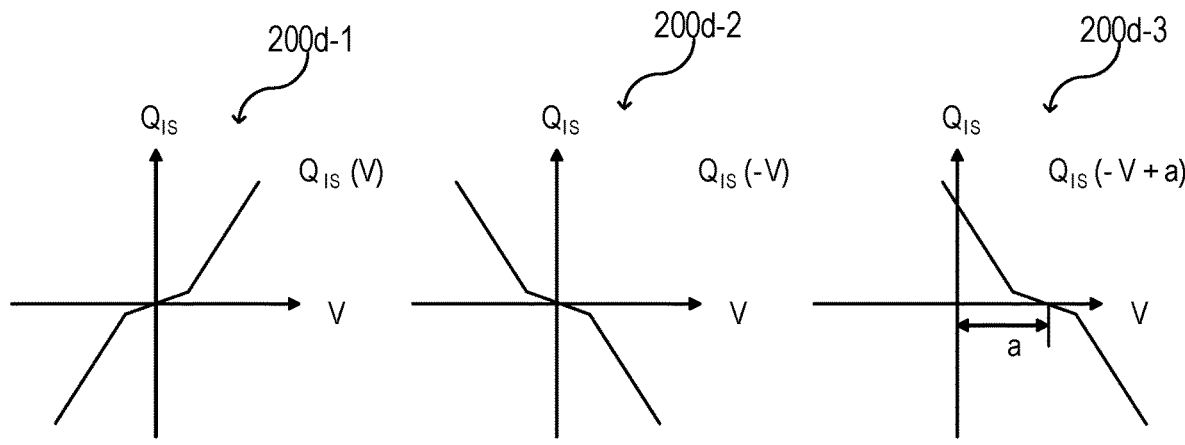

FIG. 2D shows three diagrams 200d-1, 200d-2, 200d-3 that illustrate basic characteristics of a charge/voltage characteristic, e.g., the charge/voltage characteristic of the second capacitor structure 210, according to various aspects. From equations (1) and (2) the following two related equations can be derived by simple math:

$$Q_{FE}(V_{FE}) = Q_{IS}(V_{IS}) \tag{1a}$$ and $$V_{IS} = V_G - V_{FE} \tag{2a};$$

and by inserting equation (2a) into (1a), the following equation can be derived by simple math:

$$Q_{FE}(V_{FE})=Q_{IS}(V_G-V_{FE})=Q_{IS}(-V_{FE}+V_G) \qquad (3).$$

This approach leads to the possibility of graphically solving equations (1a) and (2a). The graphical solution is shown schematically in a diagram 200e in FIG. 2E to illustrate aspects of depolarization in a gate stack including a spontaneously-polarizable material, according to various aspects.

Figure 2E:
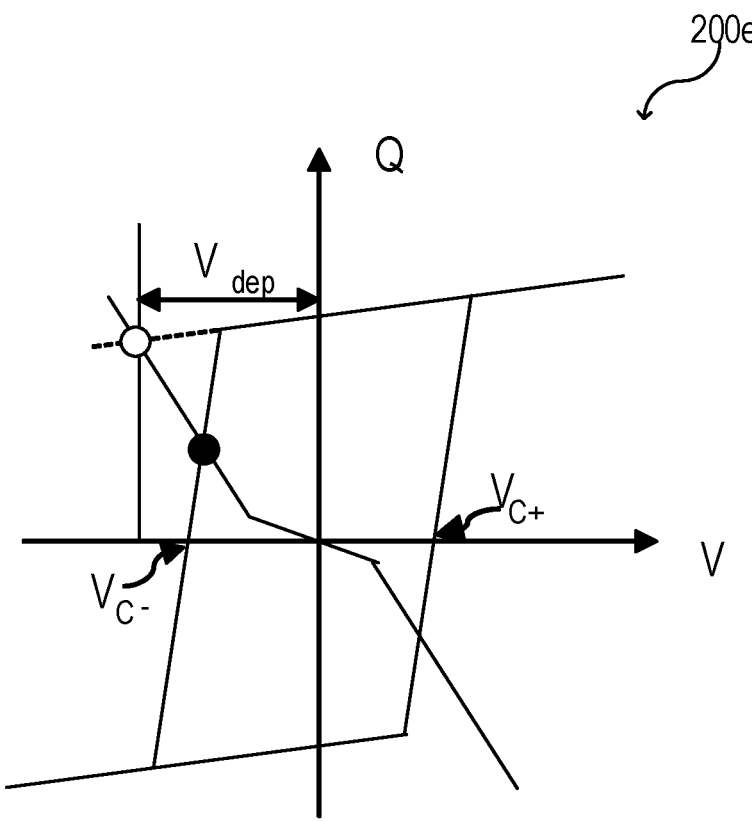

Due to the finite capacitance of the second capacitor structure 210, it may be the case that a comparatively large depolarization voltage and therefore a comparatively large depolarization field is created across the one or more spontaneously-polarizable layers. In this exemplary case, the depolarization voltage may be $V_{dep}=V_{FE}=-V_{IS}$ and the depolarization field may be $(V_{dep}/t_{FE})$, wherein $t_{FE}$ is the thickness of the one or more spontaneously-polarizable layers. In some cases, the depolarization field may be greater than the coercive field, that may be $(V_C/t_{FE})$, wherein $V_C$ is the coercive voltage. Therefore, in some aspects, the polarization of the one or more spontaneously-polarizable layers may flip (e.g., completely or at least partially, as shown in FIG. 2E) into the opposite polarization state. However, a reduction of the remanent polarization and/or a flip of the polarization state may be undesired since it may affect data retention.

A possible approach to mitigate or solve the issue of depolarization will be discussed in relation to FIG. 3A and FIG. 3B. This approach relies on increasing the (second) capacitance associated with the field-effect transistor structure, illustratively, the capacitance of the $C_{IS}$ stack. Due to the larger capacitance of the (M)IS stack, the polarization of the spontaneously-polarizable memory element may be better stabilized. However, this approach suffers from several drawbacks, as discussed in further detail below.

Figures 3A, 3B:
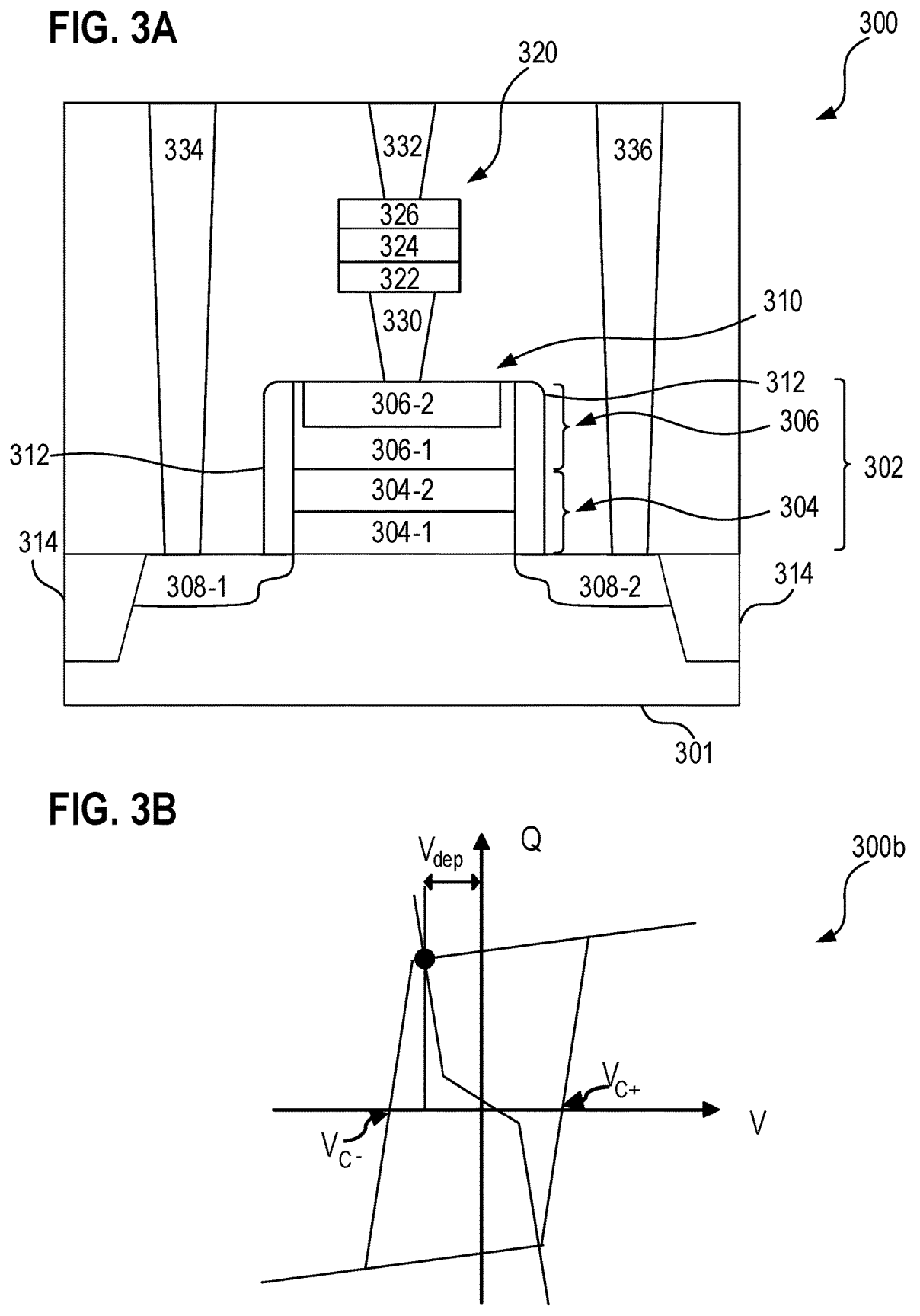

FIG. 3A shows an integration scheme of a memory cell 300 in a schematic view, according to various aspects. The memory cell 300 may be an exemplary realization of a memory cell including a field-effect transistor structure 310 and a capacitive memory structure 320 coupled with one another (e.g., via a first contact structure 330), and configured according to a possible approach for reducing the depolarization field across a memory element 324 of the memory cell 300. The various components of the memory cell 300 may be configured as discussed in relation to the memory structure 100 and the memory cell 130 in FIG. 1A to FIG. 1D, so that a detailed description of these components will be omitted.

The memory cell 300 may include a field-effect transistor structure 310 with a gate stack 302 including a gate isolation 304 and a gate electrode 306. The gate isolation 304 may include one or more electrically insulating layers, e.g., a first electrically insulating layer 304-1 and a second electrically insulating layer 304-2 in the configuration in FIG. 3A. The first electrically insulating layer 304-1 may be a first insulator, e.g., including or consisting of a dielectric material, such as silicon oxynitride. The second electrically insulating layer 304-2 may be a second insulator, e.g., including or consisting of a dielectric material, for example a high-k dielectric material, such as hafnium oxide. The field-effect transistor structure 310 may be integrated in or over a semiconductor substrate 301, e.g., a silicon substrate.

The gate electrode 306 may include one or more gate electrode layers, e.g., a first gate electrode layer 306-1 and a second gate electrode layer 306-2 in the configuration in FIG. 3A. The first gate electrode layer 306-1 may be a first electrically conductive layer, e.g., including (e.g., consisting of) a metal material (such as titanium nitride). Illustratively, the first gate electrode layer 306-1 may be a metal gate. The second gate electrode layer 306-2 may be a second electrically conductive layer, e.g., the second gate electrode layer 306-2 may include (e.g., consist of) polysilicon or amorphous silicon.

The field-effect transistor structure 310 may further include a first source/drain region 308-1 and a second source/drain region 308-2, e.g., including (e.g., consisting of) doped semiconductor (e.g., n++ or p++ doped silicon). The field-effect transistor structure 310 may further include one or more separation structures 312 (spacer structures) disposed around the gate stack 302. The one or more separation structures 312 may include (e.g., consist of) an electrically insulating material, e.g., silicon nitride. The memory cell 300 may further include one or more substrate separation structures 314, e.g., one or more shallow trench isolation structures 314. The one or more substrate separation structures 314 may include (e.g., consist of) an electrically insulating material, e.g., an oxide, such as silicon dioxide.

The capacitive memory structure 320 may include a first (e.g., bottom) electrode layer 322, a second (e.g., top) electrode layer 326, and a spontaneously-polarizable memory element 324 disposed between the first electrode layer 322 and the second electrode layer 326. The first electrode layer 322 and the second electrode layer 324 may include (e.g., consist of) an electrically conducting material, e.g., a metal material such as titanium nitride. As an example, the spontaneously-polarizable memory element 324 may include (e.g., consist of) a ferroelectric material, such as $Hf_{0.5}Zr_{0.5}O_2$. One of the electrode layers of the capacitive memory structure, e.g., the bottom electrode layer 322, may be connected via a first contact structure 330 to the gate electrode 306 of the field-effect transistor structure 310 (e.g., to the second gate electrode layer 306-2). A second contact structure 332 may be connected to the other electrode layer of the capacitive memory structure 320, e.g., to the top electrode layer 326, to provide electrical access to the memory structure (illustratively, to the gate of the field-effect transistor structure 310).

The memory cell 300 may include further (e.g., third and fourth) contact structures 334, 336 contacting the source/drain regions 308-1, 308-2, to provide electrical access to the source/drain regions 308-1, 308-2, e.g., for writing and reading the memory cell 300. The contact structures of the memory cell 300, e.g., the first, second, third, fourth contact structures 330, 332, 334, 336 of the memory cell 300 may include (e.g., consist of) a metal material, such as tungsten, as an example. The contact structures may be integrated or embedded in an insulator, such as an oxide or a nitride.

To mitigate or overcome the issue of depolarization, the memory cell 300 may be configured such that the (second) capacitance associated with the field-effect transistor structure 310 is greater than the (first) capacitance of the capacitive memory structure 320. Illustratively, the capacitance associated with the field-effect transistor structure 310 may be increased so that more voltage drops across the memory element 324, thus increasing the amount of switched charge and making the polarization of the memory element 324 more stable. The capacitance of the field-effect transistor structure 310, illustratively the capacitance of the $C_{IS}$ stack, may be increased by providing a field-effect transistor structure 310 having a greater area (e.g., a larger MIS area)

with respect to the capacitive memory structure 320 to which it is connected (e.g., with respect to the MFM capacitor).

FIG. 3B shows schematically a diagram 300b to illustrate aspects of depolarization in a gate stack including a spontaneously-polarizable material in a memory cell configured as the memory cell 300 in FIG. 3A. The graph 300b illustrates the graphical solution to the equations (1a) and (2a) for the case in which the capacitance associated with the field-effect transistor structure 310 may be increased. With respect to the graphical solution shown in FIG. 2E for a non-adapted memory cell, the depolarization field occurring in a memory cell configured as described for the memory cell 300 is reduced, in view of the adapted charge-voltage behavior of the field-effect transistor structure.

An approach as described in relation to FIG. 3A and FIG. 3B is however impractical, both from a fabrication and an operation point of view. In a configuration with a field-effect transistor structure having a larger area (illustratively, a larger footprint), the area of the transistor to which the capacitive memory structure is connected is increased, which in turn leads to an increased size of the memory cell (and thus to a reduced yield per wafer). In addition, the greater capacitance of the field-effect transistor structure provides that more voltage will drop across the spontaneously-polarizable memory element (e.g., the ferroelectric film), which leads to increased susceptibility to disturbs during operation, e.g., increased susceptibility to read disturb. Furthermore, due to the change in the voltage divider configuration, less voltage will drop across the field-effect transistor structure (illustratively, across the (M)IS stack), which leads to a degraded transistor control in terms of its transfer characteristics (e.g., degraded subthreshold slope and drive current).

Figure 4A:
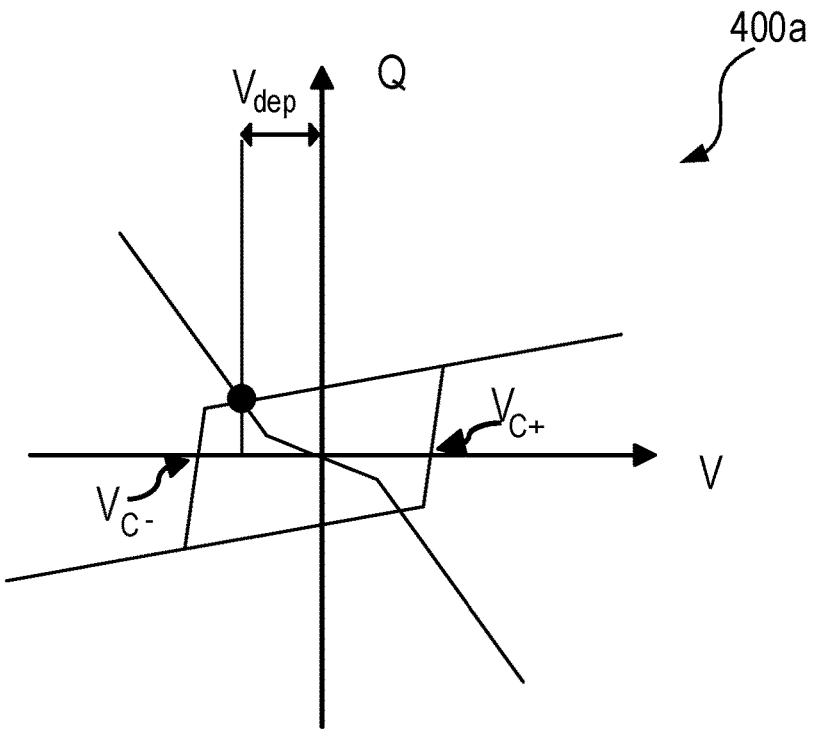
FIG. 4A and FIG. 4B show various aspects of electrical properties of a memory cell in a schematic representation.
Figure 4B:
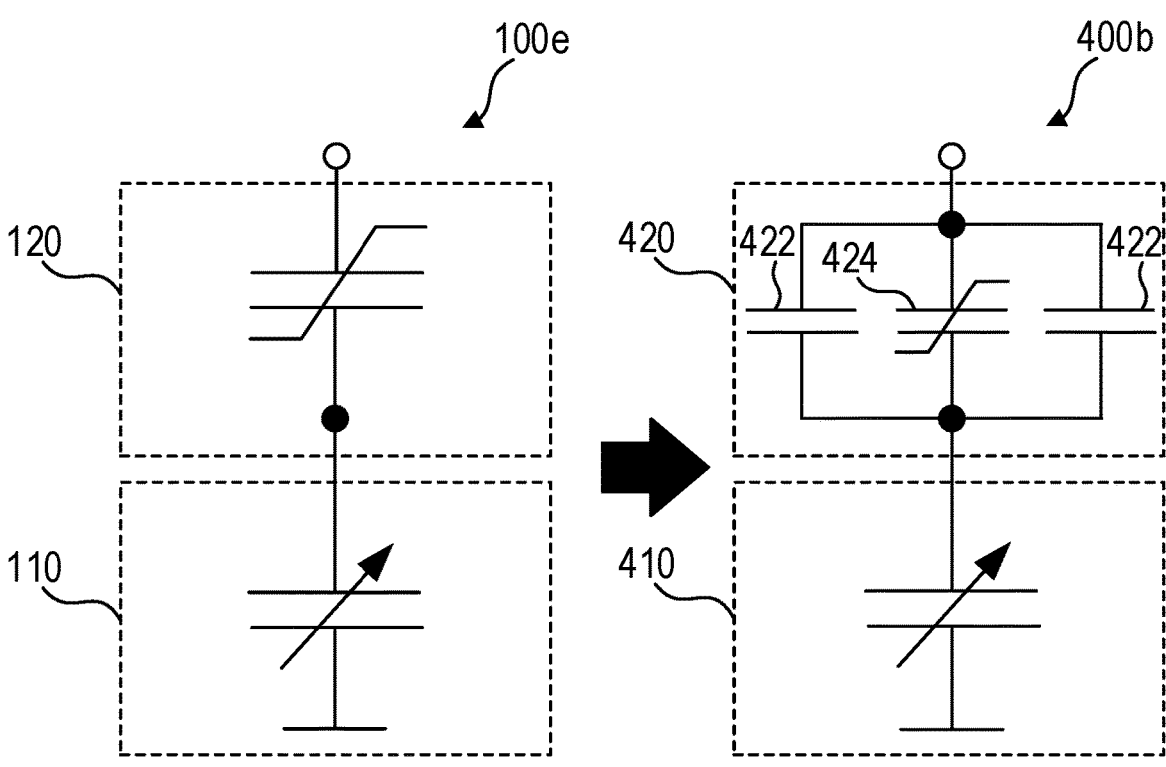

Various aspects are related to a configuration of a memory cell adapted to reduce the depolarization field across its memory element, while mitigating or eliminating the drawbacks discussed in relation to the approach illustrated in FIG. 3A and FIG. 3B. The adapted memory cell described herein may include a memory element structured to provide a reduction of the depolarization field across its spontaneously-polarizable portion(s), while ensuring a reliable and controllable switching behavior of the memory cell. A structured memory element for a memory cell is described to reduce the depolarization field, for example for use in FeFET based devices, e.g., in a FeFET based memory cell. The adapted approach to which various aspects relate is illustrated in FIG. 4A and FIG. 4B. By way of illustration, various aspects may be based on the realization that a memory element may be structured to reduce the charge provided by the switching of the spontaneous polarization of the memory element (e.g., the charge produced by the ferroelectric switching), which in turn provides a reduction in the depolarization field across the memory element. The structuring of the memory element provides thus mitigating the depolarization-related issues, without deteriorating other properties of a memory cell (e.g., stability during readout, or controllability of the field-effect transistor structure) and without leading to an increased size of the memory cell.

FIG. 4A and FIG. 4B show various aspects of electrical properties of a memory cell configured according to the adapted approach discussed herein, in a schematic representation. Illustratively, as shown in the diagram 400a in FIG. 4A, the adapted approach may be based on adapting the charge-voltage behavior of the capacitive memory structure of a memory cell, rather than on adapting the charge-voltage behavior of the field-effect transistor structure. This strategy provides reducing the depolarization field, thus mitigating its detrimental effects on data retention, without the drawbacks discussed in relation to FIG. 3A and FIG. 3B.

The diagram 400a illustrates a graphical solution to the equations (1a) and (2a) for the case in which the memory element is structured to reduce the charge provided by the switching of its polarization, as discussed in further detail in relation to FIG. 5A to FIG. 5G. Illustratively, the memory element may be structured to have a reduced fraction of spontaneously-polarizable capacitance. With respect to the graphical solution shown in FIG. 2E for a non-adapted memory cell, the depolarization field is reduced in view of the adapted charge-voltage behavior of the capacitive memory structure. With respect to the graphical solution shown in FIG. 3B for the case in which the field-effect transistor structure has a greater capacitance, the solution proposed in FIG. 4A (see also FIG. 5A to FIG. 5G) does not alter the voltage divider distribution of the memory cell, thus avoiding undesired behavior, e.g., reduced operability.

FIG. 4B illustrates the circuit equivalent 400b of an adapted memory cell with a field-effect transistor structure 410 and a (adapted) capacitive memory structure 420 with respect to the circuit equivalent 100e of a non-adapted memory cell (as shown in FIG. 1A and FIG. 1B). The memory element may be structured in such a way that the capacitive memory structure is configured as a parallel connection of one or more spontaneously-polarizable capacitors 424 and one or more dielectric capacitors 422.

The memory element may be structured to have one or more spontaneously-polarizable regions (providing the one or more spontaneously-polarizable capacitors 424) and one or more non-spontaneously-polarizable regions, e.g., one or more (purely) dielectric regions (providing the one or more dielectric capacitors 422). This configuration may be based on the realization that the charge per unit area (illustratively, the polarization) is a rather fixed material property of a material (e.g., of a spontaneously-polarizable material, such as of a ferroelectric). Accordingly, the desired reduction in switched charge is provided by an adapted capacitor design and integration, rather than by acting on the material itself with material engineering.

By way of illustration, the approach discussed herein may include reducing the "amount" of spontaneously-polarizable capacitance fraction in the capacitive memory structure (e.g., the amount of ferroelectric capacitance in a MFM structure) while maintaining or increasing the amount of dielectric fraction without the need to engineer the spontaneously-polarizable material in its intrinsic properties. This approach provides achieving the capacitive load-line combination illustrated in the diagram 400a. With respect to the approach discussed in FIG. 3A and FIG. 3B, the adapted strategy described herein provides greater tolerance to disturbs (e.g., during readout), allows maintaining a reduced memory cell size, and ensures a reliable transistor control.

In various aspects, an alternative configuration of a memory structure may be provided, which includes one or more dielectric capacitors disposed in parallel to one or more spontaneously-polarizable capacitors. A dielectric capacitor may include a dielectric material disposed between two electrodes, and a spontaneously-polarizable capacitor may include a spontaneously-polarizable material disposed between two electrodes. The electrodes of the one or more dielectric capacitors and the electrodes of the one or more spontaneously-polarizable capacitors may be connected to one another to provide a parallel connection of the capacitors. Such configuration is thus based on the placement of separate structures, each acting as a capacitor (dielectric or spontaneously-polarizable), rather than being based on the structuring of a memory element (illustratively, the structuring of an individual capacitive structure). This approach is however less preferred due to an increase in the memory cell size.

In the following, a capacitive memory structure adapted to provide the reduction of the switching charge will be described in more detail in relation to FIG. 5A to FIG. 5G.

FIG. 5A to FIG. 5G show various aspects of a capacitive memory structure 500a, 500b, 500c, 500d, 500e, 500f, 500g in a schematic representation. The capacitive memory structures 500a, 500b, 500c, 500d, 500e, 500f, 500g may include a memory element 504a, 504b, 504c, 504d, 504e, 504f, 504g structured to provide a reduction in the switching charge of its spontaneous polarization. Illustratively, the capacitive memory structures 500a, 500b, 500c, 500d, 500e, 500f, 500g may be or include an adapted configuration of the capacitive memory structure 120 discussed in relation to the memory structure 100 in FIG. 1A to FIG. 1D., e.g., including an adapted (structured) configuration of the memory element 124. The capacitive memory structures 500a, 500b, 500c, 500d, 500e, 500f, 500g are collectively referred to in the following as capacitive memory structure 500a-500g, and the memory elements 504a, 504b, 504c, 504d, 504e, 504f, 504g are collectively referred to in the following as memory element 504a-504g.

In the following, various possible configurations for a structured memory element 504a-504g will be described with relation to FIG. 5A to FIG. 5G. The configurations described herein provide suitable structuring of a memory element 504a-504g, e.g., which may be provided with reproducible fabrication methods described in further detail below. It is however understood that also other structuring configurations of a memory element (e.g., with more or less regions, with different disposition of the regions, etc.) may be provided to achieve a reduction of the switching charge.

The capacitive memory structure 500a-500g may include at least two electrode layers, e.g., a first (e.g., bottom) electrode layer 502 and a second (e.g., top) electrode layer 506, and a memory element 504a-504g disposed between the at least two electrode layers, e.g., between the first electrode layer 502 and the second electrode layer 506. An electrode layer of the capacitive memory structure 500a-500g (e.g., the first electrode layer 502 and/or the second electrode layer 506) may include (e.g., may consist of) an electrically conductive material, for example, a metal material, a metal alloy, a degenerate semiconductor and/or the like. As an example, the electrode layers 502, 506 may include (e.g., may consist of) aluminum, titanium nitride, or tantalum nitride.

Figure 5A:
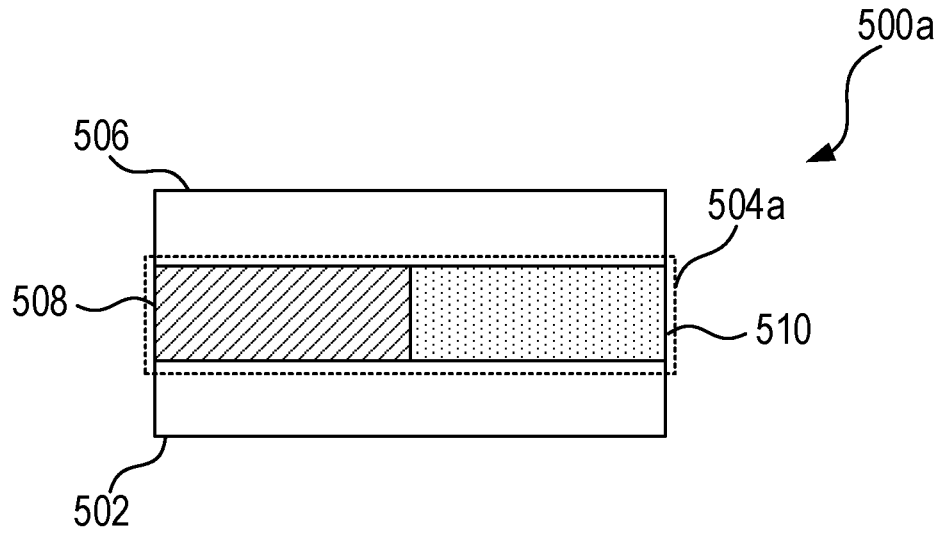
FIG. 5A to FIG. 5G show various aspects of a capacitive memory structure in a schematic representation.
Figure 5B:
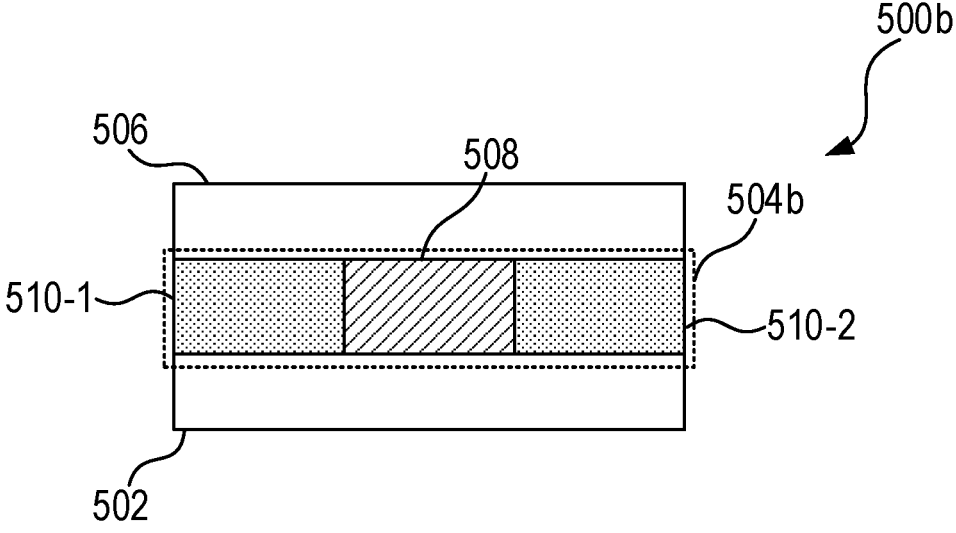
Figure 5C:
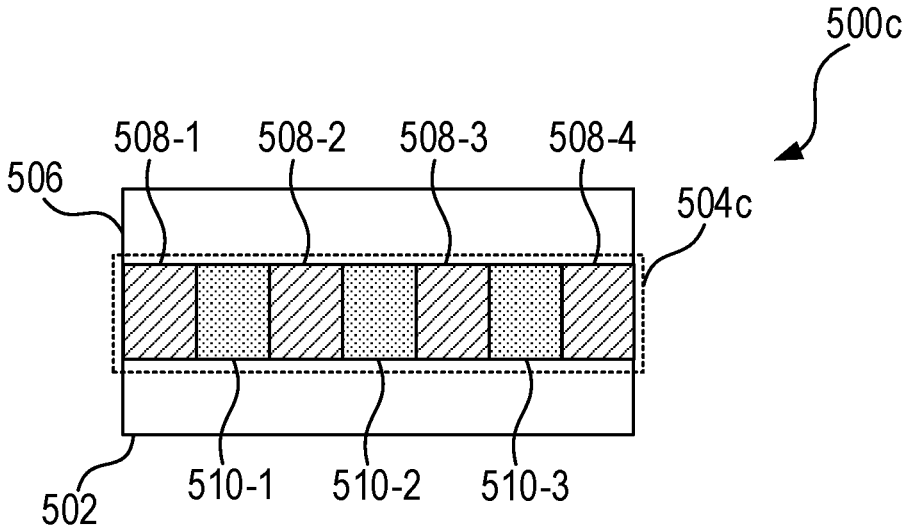

The memory element 504a-504g may be structured to include plurality of regions having different material properties with respect to one another, e.g., to include one or more first regions 508 having one or more first material properties (e.g., a first region 508 in FIG. 5A, a plurality of first regions 508 in FIG. 5C, etc.), and one or more second regions 510 having one or more second material properties (e.g., a second region 510 in FIG. 5A, a plurality of second regions 510 in FIGS. 5B and 5C, etc.). The one or more first material properties may differ from the one or more second material properties.

The one or more first regions 508 may (each) consist of a first material, and the one or more second regions 510 may (each) consist of a second material different from the first material. The first material and the second material may be configured, e.g., selected, to provide spontaneous-polarization capabilities in the one or more first regions 508 and no spontaneous-polarization capabilities (or less spontaneous-polarization capabilities) in the one or more second regions 510. Illustratively, the material of a region may define the polarization capabilities of that region, so that analyzing the material it may be determined whether the region is or not spontaneously-polarizable (e.g., whether the region is spontaneously-polarizable or purely dielectric). The first material and the second material may have a same chemical composition and differ in one or more other aspects that define the polarization capabilities (e.g., the porosity, or the crystal structure), or may have different chemical compositions (e.g., different types of participating elements, or different amounts of (same) participating elements) that define the different polarization capabilities.

As an exemplary configuration, a memory element 504a may consist of a first region 508 and a second region 510, as shown in FIG. 5A, e.g., having a same width or a different width. As another exemplary configuration, a memory element 504b may consist of a first region 508 surrounded by (illustratively, sandwiched between) two second regions 510-1, 510-2 as shown in FIG. 5B, e.g., with the first region 508 and the second regions 510-1, 510-2 having a same width or a different width. As a further exemplary configuration, a memory element 504b may consist of a plurality of first regions 508-1, 508-2, 508-3, 508-4 and a plurality of second regions 510-1, 510-2, 510-3, 510-4, as shown in FIG. 5C, e.g., with an alternation of first regions 508-1, 508-2, 508-3, 508-4 and second regions 510-1, 510-2, 510-3, 510-4, e.g., with the first region 508 and the second regions 510 having a same width or a different width. As a further exemplary configuration, not shown, a memory element 504b may consist of a second region 510 surrounded by (illustratively, sandwiched between) two first regions 508, e.g., with the first region 508 and the second regions 510 having a same width or a different width According to various aspects, the first material may differ from the second material in a way that provides different polarization capabilities for the regions 508, 510 of the memory element 504a-504g. As discussed in further detail below, the first material may differ from the second material in at least one of a chemical composition (e.g., type and/or amount of participating elements, a doping, etc.), a porosity, and/or a crystal structure. This may provide that the first region(s) 508 and the second region(s) 510 exhibit different polarization behavior, e.g., that the first region(s) 508 have a (first) remanent polarization greater than a (second) remanent polarization of the second region(s) 510, e.g., that the second region(s) 510 have a dielectric behavior whereas the first region(s) 508 have a spontaneously-polarizable behavior. As an example, the (second) remanent polarization of the second region(s) 510 may be substantially zero, e.g., the second region(s) 510 may be non-remanently polarizable (and non-spontaneously-polarizable).

The memory element 504a-504g of the capacitive memory structure 500a-500g may illustratively be structured to have one or more spontaneously-polarizable regions 508 and one or more non-spontaneously-polarizable regions 510 (e.g., one or more dielectric regions, illustratively one or more regions showing a (pure) dielectric behavior). Illustratively, the structuring may be configured to provide on purpose regions 510 of the memory element 504a-504g that do not possess polarization properties for implementing a memory function (e.g., that do not possess spontaneous polarization properties), but are rather introduced in the memory element 504a-504g to adapt the fraction of spontaneously-polarizable capacitance, without reducing the overall capacitance of the memory structure 500a-500g.

The capacitance of a memory structure including a structured memory element 504a-504g may thus include one or more first partial capacitances associated with the one or more first regions, and one or more second partial capacitances associated with the one or more second regions 510. The capacitance of the memory structure may include a parallel connection of the one or more first partial capacitances and the one or more second partial capacitances with one another, e.g., share as common nodes the first electrode layer 502 and the second electrode layer 506. Illustratively, the memory element 504a-504g may be structured in such a way that the capacitive memory structure 500a-500g is configured as a parallel connection of one or more spontaneously-polarizable capacitors and one or more dielectric capacitors (see also FIG. 4B).

In this configuration, the first electrode layer 502 may be a (first) continuous electrode layer, and the second electrode layer 506 may be a (second) continuous electrode layer, which are shared as common nodes of the one or more first partial capacitances and the one or more second partial capacitances, e.g., as common nodes of the one or more spontaneously-polarizable capacitors and the one or more dielectric capacitors. Illustratively, the spontaneously-polarizable capacitors and the dielectric capacitors may be provided by a single continuous structure, rather than by separate structures, thus avoiding an increase of the overall size of a memory cell.

The one or more spontaneously-polarizable regions 508 may provide the one or more spontaneously-polarizable capacitors together with the first electrode layer 502 and the second electrode layer 506. The one or more non-spontaneously-polarizable regions 510, e.g., the one or more dielectric regions, may provide the one or more dielectric capacitors together with the first electrode layer 502 and the second electrode layer 506. The overall capacitance provided by the parallel connection of the partial capacitances may be substantially same as the capacitance provided by a non-structured memory element, but the spontaneously-polarizable fraction of the capacitance is reduced, thus reducing the depolarization field across the memory element 504a-504g. As a numerical example, the first partial capacitance(s) associated with the first region(s) may have a (e.g., total) capacitance value less than 20 $\mu C/cm^2$.

Various methods and strategies to provide such purposeful structuring will be described in further detail in relation to FIG. 7 to FIG. 11D. Illustratively, the strategy described herein is based on a reproducible and controlled structuring to provide regions 508, 510 consisting of different materials in a memory element, which provide different polarization behaviors. On the contrary, a memory element not fabricated according to the structuring described herein may include by chance and in a non-deterministic manner regions that are not spontaneously-polarizable (e.g., that are not ferroelectric), which however do not achieve the effect of reducing the switching charge, as their random distribution within the memory element (e.g., with random size, random location, etc.) does not lead to an adaptation of the spontaneously-polarizable capacitance of the memory structure.

In the structured configuration of a memory element 504a-504g described herein the one or more first regions 508 may have a total lateral extension in the horizontal direction (e.g., a total width) less than the lateral extension (e.g., the width) of the first electrode layer 502 and of the second electrode layer 506. Illustratively, the memory element 504a-504g may be structured in such a way that the memory region(s) 508 to implement the memory function occupy only a fraction of the space between the electrode layers 502, 506, e.g., less than 70% in volume, or less than 50% in volume, or less than 30% in volume, or as another example less than 70% in width of the first and second electrode layers 502, 506, or less than 50% in width, or less than 30% in width. The reduced amount of space dedicated to the spontaneously-polarizable memory function may provide a reduction in the switching charge of the polarization.

The regions of the memory element 504a-504g (e.g., the one or more first regions 508 and the one or more second regions 510) may extend from one electrode layer to the other electrode layer, e.g., from the first electrode layer 502 to the second electrode layer 506. Illustratively, the regions of the memory element 504a-504g may be in direct physical contact with a (e.g., top) surface of the first electrode layer 502 and with a (e.g., bottom) surface of the second electrode layer 506.

The one or more first regions 508 and the one or more second regions 510 may be continuous regions (e.g., with same material properties within the region) extending continuously from the first electrode layer 502 to the second electrode layer 506, e.g., being in direct physical contact with first electrode layer 502 and with the second electrode layer 506.

According to various aspects, the one or more first regions 508 may have uniform properties, e.g., same dimensions (e.g., a same width, a same length, and a same height, for example) and/or same (first) material. Alternatively, the one or more first regions 508 may have properties varying from one first region 508 to another first region 508. As an example, a first region 508 may be wider than another first region 508. As another example, a first region 508 may consist of a different (first) material with respect to another first region 508, as long as the spontaneous-polarization capabilities are maintained. In an analogous manner, the one or more second regions 510 may have uniform properties, e.g., same dimensions (e.g., a same width, a same length, and a same height, for example) and/or same (second) material properties. Alternatively, the one or more second regions 510 may have properties varying from one second region 510 to another second region 510. As an example, a second region 510 may be wider than another second region 510. As another example, a second region 510 may consist of a different (second) material with respect to another second region 510, as long as the reduced or non-spontaneous-polarization capabilities (e.g., purely dielectric capabilities) are maintained. The regions may thus be tailored according to a desired configuration of the memory element 504a-504g, e.g., to adapt the spontaneously-polarizable fraction of the capacitance, the disposition of the regions, etc.

According to various aspects, the first region(s) 508 may consist of a spontaneously-polarizable material (illustratively, the first material may be or include a spontaneously-polarizable material), and the second region(s) 510 may be substantially free of a spontaneously-polarizable material. As an example, the second region(s) 510 may consist of a dielectric material (illustratively, the second material may be or include a dielectric material not showing spontaneous polarization). Illustratively, the first region(s) 508 may consist of a material showing a spontaneously-polarizable behavior, and the second region(s) 510 may consist of a material showing a dielectric behavior. In various aspects, the material of the first region(s) 508 and the second region(s) 510 may include a same base material in a different phase, or with different doping, so that the different polarization capabilities may be provided. A base material may also be referred to herein as basic material.

The material of the second region(s) 510 may be totally non-spontaneously-polarizable, or partially spontaneously-polarizable but to an extent that does not enable implementing memory functions. As a numerical example, the first region(s) 508 may include a volume fraction of spontaneously-polarizable material greater than 90%, for example greater than 95%. As another numerical example, the second region(s) 510 may include a volume fraction of spontaneously-polarizable material less than 10%, for example less than 5%, for example less than 1%.

According to various aspects, a spontaneously-polarizable region 508 may include (e.g., may consist of) a remanent-polarizable material. A remanent-polarizable material may be a material that is remanently polarizable and shows a remanence of the spontaneous polarization, such as a ferroelectric material. In other aspects, a remanent-polarizable material may be a material that is spontaneously-polarizable and that shows no remanence, e.g., an anti-ferroelectric material under the additional conditions that measures are implemented to generate an internal electric-field within the anti-ferroelectric material. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples.

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, a spontaneous-polarizable material (e.g., a remanent-polarizable material) may be or may include a ferroelectric material, illustratively a first region 508 of a memory element may be ferroelectric region (and a second region 510 may be a non-ferroelectric region). The ferroelectric material may be or may include a (ferroelectric) metal oxide, e.g., at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferro-electricity in hafnium oxide or zirconium oxide. The ferro-electric material may be doped at a concentration from about 2 mol % to about 6 mol %, only as an example.

A dielectric material of the second region(s) 510 may be or may include any material showing dielectric properties and not showing (substantial) spontaneous-polarization properties. As example, the material of the second region(s) 510 may be or may include an oxide, a nitride, or an oxynitride. In various aspects, the material of the second region(s) 510 may be or may include a (dielectric) metal oxide. As examples, the material of the second region(s) 510 may be or may include silicon oxide, silicon nitride, silicon oxynitride. As other examples, the material of the second region(s) 510 may be or may include (dielectric) hafnium oxide, (dielectric) zirconium oxide, or a (dielectric) mixture of hafnium oxide and zirconium oxide. In the case that the material is or includes hafnium oxide or zirconium oxide, the material may be configured such that it does not provide spontaneously-polarizable capabilities, e.g., may have an amorphous structure or may include a concentration of dopant elements that prevents spontaneously-polarizable capabilities, as discussed in further detail below. Illustratively, a (first) metal oxide of the first region(s) 508 may differ from a (second) metal oxide of the second region(s) in one or more material properties that provide different polarization capabilities, e.g., may differ in at least one of chemical composition (e.g., type and/or amount of participating elements, e.g., considering doping), and/or crystal structure.

In various aspects, as a particular case, the second region(s) 510 may not include any solid material, e.g., the space from the first electrode layer 502 to the second electrode layer 506 in correspondence of the second region(s) 510 may include a gas (such as air) or may be under vacuum, to provide the dielectric properties for the second region(s) 510. Illustratively, in some aspects, the second region(s) 510 may define a gap (e.g., an air gap) around the first region(s) 508.

In the case that the first region(s) 508 and the second region(s) 510 each include a material having a chemical composition with same participating elements, the material of the regions 508, 510 may differ in other properties to provide the different spontaneous-polarization capabilities of the first region(s) 508 and the second region(s) 510, as discussed in further detail below.

According to various aspects, additionally or alternatively, the first material of the first region(s) 508 may have a spontaneously-polarizable crystal structure, illustratively a crystal structure that defines spontaneous-polarization properties. A spontaneously-polarizable crystal structure may be or may include a crystal structure of the first material that provides a (substantial) remanent polarization in the first region(s) 508. As example, the first material may have a monoclinic structure, or a tetragonal structure. A suitable crystal structure of the first material may be provided by inducing a crystallization in an amorphous material, as discussed in further detail below in relation to FIG. 7 to FIG. 11D. The second material of the second region(s) 510 may have an amorphous structure, illustratively a structure that defines dielectric properties, e.g., without or with no substantial remanent polarization. Illustratively, the first material of the first region(s) 508 may be in a spontaneously-polarizable phase (or state) defined by its crystal structure (e.g., a ferroelectric phase), and the second material of the second region(s) 510 may be in a phase that does not provide spontaneous-polarization capabilities. As discussed above, in various aspects the first material and the second material may have a same chemical composition (e.g., a same base material, e.g., may be or include hafnium oxide, or zirconium oxide) in a different phase defined by the different structure.

The first region(s) 508 may include at least a single grain of a spontaneously-polarizable material that is in contact with both the first electrode layer 502 and the second electrode layer 506. Illustratively, the first region(s) 508 may include at least one single-crystal region of a material, with a continuous crystal lattice extending from the first electrode layer 502 to the second electrode layer 506, with no grain boundaries. It is understood that the first region(s) 508 may include more than one single grain (more than one single-crystal region), e.g., disposed adjacent to one another along the width of the first region(s) 508, e.g., two adjacent grains separated by a grain boundary. The second region(s) 510 may be free of a single grain of a spontaneously-polarizable material that is in contact with both the first electrode layer 502 and the second electrode layer 506. Illustratively, in view of the substantially amorphous structure of the second region(s) 510, there may be no single grain extending continuously from the first electrode layer 502 to the second electrode layer 506 (illustratively, connecting the first electrode layer 502 and the second electrode layer 506 with one another).

According to various aspects, additionally or alternatively, the first material of the first region(s) 508 and the second material of the second region(s) 510 may have different doping. The introduction of dopant elements (e.g., dopant atoms) in a (base) material may provide, depending on the concentration of dopant elements (e.g., dopant atoms), activating the spontaneous-polarization capabilities of the material, or deactivating the spontaneous-polarization capabilities of the material (e.g., destroying the crystal structure of the material). The doping of the first material and the second material may thus be configured (e.g., selected) to provide spontaneous-polarization capabilities in the first region(s) 508 and non spontaneous-polarization capabilities (e.g., purely dielectric capabilities) in the second region(s) 510. The first material may include a base material having a first concentration of dopant elements, and the second material may include the base material having a second concentration of dopant elements, with the first concentration and the second concentration different from one another.

In various aspects, the second concentration of dopant elements may be greater than the first concentration of dopant elements, for example at least two times greater, or at least three times greater, or at least five times greater. As numerical examples, the first concentration of dopant elements may be in the range from 2 mol % to 6 mol % to provide a spontaneously-polarizable phase of the first material of the first region(s) 508, as discussed above, and the second concentration of dopant elements may be in the range from 20 mol % to 30 mol % to provide a non spontaneously-polarizable phase of the second material of the second region(s) 510.

The dopant elements may include, as examples, silicon, aluminum, gadolinium, yttrium, lanthanum, strontium, zirconium, any of the rare earth elements or any other dopant suitable to provide or maintain a spontaneously-polarizable phase up to a certain concentration and to destroy the spontaneously-polarizable phase above that concentration. As an example, the dopant elements in the first material may be the same as the dopant elements in the second material. As another example, the dopant elements in the first material may be different from the dopant elements in the second material.

As another configuration, the second material may include the base material having substantially no dopant elements. Illustratively, the first material may be doped with the first concentration of dopant elements to bring the base material in a spontaneously-polarizable phase, and the second material may be left undoped and in a non-spontaneously-polarizable phase.

According to various aspects, additionally or alternatively, the polarization properties of the first region(s) 508 and second region(s) 510 may be adapted by adapting the porosity of the respective materials. Illustratively, the polarization may be a volume-effect, so that varying the effective volume of material within a region may provide adapting the overall polarization of the region. The first material may have a first porosity, and the second material may have a second porosity different from the first porosity. The porosity of a material may be a fraction of the volume of voids over a total volume of the material, e.g., expressed as a value from 0 to 1 or as a percentage value from 0% to 100%. As an exemplary configuration, the second porosity may be greater than the first porosity, e.g., at least two times greater, for example at least three times greater, for example at least five times greater. The greater porosity of the material of the second region(s) 510 may reduce or eliminate a remanent-polarization of such region(s).

Figure 5D:
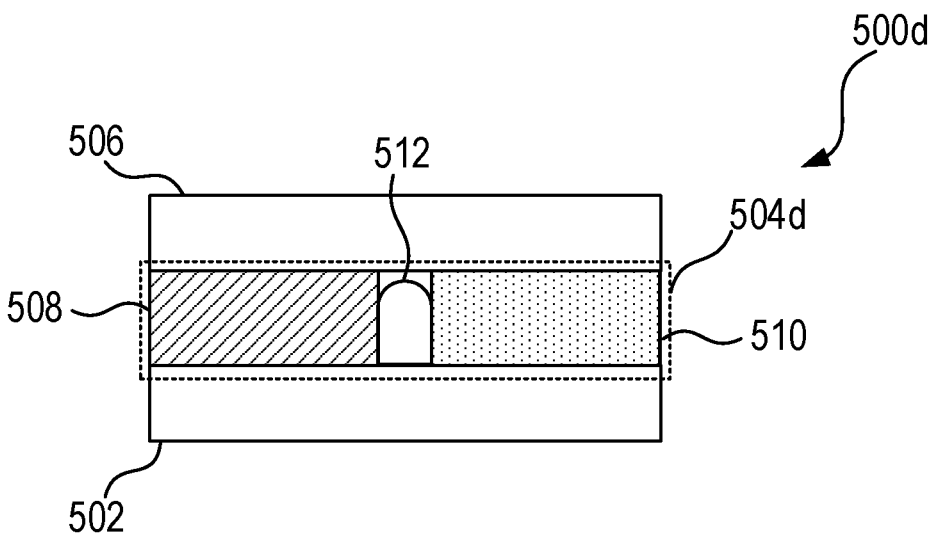
Figure 5E:
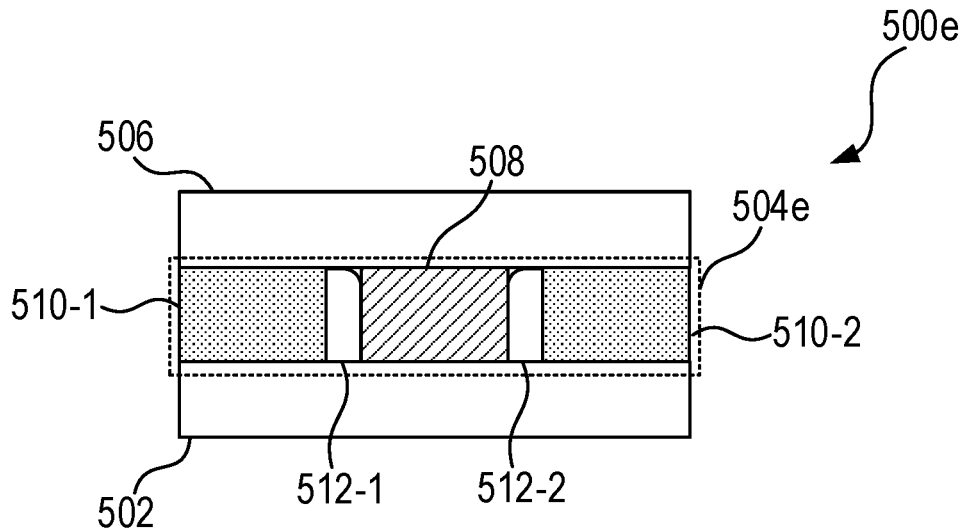

According to various aspects, as shown in FIG. 5D and FIG. 5E, the memory element 504d, 504e may include one or more separation structures 512 (also referred to herein as spacer structures) disposed between first and second regions 508, 510 that are adjacent to one another. The one or more separation structures 512 may provide separating (or distancing) a first region 508 from the adjacent second region(s) 510, and vice versa. Illustratively, in various aspects, as shown in FIG. 5A to FIG. 5C, a first region 508 may be in direct physical contact with the adjacent second region(s) 510. This configuration may provide for a simpler fabrication process, but may have the risk of an intermixing of the material of the first region 508 with the material of the second region 510 (depending on the type of material), which may thus lead to a degradation of the polarization properties of the memory element. The one or more separation structures 512 may reduce or prevent such intermixing.

As an exemplary configuration, as shown in FIG. 5D, the memory element 504d may include a (first) separation structure 512 disposed between a first region 508 and a second region 510. The separation structure 512 may be in direct physical contact with the first region 508 and with the second region 510, illustratively so that the first region 508 and the second region 510 are not in contact with each other.

The number of separation structures 512 may be adapted based on the number of regions 508, 510 into which the memory element is structured, e.g., so that at least one separation structure 512 is present between adjacent first and second regions 508, 510. As an exemplary configuration, as shown in FIG. 5E, in the case that the memory element 504e is structured to have a second region 510-1 on one side of a first region 508, and another second region 510-2 (also referred to herein as third region 510-2) on the other side of the first region 508, the memory element 504e may include a first separation structure 512-1 between the first region 508 and the second region 510-1, and a second separation structure 512-2 between the first region 508 and the other second region 510-2 (e.g., in direct physical contact with the first region 508 and the other second region 510-2).

According to various aspects, additionally or alternatively to the configurations described above, the different polarization properties of the first region(s) 508 and the second region(s) 510 may be provided by geometrical considerations during manufacturing of the memory element. As shown for example in FIG. 5F and FIG. 5G, a memory element 504f, 504g may include a first region 508f (or, in general, one or more first regions 508f) having a first height, and second region(s) 510 (e.g., a second region 510-1 and another second region 510-2) having a second height, with the second height different from the first height.

Figure 5F:
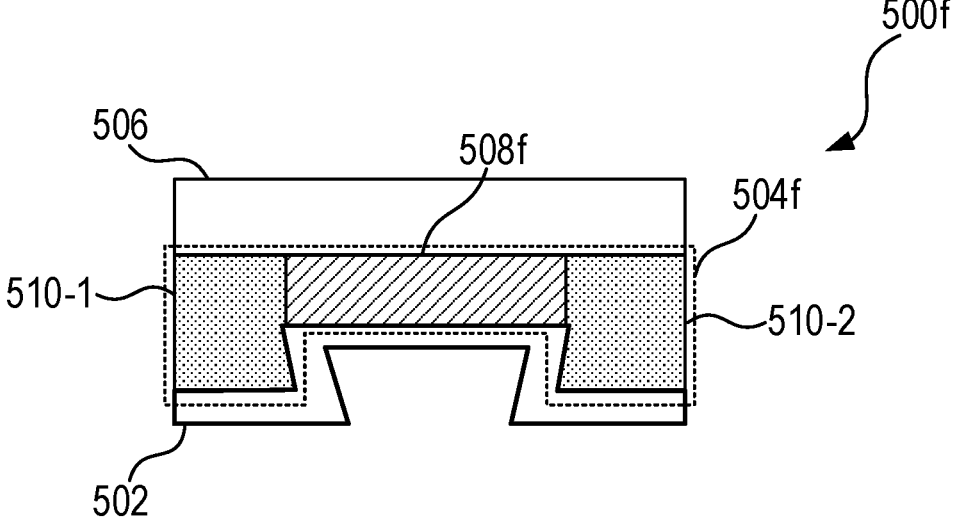

As an example, shown in FIG. 5F, the second height may be greater than the first height. During manufacturing of the memory element 504f, the different height of the first and second regions may provide that the first material of the first region(s) 508f crystallizes to reach a crystal structure providing spontaneous-polarization properties, whereas the second material of the second region(s) 510-1, 510-2 transition to an amorphous state (see also FIG. 9A to FIG. 9E). As an example, the second height may be at least two times greater than the first height, for example at least three times greater, for example at least five times greater.

In this configuration, one (or both) of the electrode layers of the memory structure 500f (e.g., the first electrode layer 502 in FIG. 5F) may be shaped according to the different height (illustratively, the different thickness) of the regions 508f, 510 of the memory element 504f. The electrode layers 502, 506 of the memory structure 500f may be less spaced from one another in correspondence of the first region(s) 508f than in correspondence of the second region(s) 510. As an example, as shown in FIG. 5F, the first electrode layer 502 may have a portion (e.g., one or more portions) in correspondence of the first region(s) 508f less spaced from the second electrode layer 506 with respect to a portion (e.g., one or more portions) of the first electrode layer 502 in correspondence of the second region(s) 510-1, 510-2. Illustratively, at least one or both of the first electrode layer 502 and/or the second electrode layer 506 may have one or more protrusions in correspondence of the one or more first region(s) 508f.

Figure 5G:
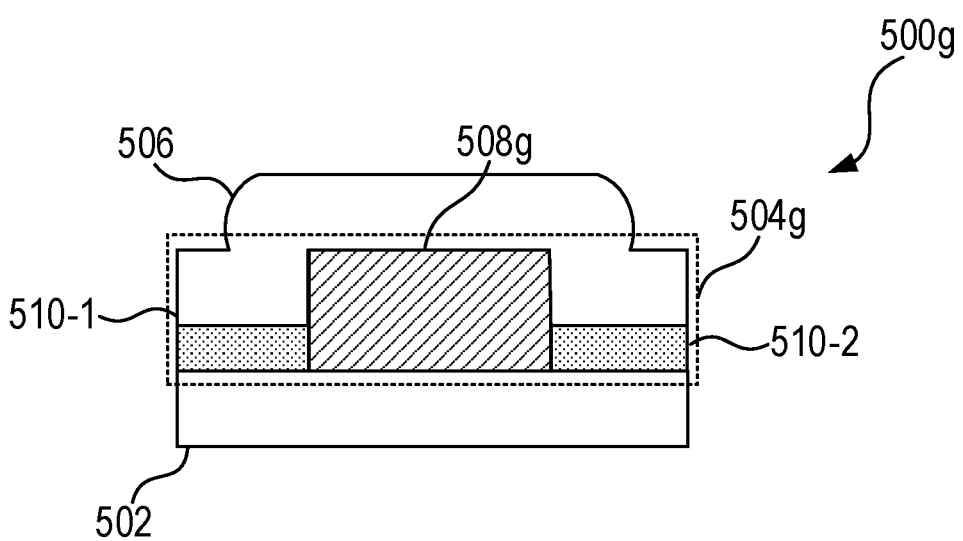

As an alternative approach, as shown for example in FIG. 5G, a memory element 504g may include a first region 508g (or, in general, one or more first regions 508g) having a first height, and second region(s) 510 (e.g., a second region 510-1 and another second region 510-2) having a second height, with the first height being greater than the second height. During manufacturing of the memory element 504g, the different height of the first and second regions may provide that the first material of the first region(s) 508g crystallizes, e.g., during annealing, to reach a crystal structure providing spontaneous-polarization properties, whereas the second material of the second region(s) 510-1, 510-2 transition to an amorphous state (see also FIG. 11A to FIG. 11D). As an example, the first height may be at least two times greater than the second height, for example at least three times greater, for example at least five times greater.

In this configuration, one (or both) of the electrode layers of the memory structure 500g (e.g., the second electrode layer 506 in FIG. 5G) may be shaped according to the different height (illustratively, the different thickness) of the regions 508, 510 of the memory element 504g. The electrode layers 502, 506 of the memory structure 500g may be more spaced from one another in correspondence of the first region(s) 508g than in correspondence of the second region(s) 510-1, 510-2. As an example, as shown in FIG. 5G, the second electrode layer 506 may have a portion (e.g., one or more portions) in correspondence of the first region(s) 508g more spaced from the first electrode layer 502 with respect to a portion (e.g., one or more portions) of the second electrode layer 506 in correspondence of the second region(s) 510-1, 510-2. Illustratively, at least one or both of the first electrode layer 502 and/or the second electrode layer 506 may have one or more recesses in correspondence of the one or more first region(s) 508g.

In the following, e.g., in relation to FIG. 6A to FIG. 6D, a structured memory element will be described in relation to a memory cell and a memory device.

Figure 6A:
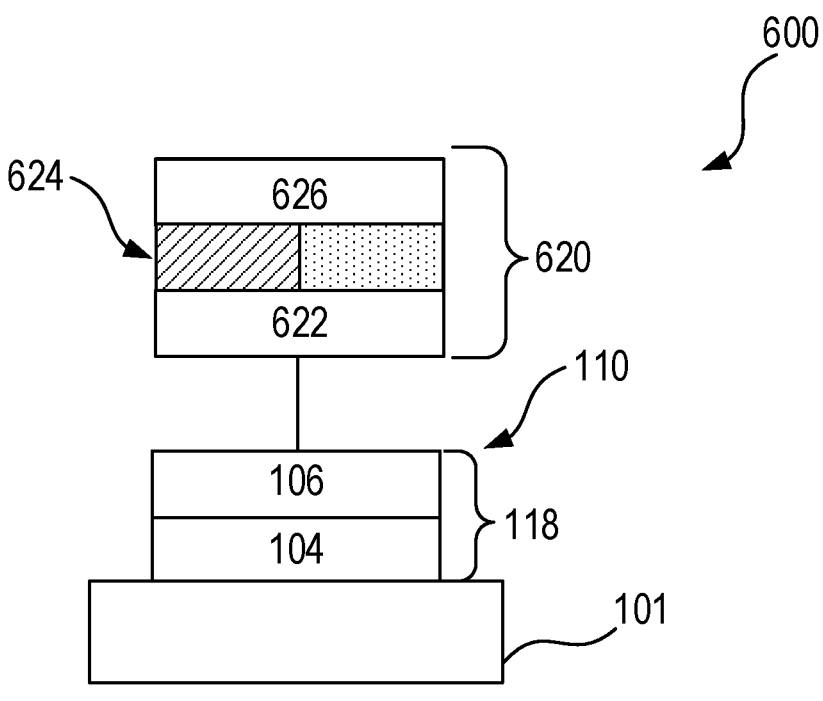
FIG. 6A to FIG. 6C show various aspects of a memory cell in a schematic representation.
Figure 6B:
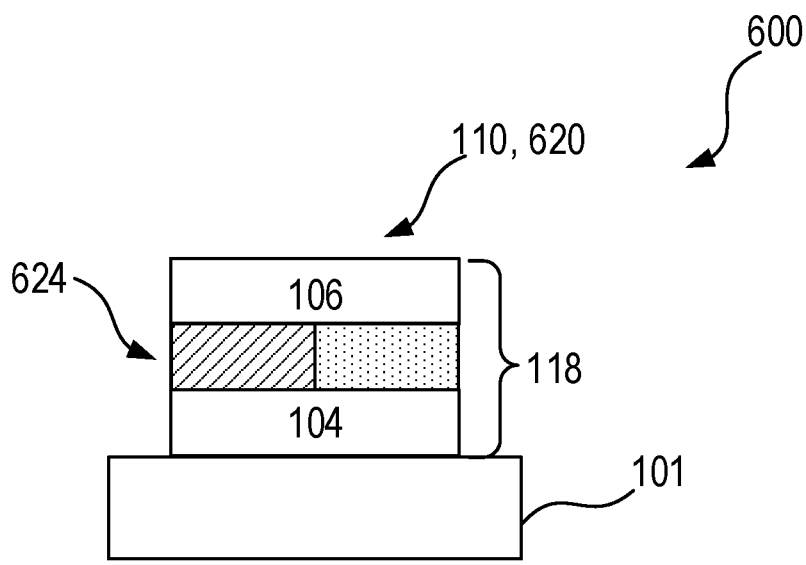

FIG. 6A and FIG. 6B show a memory cell 600 in a schematic view, according to various aspects. The memory cell 600 may be configured as discussed in relation to FIG. 1A and FIG. 1B, e.g., including a field-effect transistor structure 110 and a capacitive memory structure 620 configured to form a capacitive voltage divider. The capacitive memory structure 620 may be coupled to or integrated in the field-effect transistor structure 110. It is understood that the representation of the memory cell 600 may be simplified for the purpose of illustration, and the memory cell 600 may include additional components not shown in FIG. 6A and FIG. 6B, e.g., one or more separation layers, one or more contacts, etc.

The capacitive memory structure 620 may be configured as the capacitive memory structure 500a-500g described in relation to FIG. 5A to FIG. 5G. The capacitive memory structure 620 may include a first electrode layer 622, a second electrode layer 626, and a structured memory element 624 disposed between the first electrode layer 622 and the second electrode layer 626. The structured memory element 624 may be configured as the memory element 504a-504g described in relation to FIG. 5A to FIG. 5G, e.g., it is shown to include a first region and a second region but it is understood that it may be structured according to any suitable configuration as discussed above.

The configuration of the memory cell 600, e.g., the configuration of the capacitive memory structure 620, may provide a reduction of the depolarization field across the memory element 624, and thus improved retention capabilities of the memory cell 600. The field-effect transistor structure 110 and the capacitive memory structure 620 may be associated with a depolarization field across the memory element 624 (e.g., across the first, spontaneously-polarizable, region(s) of the memory element), and the structuring of the memory element 624 may provide that the depolarization field is reduced with respect to the depolarization field that the memory cell would have in absence of structuring.

Illustratively, an actual depolarization field value associated with the capacitive memory structure 620 may be defined by polarization characteristics of the first region(s) and the second region(s). The actual depolarization field value may be defined, for example, by the respective charge/voltage characteristic and capacitance/voltage characteristic of the first (partial) capacitance associated with first region(s) and of the second (partial) capacitance associated with second region(s) The actual depolarization field value may be less than a depolarization field value associated with the first region(s) defined by a material-specific polarization characteristic of the first material of the first region(s), e.g., less than the depolarization field value that would be associated with the capacitive memory structure 620 in case the memory element consisted only of the first material. The structuring may thus provide reducing the depolarization field that would be provided by the (intrinsic) material properties of the spontaneously-polarizable region(s) of the memory element 624.

Figure 6C:
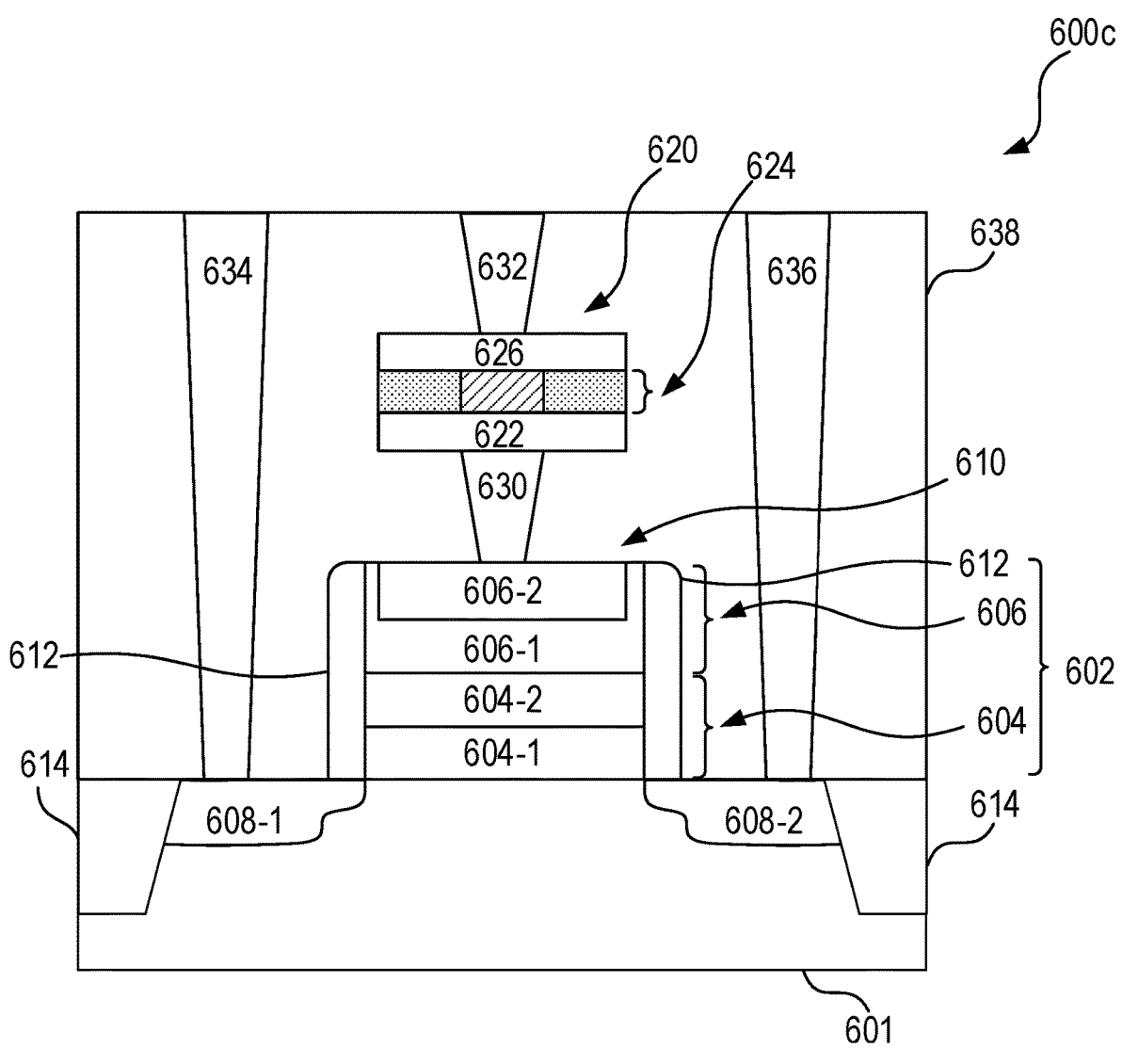

FIG. 6C illustrates schematically an integration scheme of a memory cell 600c. The memory cell 600c may be an exemplary realization of a memory cell including an adapted capacitive memory structure 620 coupled with or integrated in a field-effect transistor structure 610. It is understood that the aspects described in relation to the configuration of the memory cell 600c illustrated in FIG. 6C may apply in a corresponding manner to different configurations of the memory cell 600c (e.g., with a capacitive memory structure 620 integrated in the field-effect transistor structure 610, with a different structuring of the memory element 624, etc.). With the exception of the adapted capacitive memory structure 620, the integration scheme of the memory cell 600c may be configured as discussed in relation to the memory cell 130, 300 in FIG. 1C and FIG. 3A.

The memory cell 600c may include a field-effect transistor structure 610, e.g., configured as the field-effect transistor structure 310 in FIG. 3A. In brief, the field-effect transistor structure 610 may include a first source/drain region 608-1, a second source/drain region 608-2, and a gate stack 602 including a gate isolation 604 and a gate electrode 606. The gate isolation 604 may include one or more electrically insulating layers, e.g., a first electrically insulating layer 604-1 and a second electrically insulating layer 604-2 in the configuration in FIG. 6C. The gate electrode 606 may include one or more gate electrode layers, e.g., a first gate electrode layer 606-1 and a second gate electrode layer 606-2 in the configuration in FIG. 6C. The field-effect transistor structure 610 may be integrated in or over a semiconductor substrate 601, e.g., a silicon substrate. The field-effect transistor structure 610 may further include one or more separation structures 612 (spacer structures) disposed around the gate stack 602. The memory cell 600c may further include one or more substrate separation structures 614, e.g., one or more shallow trench isolation structures 614.

The capacitive memory structure 620 may be connected via first contact structure 630 to the gate electrode 606 of the field-effect transistor structure 610 (e.g., to the second gate electrode layer 606-2). Illustratively, the capacitor 624 may be connected to the underlying floating node (to the gate of the transistor 610). A second contact structure 632 may be connected to the other electrode layer of the capacitive memory structure 620, e.g., to the top electrode layer 626, to provide electrical access to the memory structure (illustratively, to the gate of the field-effect transistor structure 610). The memory cell 600c may include further (e.g., third and fourth) contact structures 634, 636 contacting the source/drain regions 608-1, 608-2, to provide electrical access to the source/drain regions 608-1, 608-2, e.g., for writing and reading the memory cell 600c.

The contact structures of the memory cell 600c, e.g., the first, second, third, fourth contact structures 630, 632, 634, 636 of the memory cell 600c may be embedded in (e.g., laterally surrounded by) an insulator layer 638 (in other words, an electrically insulating layer). The contact structures 630, 632, 634, 636 may include (e.g., may consist of) an electrically conductive material, for example a metal material (e.g., at least one metal layer), such as tungsten (W) or cobalt (Co), as examples, or any other conductive material (e.g., a metal alloy, a degenerate semiconductor, a polysilicon layer, etc.). In various aspects, the contact structures 630, 632, 634, 636 may be contact metals. The insulator layer 638 may include (e.g., may consist of) an electrically insulating material, for example a dielectric material, e.g., silicon oxide (SiO2), silicon nitride (SiNx), or any other electrically insulating material. The insulator layer 638 is illustrated in FIG. 6C as a single layer, however in some aspects the insulator layer 638 may be understood as a plurality of insulator layers.

Figure 6D:
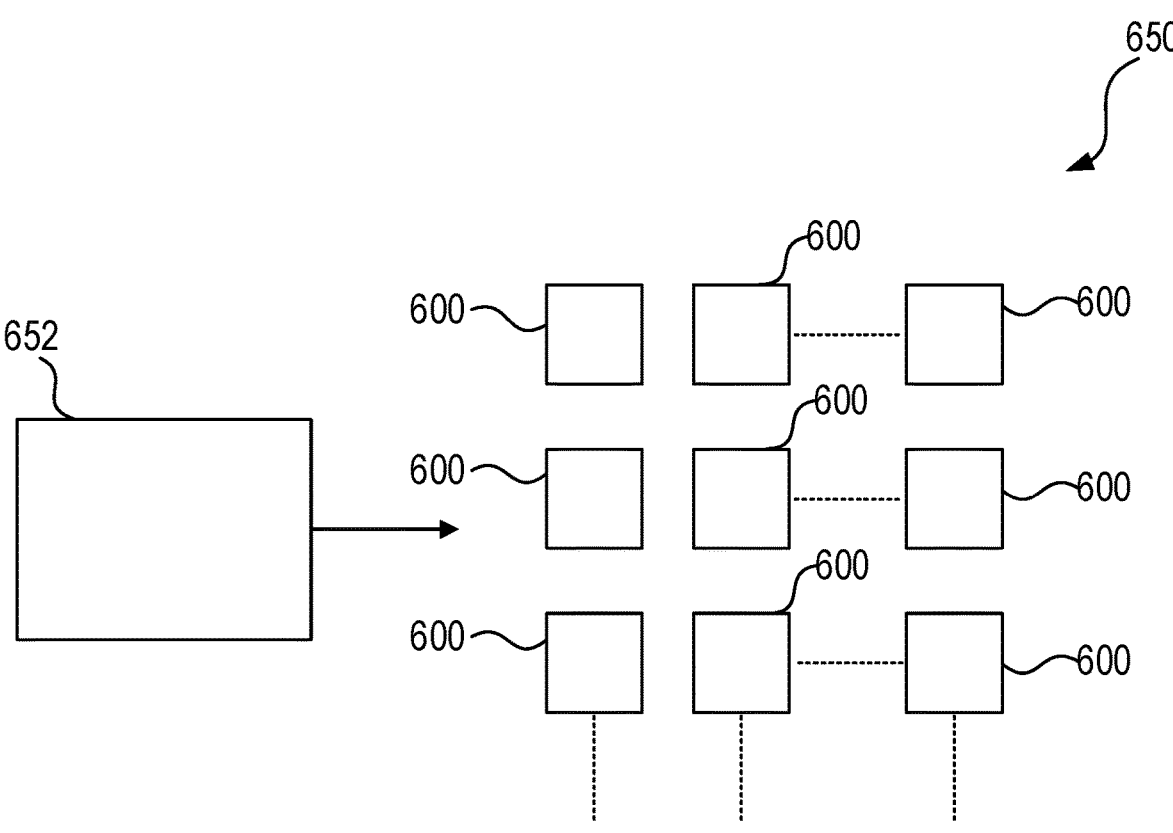
FIG. 6D shows various aspects of a memory device in a schematic representation.

FIG. 6D shows a memory device 650 in a schematic view according to various aspects. The memory device 650 may include a plurality of memory cells 600, illustratively a plurality of memory cells each having a memory element structured as described herein. Having a plurality of memory cells with an adapted capacitive memory structure ensures a reliable and stable operation of the memory device 650, e.g., without data loss or data corruption over time.

The memory device 650 may be or may include a memory cell arrangement, e.g., with the plurality of memory cells 600 disposed in a matrix-type arrangement, wherein columns and rows define the addressing of the memory cells according to the control lines connecting respectively subsets of memory cells of the memory cell arrangement along the rows and columns of the matrix-type arrangement. For example, the memory cells 600 may be arranged in a matrix architecture (A(n,m)) including columns, for example a number n of columns, and rows, for example a number m of rows, with n and m being integer numbers greater than one. In the matrix architecture, each memory cell may be connected to control-lines (e.g., to one or more word-lines, to a bit-line, and to a source-line), which may be used to supply voltages to the memory cells 600 for performing writing operations and readout operations. The matrix architecture may be, for example, referred to as "NOR" or "NAND" architecture, depending on the way neighboring memory cells are connected to each other.

The memory device 650 may include a memory controller 652 configured to operate (e.g., read and write) the memory cells 600. The memory controller 652 may be configured to provide one or more sets of voltage levels to operate the memory cells 600, e.g., via respective sets of control lines connected to the respective nodes of the memory cells 600. The memory cell 600 described herein may be used in connection with any type of suitable memory controller 652, e.g., a memory controller that may generate only two or only three different voltage levels for writing the memory cell 600 (e.g., for writing one or more memory cells 600 of a memory device 650). However, in other aspects, more than four different voltage levels may be used for operating (e.g., for reading) the memory cell 600 or for operating one or more memory cells 600 of a memory device 650.

In the following, with relation to FIG. 7 to FIG. 11D various methods will be described for providing a structured memory element. The methods discussed in the following provide for an efficient and readily implementable structuring in the context of memory cell fabrication (e.g., in the context of CMOS processing). It is however understood that also other approaches for structuring a memory element (with spontaneously-polarizable and non-spontaneously-polarizable regions) may be provided.

FIG. 7 shows a schematic flow diagram of a method 700 of forming a memory cell (e.g., the memory cell 600 described in relation to FIG. 6A to FIG. 6D). The method 700 may include a method 700b of forming a capacitive memory structure having a structured memory element (e.g., the capacitive memory structured 500a-500g, 620 described in relation to FIG. 5A to FIG. 6D). It is understood that the method 700 (and correspondingly the methods described in FIG. 8A to FIG. 11D) is described in relation to a memory cell but it may be applied to forming a memory device, e.g., to forming a plurality of memory cells (e.g., on a same semiconductor substrate).

The method 700 may include, in 710, forming a field-effect transistor structure (e.g., the field-effect transistor structure 110, 610). The field-effect transistor structure may be formed with techniques known in the art. As an example, forming the field-effect transistor structure may include: providing doped regions in a semiconductor substrate to form a first source/drain region and a second source/drain region (e.g., n-doping and p-doping a first region and a second region of a silicon wafer); forming (e.g., depositing or growing) one or more electrically insulating layer on the substrate, e.g., on the channel region defined by the source/drain regions, to provide a gate isolation; and forming (e.g., depositing or growing) one or more electrically conductive layers on the one or more electrically insulating layers, to provide a gate electrode.

The method 700 may include, in 720, forming a capacitive memory structure in such a way that the field-effect transistor structure and the capacitive memory structure are in a capacitive voltage divider configuration. The forming of the capacitive memory structure will be described in further detail in relation to the (sub-) method 700b. Forming the field-effect transistor structure and the capacitive memory structure in a capacitive voltage divider configuration may include connecting the capacitive memory structure with the field-effect transistor structure or integrating the capacitive memory structure in the field-effect transistor structure. As an example, the method 700 may include forming a contact structure (e.g., a contact metal, e.g., embedded in one or more insulator layers) connecting the gate electrode of the field-effect transistor structure with an electrode layer of the capacitive memory structure.

The method 700 may include a method 700b of forming the capacitive memory structure. The method 700b may include forming a first electrode layer (730b), forming a second electrode layer (750b), and forming a structured memory element including at least a first region extending from the first electrode layer to the second electrode layer and a second region extending from the first electrode layer to the second electrode layer (740b). Illustratively, the method 700b may include forming the electrode layers and the memory element in such a way that the structured memory element is disposed between the first electrode layer and the second electrode layer, e.g., with the first region in direct physical contact with the first electrode layer and the second electrode layer and with the second region in direct physical contact with the first electrode layer and the second electrode layer.

Forming the first and second electrode layers may include techniques known in the art (see also FIG. 8A to FIG. 11D), e.g., one or more layering and patterning processes. Forming the first and second electrode layers may include, for example, deposition or growth of one or more electrically conductive layers (e.g., including or consisting of an electrically conductive material, such as a metal, a degenerate semiconductor, and/or the like). The deposition or the growth of an electrode layer may be carried out with technologies known in the art, for example by means of sputtering, electron-beam evaporation, chemical vapor deposition, thermal vapor deposition, nucleation, and the like. In some aspects, the deposition or the growth of an electrode layer may be carried out in a vacuum chamber.

In some aspects, a mask may be used. A mask may include a material that serves for transferring a photo-lithography mask pattern into one or more material layers. A mask may include, for example, a positive or negative photo resist (also referred to as soft mask) or a hard mask (e.g., a hard mask layer). The photo resist itself may be patterned by standard lithography processes. The patterning of the hard mask material may include a combination of photo resist patterning followed by etch of the hard mask material (e.g., wet or dry chemical etching). However, any other suitable process may be used to transfer a desired pattern into one or more material layers.

Forming the structured memory element, 740b, may include forming a first region (or one or more first regions) with one or more first fabrication parameters, and forming a second region (or one or more second regions) with one or more second fabrication parameters. The one or more first fabrication parameters may differ from the one or more second fabrication parameters, so that a first region consisting of a first material (a first region with first material properties) and a second region consisting of a second material (a second region with second material properties) may be provided. The fabrication parameters may be adapted so that the one region may be a spontaneously-polarizable region and the other region may be a non-spontaneously-polarizable region (or less spontaneously-polarizable, e.g., may be a dielectric region). In various aspects, the fabrication parameters may be adapted so that the first material may differ from the second material in at least one of a chemical composition, a porosity, and/or a crystal structure.

Illustratively, forming the first region and the second region may be carried out with distinct processes. One of the first region or the second region may be formed and, subsequently, the other one of the first region or the second region may be formed. Stated in a different fashion, the method 700 may include, in 740b, forming the first region(s), and the method 700 may include forming the second region(s) prior to forming the first region(s) or after forming the first region(s), illustratively with separate (e.g., additional) fabrication steps.

As an exemplary configuration, forming the first region(s) of the memory element may include depositing the first material by a first deposition process. Forming the second region(s) of the memory element may include depositing the second material by a second deposition process different from the first deposition process. The first deposition process and the second deposition process may differ from one another to provide, e.g., a different crystal structure, a different chemical composition (e.g., a different doping), and/or a different porosity of the first material and the second material. The same aspects may apply to a first growth process for growing the first material and a second growth process for growing the second material. Illustratively, the structured memory element may be formed via at least two deposition (or growth) processes with different processing conditions to obtain the first region(s) and second region(s). The first material may have a different chemical composition with respect to the second material, or may have a same chemical composition as the second material and be deposited or grown in a manner that provides spontaneously-polarizable properties for one material and non-spontaneously-polarizable properties for the other material.

As another exemplary configuration, forming the first region(s) of the memory element and forming the second region(s) of the memory element may include depositing a material by a deposition process and partially modifying the material to thereby form the first region and the second region of the memory element. Illustratively, the method 700b may include forming a layer of a material already showing spontaneously-polarizable properties or capable of showing spontaneously-polarizable properties upon being suitably modified, and activating one or more portions of the material to induce spontaneously-polarizable properties in the one or more portions, and/or deactivating one or more other portions of the material to induce non-spontaneously-polarizable properties (e.g., an amorphous phase) in the one or more other portions.

The method 700b may include modifying the material of the layer to modify the material in one or more portions, to induce spontaneously-polarizable properties in the one or more portions (and leave the remaining portion(s) with non-spontaneously-polarizable properties), or to induce non-spontaneously-polarizable properties in the one or more portions (and leave the remaining portion(s) with spontaneously-polarizable properties), depending on the original properties of the material.

In the following, with relation to FIG. 8A to FIG. 11D, possible methods for forming the structured memory element, e.g., for forming the first region(s) and second region(s), will be described. The methods in FIG. 8A to FIG. 11D may be understood as methods of forming a capacitive memory structure with a structured memory element.

In the context of the fabrication methods described herein, the terms "first" and "second" in relation to the regions of the memory element may be used to indicate, in general, regions that have different spontaneous-polarization properties or regions that will have different spontaneous-polarization properties upon completion of a suitable modification of the material of the region. In this context, the terms "first" and "second" in relation to the regions of the memory element may be used without necessarily indicating a "first region" as a spontaneously-polarizable region, and a "second region" as a non-spontaneously-polarizable region. Illustratively, a "first region" formed with the methods described herein may be or become a spontaneously-polarizable region in case a corresponding "second region" is or becomes a non-spontaneously-polarizable region, or a "first region" formed with the methods described herein may be or become a non-spontaneously-polarizable region in case a corresponding "second region" is or becomes a spontaneously-polarizable region.

FIG. 8A to FIG. 8F show a method 800 of forming a structured memory element in a schematic view, according to various aspects. The method 800 may be an exemplary realization of the method 700, 700b described in relation to FIG. 7.

As shown in FIG. 8A, forming the first region(s) and the second region(s) of the memory element may include forming a layer of dielectric material 804 on an electrode layer 802 of the capacitive memory structure (directly on the electrode layer), e.g., the first electrode layer of the capacitive memory structure. Forming the layer of dielectric material 804 may include depositing or growing the layer of dielectric material (directly) on the electrode layer 802. The dielectric material may be or include a material in an amorphous state, e.g., may be a metal oxide (such as hafnium oxide or zirconium oxide) in an amorphous state. Illustratively, in the method 800 the deposition of bottom electrode material may be followed by the deposition of dielectric material. The dielectric material may be selected to match the device requirements (e.g., in terms of material type, thickness, dielectric constant etc.)

In the exemplary configuration in FIG. 8A, the electrode layer 802 is disposed on a contact structure 830 embedded in (e.g., laterally surrounded by) an insulator layer 832. It is however understood that the aspects described in relation to the method 800 may apply in a corresponding manner to a different arrangement of the electrode layer 802, e.g., integrated in a field-effect transistor structure as another example.

As shown in FIG. 8B, forming the first region(s) and the second region(s) may further include patterning the dielectric layer 804. Illustratively, the method 800 may include removing at least part of the layer of dielectric material 804 to provide a cavity 842 in which the spontaneously-polarizable region(s) of the memory element may be formed. It is understood that the method 800 may include forming a plurality of cavities in the dielectric layer 804, depending on the number of spontaneously-polarizable regions to be formed. The cavity 842 may expose the first electrode layer 802, illustratively may expose a portion of the electrode layer 802 on which the spontaneously-polarizable region(s) may be formed.

The patterning of the layer of dielectric material 804 may include, for example, depositing a hard mask material to provide a hard mask layer 840. As an example, the hard mask material may be or include silicon nitride. The patterning may further include depositing a photo resist, and carrying out a lithography process (e.g., a photolithography process) including a photo resist development and a hard mask etch to form a cavity in the hard mask layer 840. After forming the cavity (or a plurality of cavities) in the hard mask layer, the method may include removing the photo resist and etching the dielectric layer 804 (e.g., wet or dry chemical etching). The etching of the dielectric layer 804 may provide cavities in the dielectric layer 804 based on the pattern of cavities in the hard mask layer 840, as known in the art. In the exemplary configuration in FIG. 8B, the dielectric etching may provide a cavity 842 in the dielectric layer 804, which is patterned in a plurality of dielectric regions 804-1, 804-2, illustratively the non spontaneously-polarizable regions (e.g., the dielectric regions) of the structured memory element. In various aspects, the cavity created by hard mask patterning may be at minimum critical dimension that lithography can achieve in the given process level in which the capacitive memory structure (the capacitor) is integrated.

In various aspects, the method 800 may include forming one or more separation structures (one or more spacers) between the regions of the structured memory element. In other aspects (see FIG. 8F), the separation structures may be dispensed with, thus simplifying the overall fabrication process.

Figure 8C:
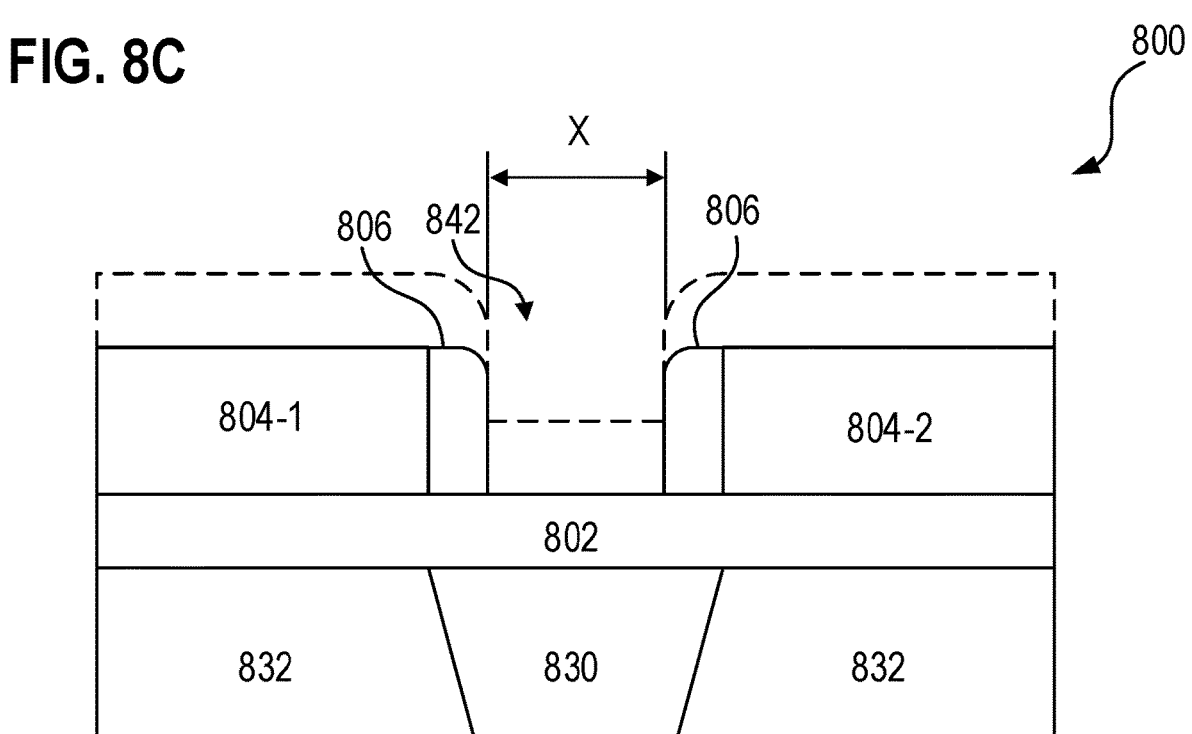

As shown in FIG. 8C, the method 800 may include forming a separation structure 806 between the first region(s) and the second region(s) of the memory element. Illustratively, the method 800 may include forming one or more separation structures 806 at the interface(s) between the patterned dielectric regions and the cavities in which the spontaneously-polarizable regions will be formed. Further illustratively, the method 800 may include forming the separation structure 806 (the one or more separation structures) prior to forming the spontaneously-polarizable regions, e.g., prior to forming a layer of spontaneously-polarizable material. The one or more separation structures 806 may include or consist of an electrically insulating material, e.g., an oxide or a nitride, for example silicon nitride.

With reference to FIG. 8C, the method 800 may include removing the hard mask layer 840, and forming (e.g., depositing) a separation film and patterning the separation film to conform to the cavity 842 in which the spontaneously-polarizable region will be formed. Illustratively, the method 800 may include a spacer film deposition and a spacer film recess. Forming the separation film may include, for example, a conformal deposition process, such as atomic layer deposition. As shown in FIG. 8C, the formation of the separation structure(s) 806 opens up a dimension X for the spontaneously-polarizable regions, which is smaller than lithographic limit in that given process area. The width of the separation structure(s) 806 (along the horizontal direction) may determine the final lateral dimension.

Figure 8D:
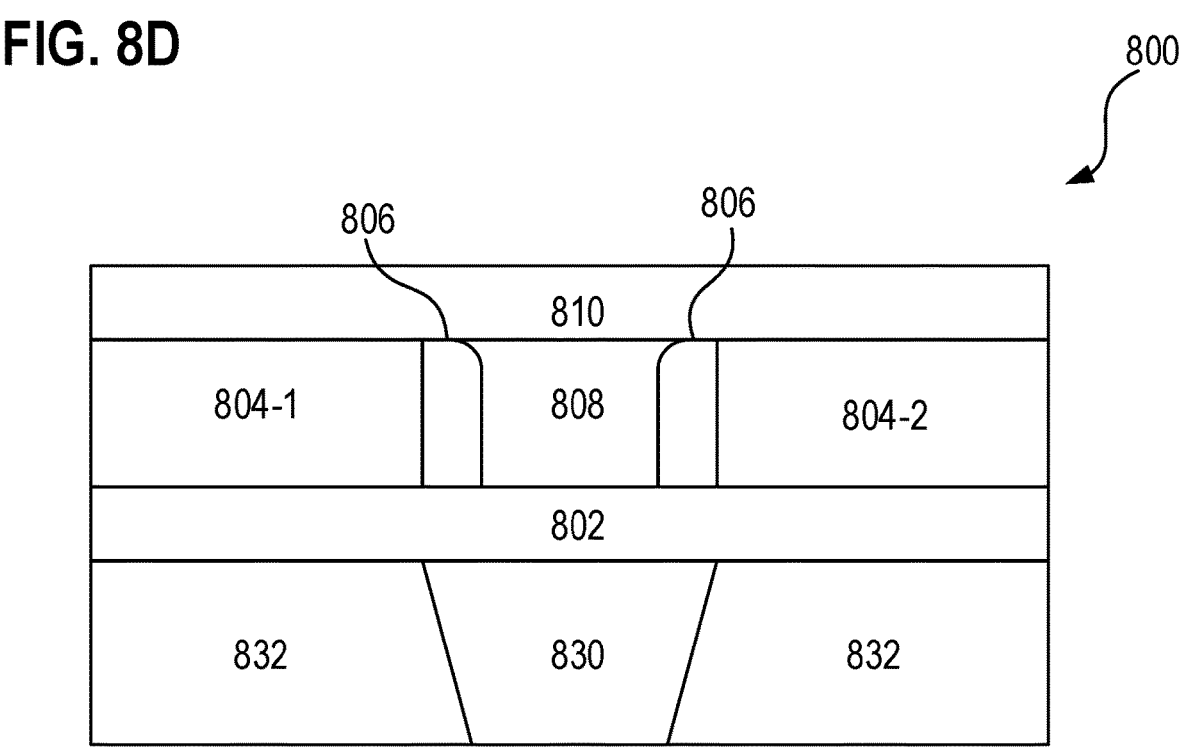

As shown in FIG. 8D, forming the structured memory element may further include forming a layer of spontaneously-polarizable material 808 in the cavity 842, on the first electrode layer 802 to provide the spontaneously-polarizable region(s) of the memory element. Forming the layer of spontaneously-polarizable material 808 may include depositing or growing the spontaneously polarizable material in the cavity 842 (e.g., in each cavity) in the dielectric layer 804. The deposited or grown material may be already spontaneously-polarizable (e.g., may be already crystalline), or may be deposited or grown as amorphous material and the brought into a spontaneously-polarizable state, depending on the deposition process or growth process. For example, may be deposited as amorphous material and then an annealing step may be performed to induce crystallization of the amorphous material.

The remaining (non-removed) part(s) of the layer of dielectric material 804 may provide the non-spontaneously polarizable (e.g., dielectric) region(s) of the memory element, e.g., two regions 804-1, 804-2 in the exemplary configuration in FIG. 8A to FIG. 8F.

With reference to FIG. 8D, the method 800 may further include polishing (e.g., performing a chemical-mechanical polishing) of the layer of spontaneously-polarizable material 808, and forming the (second, e.g., top) electrode layer 810 of the capacitive memory structure. Optionally, after forming the second electrode layer 810, the method 800 may include an annealing of the stack to further stabilize the structure.

Figure 8E:
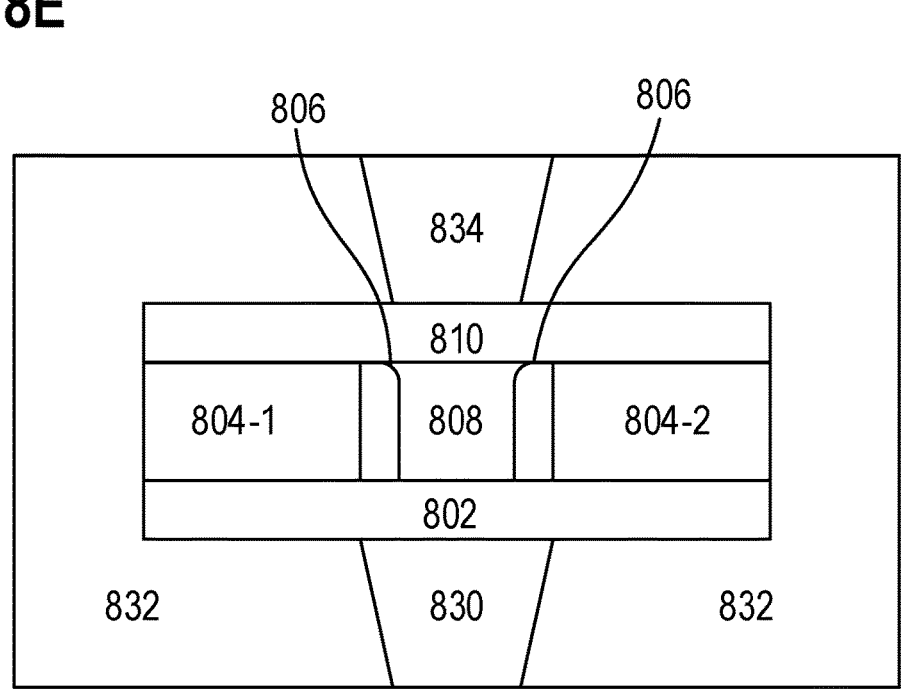
Figure 8F:
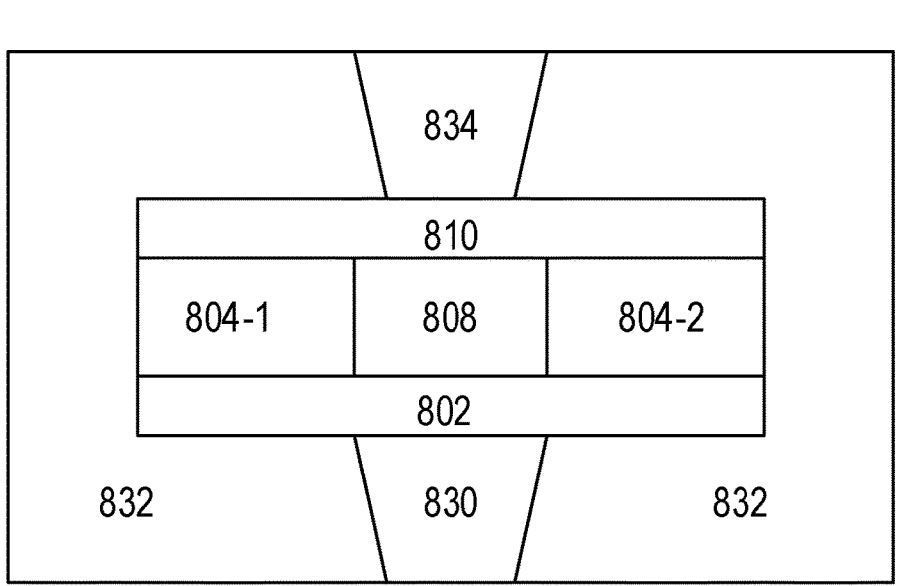

As final processing steps, as shown in FIG. 8E, the method 800 may include further polishing, layering and patterning steps, e.g., as part of the integration scheme of the capacitive memory structure. Illustratively, the method 800 may include forming a (second) contact structure 834 to contact the second (top) electrode layer 810 of the capacitive memory structure, and forming further insulation layer 832 to embed the contact structure 834. Illustratively, the method 800 may include a contact formation for forming contacts to the capacitive memory structure. In various aspects, not shown, the method may include depositing additional liners for stack encapsulation.

As described above, and as shown in FIG. 8F, the capacitive memory structure may also be provided without the one or more separation structures 806, e.g., with spontaneously-polarizable region(s) 808 and non-spontaneously-polarizable region(s) 804-1, 804-2 in contact with one another, which may simplify the fabrication process.

FIG. 9A to FIG. 9E show a method 900 of forming a structured memory element in a schematic view, according to various aspects. The method 900 may be an exemplary realization of the method 700, 700b described in relation to FIG. 7. The aspects described in relation to the method 900 may be combined with the aspects described in relation to the method 800 in FIG. 8A to FIG. 8F, e.g., in addition or in alternative. By way of illustration, the method 900 may be adapted to provide a memory element with regions having different height, which may induce the formation of different phases in the different regions (e.g., a crystal phase in the regions that will be spontaneously-polarizable, and an amorphous phase in the regions that will not be spontaneously-polarizable).

As shown in FIG. 9A and FIG. 9B, the method 900 may include forming a contact structure 902 (e.g., the contact metal) to connect to an electrode layer (the first, bottom, electrode layer) of the capacitive memory structure. The contact structure 902 may be embedded in one or more insulator layers 904. The method 900 may further include forming a recess in the one or more insulator layers 904 (e.g., a recess dielectric). The formation of the recesses may provide adapting the structure of the capacitive memory structure to have regions of the memory element with varying height (illustratively, varying thickness). The amount of dielectric recess may be selected to provide a desired height difference between the regions of the memory element. The recess may be formed, for example, via masking and etching of the one or more insulator layers 904. It is understood that the patterning of the dielectric may be adapted to provide a plurality of recesses, depending on the number of first and second regions to be provided in the memory element.

As shown in FIG. 9C, the method 900 may further include forming the (first, bottom) electrode layer 906 of the capacitive memory structure. The electrode layer 906 may be formed to adapt to the shape of the contact structure 902 and insulator layer(s) 904, e.g., to have a shape with one or more recessed regions. The method may further include forming a forming a layer of a base material 908 on the first electrode layer 906 (e.g., directly on the first electrode layer 906). The base material may already have spontaneously-polarizable properties or may be capable of having spontaneously-polarizable properties upon a suitable modification, e.g., may be formed already having spontaneously-polarizable properties or may be formed having an amorphous structure for subsequent crystallization. As an example, the base material of the layer 908 may have spontaneously-polarizable properties in case the material has a crystal structure and may have non-spontaneously-polarizable properties in case the material has an amorphous structure.

Forming the layer of base material 908 may include depositing or growing the material in the recesses of the one or more insulator layers 904. The shaping of the underlying electrode layer 906 and insulator layer 904 provides having a layer of base material 908 with varying height (e.g., after polishing). By way of illustration, the method 900, e.g., forming the structured memory element, may include forming a layer of base material 908 on the (first) electrode layer 906 in such a way that the layer of base material 908 has at least a first portion having a first height and a second portion having a second height (e.g., one or more first portions having the first height, and one or more second portions having the second height). The second height may be different from the first height.

The varying height (the varying thickness) of the layer of base material 908 may provide achieving the formation of regions with different polarization properties. Illustratively, the method 900 (and similarly the method 1100 described below) may include inducing a crystallization of the layer of the base material 908 to obtain or maintain spontaneously-polarizable properties in the base material of the first portion and to obtain or maintain non-spontaneously-polarizable properties in the base material of the second portion.

The second height may be greater than the first height in such a way that upon crystallization of the base material, the first portion provides the spontaneously-polarizable region of the memory element (with a spontaneously-polarizable crystal structure) and the second portion provides the non-spontaneously-polarizable region of the memory element (with an amorphous structure). In the configuration in FIG.

9D two non-spontaneously-polarizable regions 910-1, 910-2 may be formed, but it is understood that the method may correspondingly apply to the formation of more than two non spontaneously-polarizable regions. Illustratively, during crystallization the thicker areas of the layer 908 transform into a non-polarizable layer since the crystal phase transforms (e.g., into an amorphous state). As an example, the crystallization may be induced by annealing the layer of base material 908. The annealing may alternatively be performed prior to stack patterning, but this may result in a more complicated patterning of the stack when the stack is fully crystallized. As another example, the deposited or grown base material may be already spontaneously-polarizable (e.g., may be already crystalline), depending on the deposition process or growth process, and the formation of the thinner portions leads to these portions transitioning into an amorphous structure.

Figures 9D, 9E:
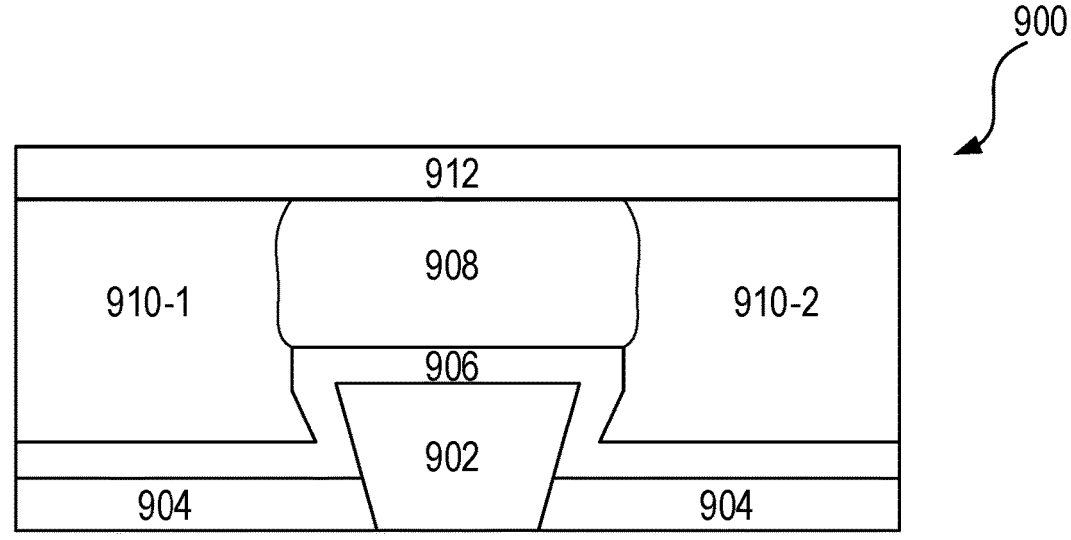

As shown in FIG. 9D, the method 900 may further include polishing the memory element (the layer now patterned in first region(s) 908 and second region(s) 910), and forming the second (top) electrode layer 912 of the capacitive memory structure.

As shown in FIG. 9E, the method 900 may further include completing the contacting and the embedding of the capacitive memory structure, e.g., by forming further insulator layers 904.

FIG. 10A to FIG. 10D show a method 1000 of forming a structured memory element in a schematic view, according to various aspects. The method 1000 may be an exemplary realization of the method 700, 700b described in relation to FIG. 7. The aspects described in relation to the method 1000 may be combined with the aspects described in relation to the method 800, 900 in FIG. 8A to FIG. 9D, e.g., in addition or in alternative. By way of illustration, the method 1000 may be adapted to provide a memory element with regions having different concentrations of dopant elements, which may provide having regions with different polarization properties.

Figure 10A:
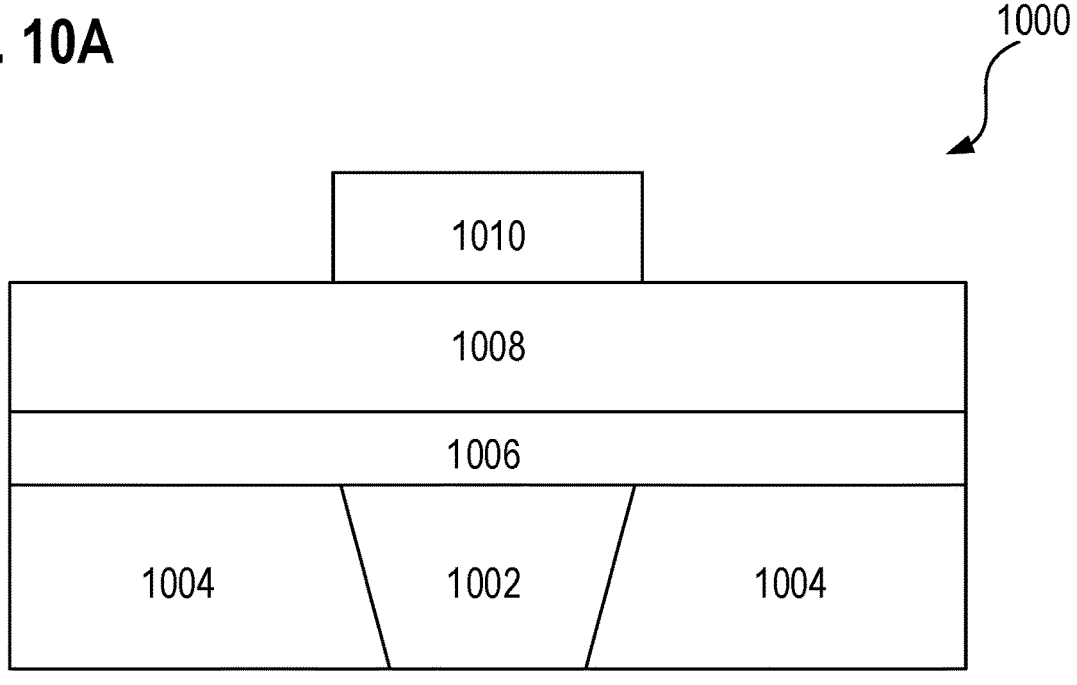
FIG. 10A to FIG. 10D show various aspects of a method of forming a capacitive memory structure in a schematic representation.

As shown in FIG. 10A, forming the first region and the second region of the memory element may include forming a layer of base material 1008 on an electrode layer 1006 of the capacitive memory structure, e.g., the first electrode layer of the capacitive memory structure (e.g., directly on the first electrode layer). Forming the layer of base material 1008 may include depositing or growing the base material. The deposited or grown base material may be already spontaneously-polarizable (e.g., may be already crystalline), or may be deposited or grown as amorphous material and the brought into a spontaneously-polarizable state, depending on the deposition process or growth process. Illustratively, the base material may already have spontaneous-polarization properties, or may be capable of having spontaneous-polarization properties upon suitable modification.

In the exemplary configuration in FIG. 10A, the electrode layer 1006 is disposed on a contact structure 1002 embedded in (e.g., laterally surrounded by) an insulator layer 1004. It is however understood that the aspects described in relation to the method 1000 may apply in a corresponding manner to a different arrangement of the electrode layer 1006, e.g., integrated in a field-effect transistor structure as another example.

Figure 10B:
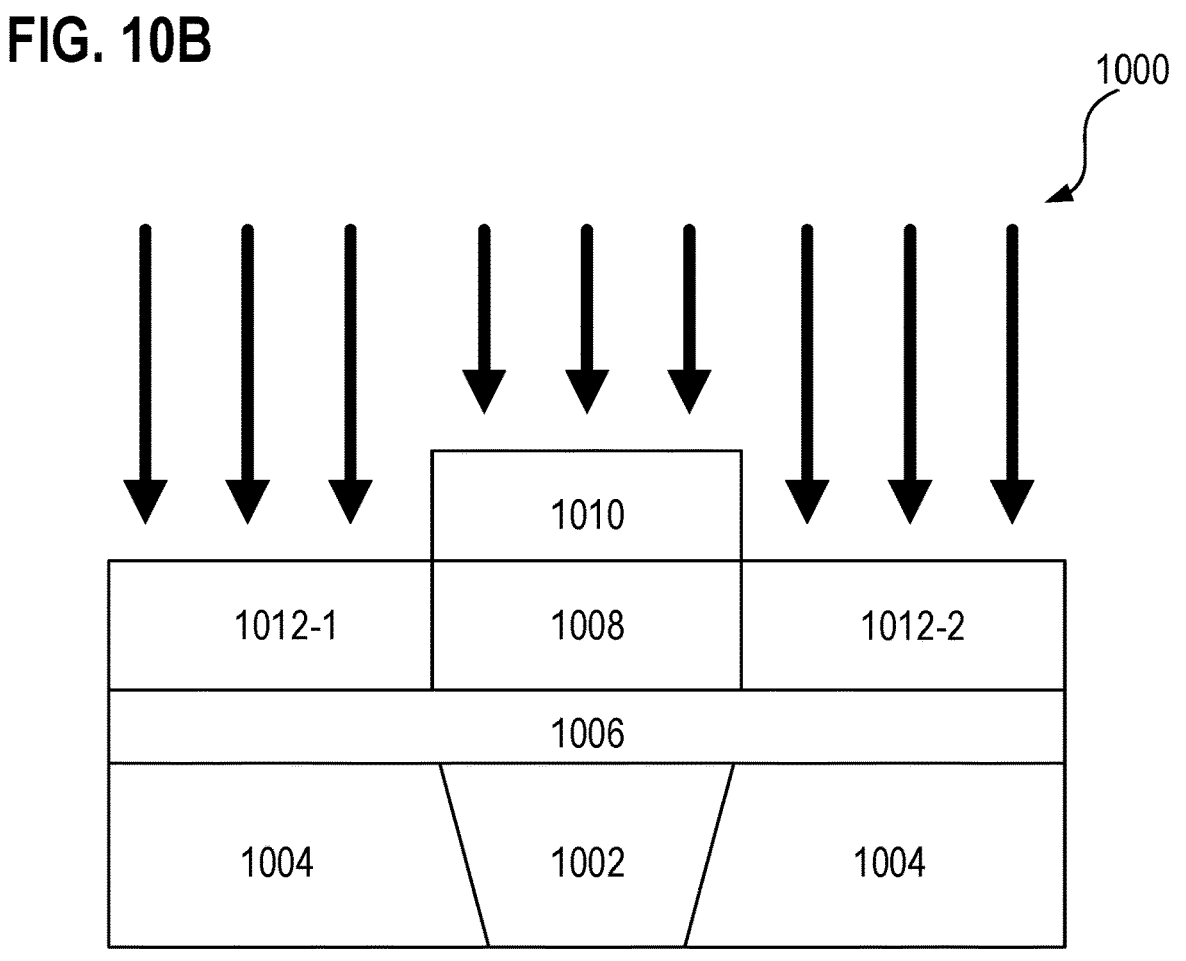

As shown in FIG. 10A and FIG. 10B, forming the structured memory element may further include introducing one or more dopant elements in at least a portion of the layer of base material 1008 to alter the polarization properties of the base material 1008, e.g., to provide the spontaneously polarizable regions and non-spontaneously-polarizable region(s) of the memory element.

As an exemplary implementation, the method 1000 may include depositing a hard mask material to provide a hard mask layer 1010. As an example, the hard mask material may be or include silicon nitride. The method 1000 may further include lithography and patterning of the hard mask layer 1010. Illustratively, the hard mask layer 1010 may be patterned based on where the dopant elements are to be introduced in the layer of base material 1008, e.g., the hard mask layer 1010 may be patterned to expose the portion(s) of the layer of base material 1008 where the dopant elements are to be introduced.

As shown in FIG. 10B, as an example, introducing one or more dopant elements in the layer of base material 1008 may include performing an implantation (targeted to the exposed portions of the layer 1008). Considering the base material as being spontaneously-polarizable, the implantation of dopant elements may provide modifying the crystal structure of the material of at least a portion of the layer 1008 such that it turns into a non-spontaneously polarizable material (e.g., a simple dielectric material). Illustratively, the implantation may modify (e.g., destroy) the crystal structure of the spontaneously-polarizable material (due to energetic impact) in the portion; alternatively, more dopant elements may be incorporated via the implantation in the (e.g., outer) regions therefore preventing the formation of the spontaneously-polarizable crystal phase. The method 1000 may thus illustratively include introducing one or more dopant elements in at least a portion of the layer of base material 1008 to modify the crystal structure of the portion. The modification may provide that a spontaneously-polarizable region of the layer of base 1008 has a first concentration of dopant elements and a non-spontaneously-polarizable region of the layer of base material 1008 has a second concentration of dopant elements greater than the first concentration. In FIG. 10B the formation of two non spontaneously-polarizable regions 1012-1, 1012-2 is shown, but it is understood that the method 1000 may be correspondingly applied to the formation of more than two second regions.

Figure 10C:
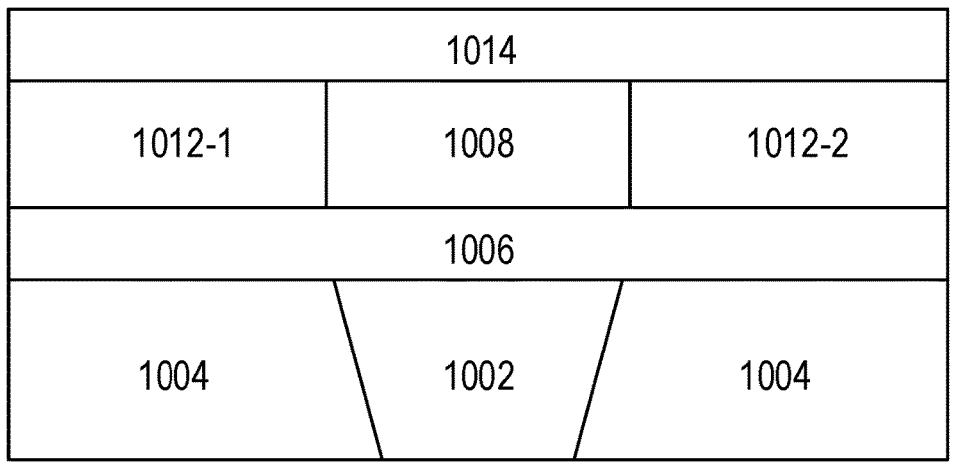
Figure 10D:
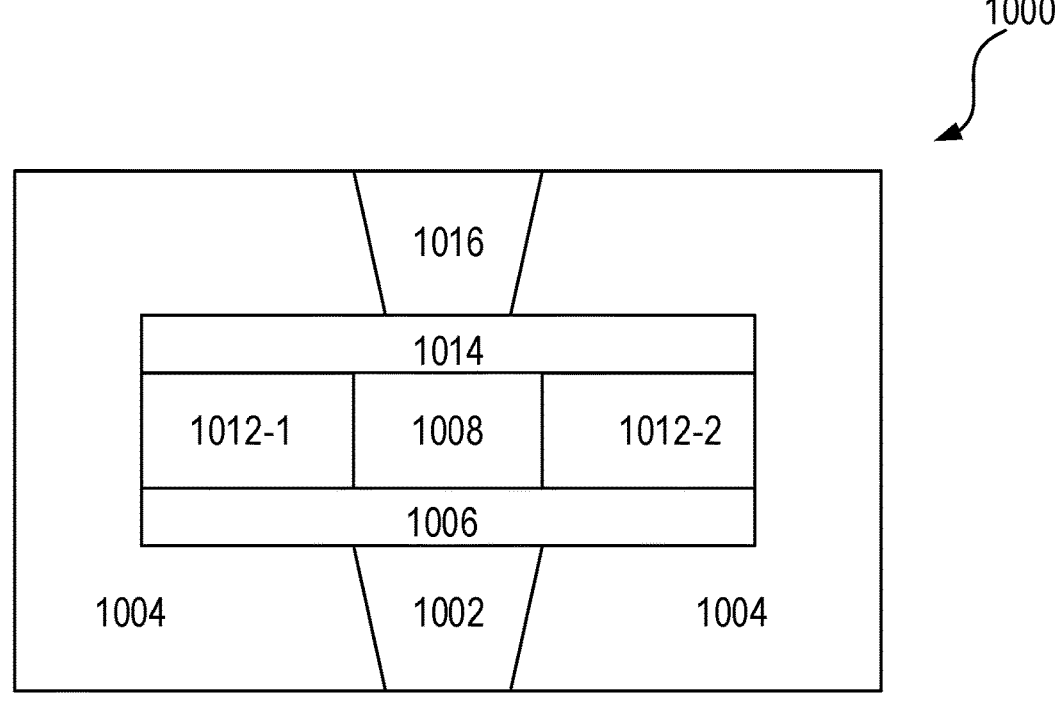

With reference to FIG. 10C and FIG. 10D, the method 1000 may further include removing the hard mask layer 1010, and forming the (second, e.g., top) electrode layer 1014 of the capacitive memory structure. Optionally, after forming the second electrode layer 1014, the method 1000 may include an annealing of the stack to further stabilize the structure.

As final processing steps, as shown in FIG. 10D, the method 1000 may include further polishing, layering and patterning steps, e.g., as part of the integration scheme of the capacitive memory structure. Illustratively, the method 1000 may include forming a (second) contact structure 1016 to contact the second (top) electrode layer 1014 of the capacitive memory structure and forming further insulation layer 1004 to embed the contact structure 1016.

As an alternative configuration of the method 1000, a layer of dielectric material (e.g., with an amorphous structure) may be initially formed, and dopant elements may be implanted in one or more portions of the dielectric layer at a concentration that provides spontaneously-polarizable properties for such one or more portions (to provide the one or more spontaneously-polarizable regions).

FIG. 11A to FIG. 11D show a method 1100 of forming a structured memory element in a schematic view, according to various aspects. The method 1100 may be an exemplary realization of the method 700, 700b described in relation to FIG. 7. The aspects described in relation to the method 1100 may be combined with the aspects described in relation to the method 800, 900, 1000 in FIG. 8A to FIG. 10D, e.g., in addition or in alternative. By way of illustration, the method 1100 may be adapted to provide a memory element with regions having different height, which may induce the formation of different phases in the different regions (e.g., a crystal phase in the regions that will be spontaneously-polarizable, and an amorphous phase in the regions that will not be spontaneously-polarizable).

Figure 11A:
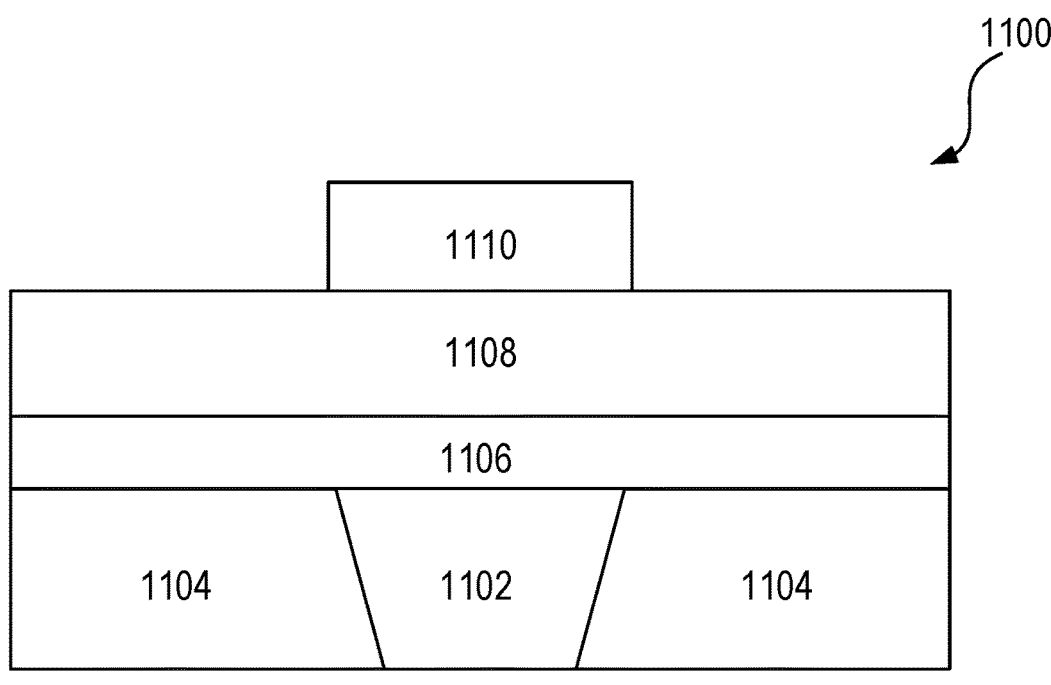
FIG. 11A to FIG. 11D show various aspects of a method of forming a capacitive memory structure in a schematic representation.

As shown in FIG. 11A, forming a structured memory element may include forming a layer of spontaneously-polarizable material 1108 on an electrode layer 1106 of the capacitive memory structure, e.g., the first electrode layer of the capacitive memory structure (e.g., directly on the first electrode layer of the capacitive memory structure). Forming the layer of spontaneously-polarizable material 1108 may include depositing or growing the spontaneously polarizable material. The deposited or grown material may be already spontaneously-polarizable (e.g., may be already crystalline), or may be deposited or grown as amorphous material and the brought into a spontaneously-polarizable state, depending on the deposition process or growth process.

In the exemplary configuration in FIG. 11A, the electrode layer 1106 is disposed on a contact structure 1102 embedded in (e.g., laterally surrounded by) an insulator layer 1104. It is however understood that the aspects described in relation to the method 1100 may apply in a corresponding manner to a different arrangement of the electrode layer 1106, e.g., integrated in a field-effect transistor structure as another example.

Figure 11B:
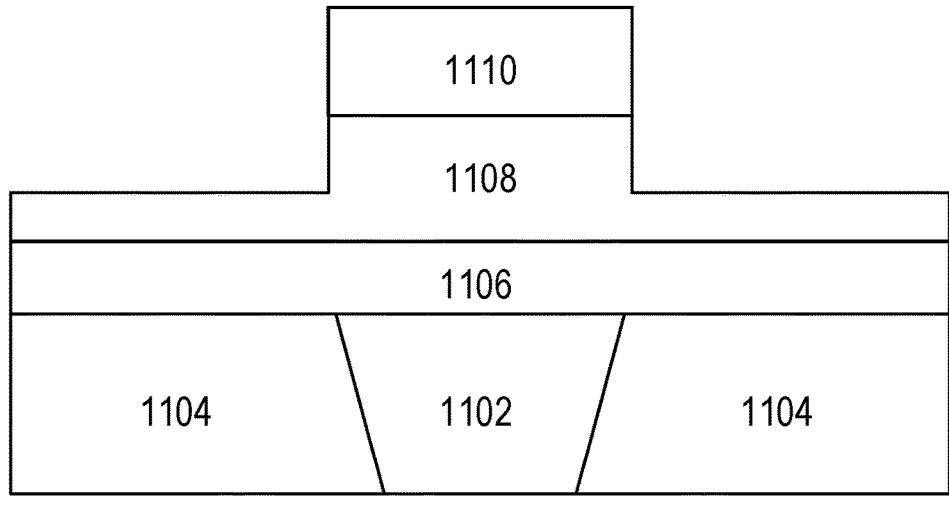

As shown in FIG. 11A and FIG. 11B, the method 1100 may include forming a layer of spontaneously-polarizable material 1108 on the first electrode layer 1106 in such a way that the layer of spontaneously-polarizable material 1108 has at least a first portion having a first height and a second portion having a second height. The first height may be greater than the second height, in such a way that upon crystallization the portion(s) having the first height may provide the spontaneously-polarizable region(s) of the memory element (with a spontaneously-polarizable crystal structure), and the portion(s) having the second height may provide the non spontaneously-polarizable region(s) of the memory element (with an amorphous structure).

As an exemplary implementation, the method 1100 may include patterning the layer of spontaneously-polarizable material 1108, e.g., to provide one or more recessed portions of the layer 1108. The method 1100 may include depositing a hard mask material to provide a hard mask layer 1110. As an example, the hard mask material may be or include silicon nitride. The method 1100 may further include lithography and patterning of the hard mask layer 1110. Illustratively, the hard mask layer 1110 may be patterned based on where the recesses are to be formed in the spontaneously-polarizable layer 1108, e.g., the hard mask layer 1110 may be patterned to exposed the portion(s) of the layer of spontaneously-polarizable material 1108 which are to be partially removed (e.g., partially etched) to reduce the height of the spontaneously-polarizable layer 1108 in such portion (s). The spontaneously-polarizable layer 1008 may be etched back to provide portions with smaller height. The amount of etched back portions may be selected to provide a desired height difference between the regions of the memory element. It is understood that the patterning of the spontaneously-polarizable layer 1108 may be adapted to provide a plurality of recessed portions, depending on the number of first and second regions to be provided in the memory element.

By way of illustration, the method 1100, e.g., forming the structured memory element, may include forming a layer of spontaneously-polarizable material 1108 on the (first) electrode layer 1106 in such a way that the layer of spontaneously-polarizable material 1108 has at least a first portion having a first height and a second portion having a second height (e.g., one or more first portions having the first height, and one or more second portions having the second height).

Figures 11C, 11D:
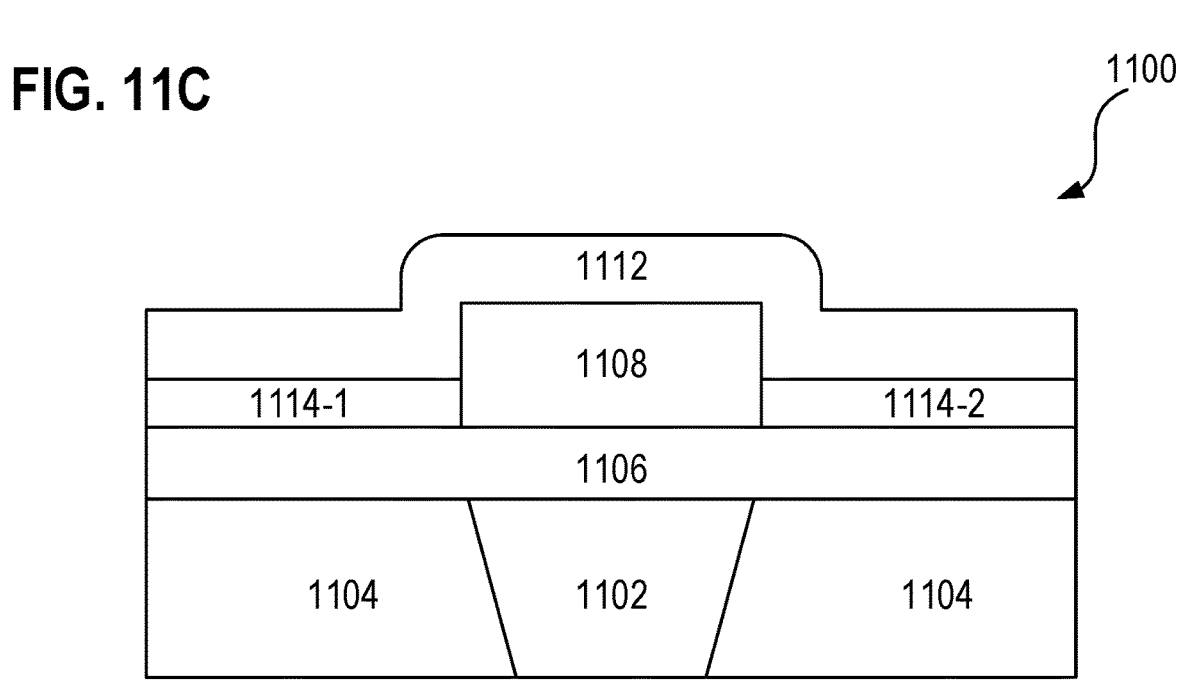

With reference to FIG. 11C, the method 1100 may further include removing the hard mask layer 1100, and forming the (second, e.g., top) electrode layer 1112 of the capacitive memory structure. The second electrode layer 1112 may be formed to adapt to the shape of the spontaneously-polarizable layer 1008, e.g., to have a shape with one or more recessed regions.

The method 1100 may further include inducing a crystallization (e.g., via annealing) of the layer to obtain or maintain spontaneously-polarizable properties in the first portion and to obtain or maintain non-spontaneously-polarizable properties in the second portion. The method 1100 may further include annealing the capacitive memory structure, e.g., annealing the layer of spontaneously-polarizable material 1108. In this configuration, the second height (of the second portion(s)) may be less than the first height (of the first portion(s)) in such a way that upon annealing the first portion provides the spontaneously-polarizable region of the memory element and the second portion(s) provides the non-spontaneously-polarizable region of the memory element. Illustratively, the thinner regions of the layer of spontaneously-polarizable material lose their spontaneous-polarization properties upon annealing, e.g., due to a disruption of their crystal structure induced by the annealing.

In the configuration in FIG. 11C two non-spontaneously-polarizable regions 1114-1, 1114-2 may be formed, but it is understood that the method may correspondingly apply to the formation of more than two non spontaneously-polarizable regions. Illustratively, during annealing the thinner areas of the spontaneously-polarizable layer 1108 transform into non-polarizable layer since the crystal phase transforms (e.g., into an amorphous state).

As final processing steps, as shown in FIG. 11D, the method 1100 may include further polishing, layering and patterning steps, e.g., as part of the integration scheme of the capacitive memory structure. Illustratively, the method 1100 may include forming a (second) contact structure 1116 to contact the second (top) electrode layer 1112 of the capacitive memory structure, and forming further insulation layer 1104 to embed the contact structure 1116.

As an additional or alternative approach, not shown, a method may include forming a layer of spontaneously-polarizable material on the first electrode layer of the capacitive memory structure, and processing the layer of spontaneously-polarizable material to induce the formation of voids in at least a portion of the layer. The formation of voids may be configured to increase a porosity of the portion of the layer, to bring such portion in a state that does not show (substantial) spontaneous polarization.

In the following, various examples are provided that refer to the memory cell 600, the capacitive memory structure 500a-500g, the memory device 650, and the methods 700, 700b, 800, 900, 1000, 1100. It is understood that the examples related to the devices may correspondingly apply to the methods, and vice versa.

Example 1 is a memory cell including: a field-effect transistor structure; and a capacitive memory structure; wherein the field-effect transistor structure and the capacitive memory structure are configured to form a capacitive voltage divider; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region consists of a first material, wherein the second region consists of a second material, and wherein the first material is different from the second material.

In Example 2, the memory cell according to example 1, may optionally further include that the first material differs from the second material in at least one of a chemical composition, a porosity, and/or a crystal structure.

In Example 3, the memory cell according to example 1 or 2, may optionally further include that the first material includes a spontaneously-polarizable material, and the second region is substantially free of a spontaneously-polarizable material.

According to various aspects, the first material may have a spontaneously-polarizable crystal structure, and the second material may have an amorphous structure.

In Example 4, the memory cell according to any one of examples 1 to 3, may optionally further include that first material includes a base material having a first concentration of dopant elements, and that the second material includes the base material having a second concentration of dopant elements different from the first concentration of dopant elements or that the second material includes the base material having substantially no dopant elements.

In Example 5, the memory cell according to any one of examples 1 to 4, may optionally further include that the first region consists of a spontaneously-polarizable material, and that the second region consists of a dielectric material.

In Example 6, the memory cell according to any one of examples 1 to 5, may optionally further include that the first region includes (e.g., consists of) a first metal oxide, that the second region includes (e.g., consists of) a second metal oxide, and that the first metal oxide differs from the second metal oxide in at least one of chemical composition and/or crystal structure.

In Example 7, the memory cell according to example 6, may optionally further include that the first metal oxide is a ferroelectric metal oxide, and that the second metal oxide is a dielectric metal oxide. As an example, the ferroelectric metal oxide is ferroelectric hafnium oxide or ferroelectric zirconium oxide, and the dielectric metal oxide is dielectric hafnium oxide or dielectric zirconium oxide.

In Example 8, the memory cell according to any one of examples 1 to 7, may optionally further include that the first region includes at least a single grain of a spontaneously-polarizable material that is in contact with both the first electrode layer and the second electrode layer, and that the second region is free of a single grain of a spontaneously-polarizable material that is in contact with both the first electrode layer and the second electrode layer.

In Example 9, the memory cell according to any one of examples 1 to 8, may optionally further include that the first region includes a volume fraction of spontaneously-polarizable material greater than 90%, and that the second region includes a volume fraction of spontaneously-polarizable material less than 10%.

In Example 10, the memory cell according to any one of examples 1 to 9, may optionally further include that the first region has a first remanent polarization, that the second region has a second remanent polarization, and that the second remanent polarization is less than the first remanent polarization. As an alternative configuration, the second region may be non-remanently polarizable.

In Example 11, the memory cell according to example 10 may optionally further include that the second remanent polarization is substantially zero.

In Example 12, the memory cell according to any one of examples 1 to 11, may optionally further include that the memory element further includes a separation structure disposed between the first region and the second region.

In Example 13, the memory cell according to example 12, may optionally further include that the separation structure is in direct physical contact with the first region and with the second region.

In Example 14, the memory cell according to any one of examples 1 to 13, may optionally further include that the first region is a continuous region extending from the first electrode layer to the second electrode layer, and that the second region is a continuous region extending from the first electrode layer to the second electrode layer. The first region and the second region may extend from a top surface of the first electrode layer to a bottom surface of the second electrode layer.

In Example 15, the memory cell according to any one of examples 1 to 14, may optionally further include that the memory element is further structured to have a third region extending from the first electrode layer to the second electrode layer, and that the third region is not spontaneously-polarizable or is less spontaneously-polarizable than the first region. For example, the third region may consist of a same material as the second region (or of a material different from the first material).

In Example 16, the memory cell according to example 15 may optionally further include that the first region is disposed between the second region and the third region.

In Example 17, the memory cell according to example 15 or 16 may optionally further include that the memory element further includes a further separation structure disposed between the first region and the third region.

In Example 18, the memory cell according to example 17 may optionally further include that the further separation structure is in direct physical contact with the first region and with the third region.

In Example 19, the memory cell according to any one of examples 15 to 18 may optionally further include that the third region is a continuous region extending from the first electrode layer to the second electrode layer.

In Example 20, the memory cell according to any one of examples 1 to 19 may optionally further include that an actual depolarization field value associated with the capacitive memory structure is defined by polarization characteristics of the first region and the second region, and that the actual depolarization field value is less than a depolarization field value associated with the first region defined by a material specific polarization characteristic of the first material.

In Example 21, the memory cell according to any one of examples 1 to 20 may optionally further include that the capacitive memory structure is coupled to the field-effect transistor structure or integrated into the field-effect transistor structure.

In Example 22, the memory cell according to any one of examples 1 to 21 may optionally further include that the field-effect transistor structure has a first capacitance associated therewith, that the capacitive memory structure has a second capacitance associated therewith, and that the second capacitance of the capacitive memory structure includes a first partial capacitance associated with the first region and a second partial capacitance associated with the second region.

In Example 23, the memory cell according to example 22 may optionally further include that the second capacitance of the capacitive memory structure includes a parallel connection of the first partial capacitance and the second partial capacitance.

In Example 24, the memory cell according to example 22 or 23 may optionally further include that the first partial capacitance and the second partial capacitance share as common nodes the first electrode and the second electrode of the capacitive memory structure.

In Example 25, the memory cell according to any one of examples 22 to 24 may optionally further include that the first partial capacitance associated with the first region has a capacitance value less than 20 $\mu C/cm^2$.

In Example 26, the memory cell according to any one of examples 1 to 25 may optionally further include that the first region has a width less than a width of the first electrode layer and less than a width of the second electrode layer.

In Example 27, the memory cell according to any one of examples 1 to 26 may optionally further include that the first region has a first height, that the second region has a second height, and that the second height is greater than the first height.

In Example 28, the memory cell according to any one of examples 1 to 26 may optionally further include that the first region has a first height, that the second region has a second height, and that the first height is greater than the second height.

In Example 29, the memory cell according to any one of examples 1 to 28 may optionally further include that the first region is spontaneously-polarizable, and that the second region is not spontaneously-polarizable or is less spontaneously-polarizable than the first region.

Example 30 is a memory cell including: a field-effect transistor structure; and a capacitive memory structure; wherein the field-effect transistor structure and the capacitive memory structure are configured to form a capacitive voltage divider; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region is spontaneously-polarizable, and wherein the second region is non-spontaneously-polarizable or is less spontaneously-polarizable than the first region.

In Example 31, the memory cell according to example 30 may include any one of the features of examples 1 to 29.

Example 32 is a memory cell including: a field-effect transistor structure; and a capacitive memory structure; wherein the field-effect transistor structure and the capacitive memory structure are configured to form a capacitive voltage divider; wherein the capacitive memory structure is configured as a parallel connection of one or more spontaneously-polarizable capacitors and one or more dielectric capacitors.

In Example 33, the memory cell according to example 32 may optionally further include that the capacitive memory structure includes: a first continuous electrode layer, and a second continuous electrode layer, and wherein the one or more spontaneously-polarizable capacitors and the one or more more spontaneously-polarizable capacitors and the one or more dielectric capacitors share as common nodes the first continuous electrode layer and the second continuous electrode layer.

In Example 34, the memory cell according to example 32 or 33 may include any one of the features of examples 1 to 29.

Example 35 is a memory device including a plurality of memory cells according to any one of examples 1 to 34.

Example 36 is a method of forming a memory cell, the method including: forming a field-effect transistor structure and a capacitive memory structure in a capacitive voltage divider configuration; wherein forming the capacitive memory structure includes: forming a first electrode layer; forming a first region of a memory element and, subsequently, forming a second region of the memory element; and forming a second electrode layer, wherein the first region of the memory element is in direct physical contact with the first electrode layer and the second electrode layer and wherein the second region of the memory element is in direct physical contact with the first electrode layer and the second electrode layer.

As an example, forming the first region of the memory element includes depositing a first material by a first deposition process, and forming the second region of the memory element includes depositing a second material by a second deposition process different from the first deposition process.

As another example, forming the first region of the memory element and forming the second region of the memory element includes depositing a material having spontaneously-polarizable properties or capable of having spontaneously-polarizable properties upon modification, and partially modifying the material to thereby form the first region and the second region of the memory element. Illustratively, forming the first region of the memory element and, subsequently, forming the second region of the memory element may include depositing a base material by a deposition process and partially modifying the base material to thereby form the first region and, subsequently, the second region of the memory element.

As an example, the base material may be a binary or ternary compound including hafnium and/or zirconium (e.g., may be hafnium oxide, zirconium oxide, a mixture of hafnium oxide and zirconium oxide, etc.). The method may include a targeted modification of the base material to obtain or maintain spontaneous-polarizable properties in one or more portions, and to obtain or maintain non-spontaneous-polarizable properties in one or more other portions.

In Example 37, the method according to example 36 may optionally further include that the first region consists of a first material, and that the second region consists of a second material different from the first material. In various aspects, the first material may differ from the second material in at least one of a chemical composition, a crystal structure, and/or a porosity.

In Example 38, the method according to example 36 or 37 may optionally further include that forming the forming the first region and, subsequently, the second region of the memory element includes: forming a layer of dielectric material on the first electrode layer; removing at least part of the layer of dielectric material to provide a cavity in the layer of dielectric material exposing the first electrode layer; and forming a layer of spontaneously-polarizable material in the cavity.

In Example 39, the method according to any one of examples 36 to 38, may optionally further include that forming the structured memory element further includes:

forming a separation structure between the first region and the second region of the memory element.

In Example 40, the method according to example 38 and 39 may optionally further include that the separation structure is formed prior to forming the layer of spontaneously-polarizable material.

In Example 41, the method according to example 36 or 37 may optionally further include that forming the first region and, subsequently, the second region of the memory element includes: forming a layer of a base material on the first electrode layer in such a way that the layer has at least a first portion having a first height and a second portion having a second height different from the first height. As an example, the second height may be greater than the first height in such a way that upon crystallization of the material the first portion provides a spontaneously-polarizable crystal structure and the second portion provides an amorphous structure.

Illustratively, the method may include inducing a crystallization of the layer of the base material to obtain or maintain spontaneously-polarizable properties in the base material of the first portion and to obtain or maintain non-spontaneously-polarizable properties in the base material of the second portion.

In Example 42, the method according to example 36 or 37 may optionally further include that forming the first region and, subsequently, the second region of the memory element includes: forming a layer of a base material on the first electrode layer, and introducing one or more dopant elements in at least a portion of the layer to modify (e.g., destroy) the crystal structure of the portion.

In Example 43, the method according to example 36 or 37 may optionally further include that forming the first region and, subsequently, the second region of the memory element includes: forming a layer of spontaneously-polarizable material over the first electrode layer in such a way that the layer of spontaneously-polarizable material has at least a first portion having a first height and a second portion having a second height, and annealing the layer of spontaneously-polarizable material, and that the second height is less than the first height in such a way that upon annealing the first portion provides the first region of the memory element having a spontaneously-polarizable crystal structure and the second portion provides the second region of the memory element having an amorphous structure.

In Example 44, the method according to any one of examples 38 to 43 may optionally further include that forming a layer of spontaneously-polarizable material includes at least one of: depositing a layer of spontaneously-polarizable material, or depositing a layer of amorphous material and inducing a phase transition of the layer of amorphous material to provide spontaneous-polarization capabilities.

Example 45 is a method of forming a memory cell, the method including: forming a field-effect transistor structure and a capacitive memory structure in a capacitive voltage divider configuration; wherein forming the capacitive memory structure includes: forming a first electrode layer, forming a second electrode layer, and forming a structured memory element, the structured memory element including at least a first region extending from the first electrode layer to the second electrode layer and a second region extending from the first electrode layer to the second electrode layer, wherein the first region is spontaneously-polarizable, and wherein the second region is not spontaneously-polarizable or is less spontaneously-polarizable than the first region.

In Example 46, the method according to example 45 may include any one of the features of examples 36 to 44.

Example 47 is a method of forming a capacitive memory structure, the method including: forming a first electrode layer, forming a second electrode layer, and forming a structured memory element, the structured memory element including at least a first region extending from the first electrode layer to the second electrode layer and a second region extending from the first electrode layer to the second electrode layer, wherein the first region is spontaneously-polarizable, and wherein the second region is not spontaneously-polarizable or is less spontaneously-polarizable than the first region.

In Example 48, the method according to example 47 may include any one of the features of examples 36 to 44.

Example 49 is a capacitive memory structure including: a first electrode layer, a second electrode layer, and a memory element structured to have at least a first region extending from the first electrode layer to the second electrode layer and a second region extending from the first electrode layer to the second electrode layer, wherein the first region has one or more first material properties, wherein the second region has one or more second material properties, and wherein the one or more first material properties differ from the first material properties.

Example 50 is a memory cell including: a field-effect transistor structure; and a capacitive memory structure coupled with or integrated in the field-effect transistor structure; wherein the capacitive memory structure includes: a first electrode layer, a second electrode layer, and a memory element structured to have at least a first region extending from the first electrode layer to the second electrode layer and a second region extending from the first electrode layer to the second electrode layer, wherein the first region has one or more first material properties, wherein the second region has one or more second material properties, and wherein the one or more first material properties differ from the first material properties.

Example 51 is a method of forming a memory cell, the method including: forming a field-effect transistor structure, and forming a capacitive memory structure coupled with or integrated in the field-effect transistor structure; wherein forming the capacitive memory structure includes: forming a first electrode layer, forming a second electrode layer, and forming a structured memory element, the structured memory element including at least a first region extending from the first electrode layer to the second electrode layer and a second region extending from the first electrode layer to the second electrode layer, wherein the first region has one or more first material properties, wherein the second region has one or more second material properties, and wherein the one or more first material properties differ from the second material properties.

Several aspects are described with reference to a structure (e.g., a memory transistor structure, e.g., a field-effect transistor structure, e.g., a ferroelectric field-effect transistor structure, e.g., a capacitive memory structure) and it is noted that such a structure may include solely the respective element (e.g., a memory transistor, e.g., a field-effect transistor, e.g., a ferroelectric field-effect transistor, e.g., a capacitive memory); or, in other aspects, a structure may include the respective element and one or more additional elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "coupled to" used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g., a layer, a substrate, a wafer, etc.) or "laterally" next to, may be used herein to mean an extent or a positional relationship along a surface of the carrier. That means, in some aspects, that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. As an example, considering a capacitor structure, a width may be a dimension parallel to the plates of the capacitor structure, and a thickness may be a dimension perpendicular to the plates of the capacitor structure. Further, the term "height" used with regards to a height of a structure, a portion, a structure element, a layer, etc., may be used herein to mean a dimension (in other words an extent) of a structure in a direction perpendicular to the surface of a carrier (e.g., perpendicular to the main processing surface of a carrier).

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

In some aspects, the term region may be used with regards to a "source region", "drain region", "channel region", and the like, to mean a continuous region of a semiconductor portion (e.g., of a semiconductor wafer or a part of a semiconductor wafer, a semiconductor layer, a fin, a semiconductor nanosheet, a semiconductor nanowire, etc.,). In some aspects, the continuous region of a semiconductor portion may be provided by semiconductor material having only one dominant doping type.

The term "switch" may be used herein to describe a modification of the memory state a memory cell is residing in. For example, in the case that a memory cell is residing in a first memory state (e.g., a LVT state), the memory state the memory cell is residing in may be switched such that, after the switch, the memory cell may reside in a second memory state (e.g., a HVT state), different from the first memory state. The term "switch" may thus be used herein to describe a modification of the memory state a memory cell is residing in, from a first memory state to a second memory state. The term "switch" may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

According to various aspects, the properties and/or the structure of a region of a memory element may be evaluated with techniques known in the art. As an example, transmission electron microscopy (TEM) may be used to determine the structure of a material or a layer. TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material, e.g., the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g., for analyzing the spatial distribution (e.g., the gradient) of an element across the solid. As a further example, neutron diffraction (also referred to as elastic neutron scattering) may be used to determine the atomic structure of a material.

To evaluate the material properties of a region of a memory element, the capacitive memory structure may be cut to expose a side of the memory element, so that the regions of the memory element may be investigated, e.g., with the techniques mentioned above. A memory element structured as described herein may thus have varying material properties along a horizontal direction, e.g., based on the arrangement of the first and second regions. A horizontal direction may be understood as a direction parallel to the substrate on which the capacitive memory structure is formed. Furthermore, a horizontal direction may be understood as a direction perpendicular to a length (illustratively, a depth) of a region. Illustratively, a memory element may have regions disposed side-by-side, with different material properties with respect to one another, which may be evaluated by suitably exposing the regions for performing an analysis.

It may be understood that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a field-effect transistor structure; and
a capacitive memory structure;
wherein the field-effect transistor structure and the capacitive memory structure are configured to form a capacitive voltage divider;
wherein the capacitive memory structure comprises:
a first electrode,
a second electrode, and
a memory element structured to have at least a first region extending from the first electrode to the second electrode and a second region extending from the first electrode to the second electrode,
wherein the first region consists of a first material comprising a spontaneously-polarizable material,
wherein the second region consists of a second material substantially free of a spontaneously-polarizable material.

2. The memory cell according to claim 1,
wherein the first material comprises a base material having a first concentration of dopant elements,
wherein the second material comprises the base material having a second concentration of dopant elements different from the first concentration of dopant elements or wherein the second material comprises the base material having substantially no dopant elements.

3. The memory cell according to claim 1,
wherein the first region comprises at least a single grain of a spontaneously-polarizable material that is in contact with both the first electrode and the second electrode, and
wherein the second region is free of a single grain of a spontaneously-polarizable material that is in contact with both the first electrode and the second electrode.

4. The memory cell according to claim 1,
wherein the first region comprises a first metal oxide,
wherein the second region comprises a second metal oxide, and
wherein the first metal oxide differs from the second metal oxide in at least one of chemical composition and/or crystal structure.

5. The memory cell according to claim 1,
wherein an actual depolarization field value associated with the capacitive memory structure is defined by polarization characteristics of the first region and the second region, and wherein the actual depolarization field value is less than a depolarization field value associated with the first region defined by a material-specific polarization characteristic of the first material.

6. The memory cell according to claim 1, wherein the first region has a width less than a width of the first electrode and less than a width of the second electrode.

7. The memory cell according to claim 1, wherein the memory element further comprises a separation structure disposed between the first region and the second region.

8. The memory cell according to claim 1, wherein the first region directly contacts each of the first electrode and the second electrode, and wherein the second region directly contacts each of the first electrode and the second electrode.

9. The memory cell according to claim 1, wherein the capacitive memory structure is stacked directly over a gate of the field-effect transistor structure.

10. A memory cell comprising:
a field-effect transistor structure; and a capacitive memory structure integrated into the field-effect transistor structure;
wherein the field-effect transistor structure and the capacitive memory structure are configured to form a capacitive voltage divider;
wherein the capacitive memory structure comprises:
a top layer comprising one or more electrode layers,
a bottom isolation layer, and
a memory element structured to have at least a first region extending from the top layer to the bottom isolation layer and a second region extending from the top layer to the bottom isolation layer,
wherein the first region consists of a first material,
wherein the second region consists of a second material, and
wherein the first material is different from the second material.

11. The memory cell according to claim 10, wherein the first material comprises a spontaneously-polarizable material, and wherein the second material is substantially free of a spontaneously-polarizable material.

* * * * *